(12) United States Patent
Dimberg et al.

(10) Patent No.: US 12,283,445 B2
(45) Date of Patent: *Apr. 22, 2025

(54) GESTURE-BASED CONTROL DEVICE FOR CONTROLLING AN ELECTRICAL LOAD

(71) Applicant: Lutron Technology Company LLC, Coopersburg, PA (US)

(72) Inventors: Chris Dimberg, Easton, PA (US); Matthew V. Harte, Stewartsville, NJ (US); Matthew Philip McDonald, Phoenixville, PA (US); Daniel L. Twaddell, Bethlehem, PA (US); Jason C. Killo, Emmaus, PA (US); Brad Michael Kreschollek, Bethlehem, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/373,079

(22) Filed: Sep. 26, 2023

(65) Prior Publication Data

US 2024/0021381 A1  Jan. 18, 2024

Related U.S. Application Data

(63) Continuation of application No. 17/993,040, filed on Nov. 23, 2022, now Pat. No. 11,804,339, which is a
(Continued)

(51) Int. Cl.
*H01H 9/02* (2006.01)
*G01D 5/02* (2006.01)
(Continued)

(52) U.S. Cl.
CPC .............. *H01H 9/0207* (2013.01); *G01D 5/02* (2013.01); *G01D 5/145* (2013.01); *G01D 5/20* (2013.01);
(Continued)

(58) Field of Classification Search
CPC ...... H01H 9/0207; H01H 9/02; H01H 9/0235; H01H 11/00; H01H 23/16; H01H 35/02;
(Continued)

(56) References Cited

U.S. PATENT DOCUMENTS 4,563,592 A  1/1986  Yuhasz et al.
4,893,062 A  1/1990  D'Aleo et al.
(Continued)

FOREIGN PATENT DOCUMENTS

AU  2014306056 A1 *  1/2016  ........... G06F 1/3265
CN  2596671 Y  12/2003
(Continued)

*Primary Examiner* — Abdullah A Riyami
*Assistant Examiner* — Syed M Kaiser
(74) *Attorney, Agent, or Firm* — Flaster Greenberg PC

(57) ABSTRACT

A control device may be configured to control one or more electrical loads in a load control system. The control device may be a wall-mounted device such as dimmer switch, a remote control device, or a retrofit remote control device. The control device may include a gesture-based user interface for applying advanced control over the one or more electrical loads. The types of control may include absolute and relative control, intensity and color control, preset, zone, or operational mode selection, etc. Feedback may be provided on the control device regarding a status of the one or more electrical loads or the control device.

20 Claims, 29 Drawing Sheets

Related U.S. Application Data continuation of application No. 17/554,632, filed on Dec. 17, 2021, now Pat. No. 11,538,643, which is a continuation of application No. 16/860,395, filed on Apr. 28, 2020, now Pat. No. 11,232,916, which is a continuation of application No. 16/571,295, filed on Sep. 16, 2019, now Pat. No. 10,672,261, which is a continuation of application No. 16/125,450, filed on Sep. 7, 2018, now Pat. No. 10,475,333, which is a continuation of application No. 15/593,272, filed on May 11, 2017, now Pat. No. 10,102,742, which is a continuation of application No. 15/469,459, filed on Mar. 24, 2017, now Pat. No. 10,109,181.

(60) Provisional application No. 62/411,223, filed on Oct. 21, 2016, provisional application No. 62/356,179, filed on Jun. 29, 2016, provisional application No. 62/356,288, filed on Jun. 29, 2016, provisional application No. 62/356,007, filed on Jun. 29, 2016, provisional application No. 62/345,449, filed on Jun. 3, 2016, provisional application No. 62/345,222, filed on Jun. 3, 2016, provisional application No. 62/345,464, filed on Jun. 3, 2016, provisional application No. 62/312,863, filed on Mar. 24, 2016.

(51) Int. Cl.

| | |
|---|---|
| *G01D 5/14* | (2006.01) |
| *G01D 5/20* | (2006.01) |
| *G01D 5/34* | (2006.01) |
| *G01R 21/00* | (2006.01) |
| *G05G 1/08* | (2006.01) |
| *G06F 3/04847* | (2022.01) |
| *G06F 3/0488* | (2022.01) |
| *G06F 3/04883* | (2022.01) |
| *G08C 17/02* | (2006.01) |
| *H01H 11/00* | (2006.01) |
| *H01H 23/16* | (2006.01) |
| *H01H 35/02* | (2006.01) |
| *H02G 3/14* | (2006.01) |
| *H03K 17/96* | (2006.01) |
| *H05B 45/00* | (2022.01) |
| *H05B 45/20* | (2020.01) |
| *H05B 47/10* | (2020.01) |
| *H05B 47/105* | (2020.01) |
| *H05B 47/11* | (2020.01) |
| *H05B 47/115* | (2020.01) |
| *H05B 47/165* | (2020.01) |
| *H05B 47/175* | (2020.01) |
| *H05B 47/19* | (2020.01) |
| *G06F 3/01* | (2006.01) |
| *G06F 3/0354* | (2013.01) |
| *H01H 9/16* | (2006.01) |
| *H01H 9/28* | (2006.01) |
| *H01H 19/14* | (2006.01) |
| *H01H 23/12* | (2006.01) |
| *H05B 45/31* | (2020.01) |
| *H05B 47/195* | (2020.01) |

(52) U.S. Cl.
CPC .............. *G01D 5/34* (2013.01); *G01R 21/00* (2013.01); *G05G 1/08* (2013.01); *G06F 3/04847* (2013.01); *G06F 3/0488* (2013.01); *G06F 3/04883* (2013.01); *G08C 17/02* (2013.01); *H01H 9/02* (2013.01); *H01H 9/0235* (2013.01); *H01H 11/00* (2013.01); *H01H 23/16* (2013.01); *H01H 35/02* (2013.01); *H02G 3/14* (2013.01); *H03K 17/96* (2013.01); *H03K 17/962* (2013.01); *H05B 45/00* (2020.01); *H05B 45/20* (2020.01); *H05B 47/10* (2020.01); *H05B 47/105* (2020.01); *H05B 47/11* (2020.01); *H05B 47/115* (2020.01); *H05B 47/165* (2020.01); *H05B 47/175* (2020.01); *H05B 47/19* (2020.01); *G06F 3/017* (2013.01); *G06F 3/03547* (2013.01); *G06F 2203/04808* (2013.01); *G08C 2201/32* (2013.01); *H01H 9/025* (2013.01); *H01H 9/16* (2013.01); *H01H 9/287* (2013.01); *H01H 19/14* (2013.01); *H01H 23/12* (2013.01); *H01H 2223/034* (2013.01); *H01H 2231/032* (2013.01); *H01H 2300/03* (2013.01); *H05B 45/31* (2020.01); *H05B 47/195* (2020.01); *Y02B 90/20* (2013.01); *Y04S 20/14* (2013.01)

(58) Field of Classification Search
CPC .......... H01H 9/025; H01H 9/16; H01H 9/287; H01H 19/14; H01H 23/12; H01H 2223/034; H01H 2231/032; H01H 2300/03; G01D 5/02; G01D 5/145; G01D 5/20; G01D 5/34; G01R 21/00; G05G 1/08; G06F 3/04847; G06F 3/0488; G06F 3/04883; G06F 3/017; G06F 3/03547; G06F 2203/04808; G08C 17/02; G08C 2201/32; H02G 3/14; H03K 17/96; H03K 17/962; H05B 45/00; H05B 45/20; H05B 47/10; H05B 47/105; H05B 47/11; H05B 47/115; H05B 47/165; H05B 47/175; H05B 47/19; H05B 45/31; H05B 47/195; Y02B 90/20; Y02B 20/40; Y02B 20/30; Y04S 20/14

See application file for complete search history.

(56) References Cited

U.S. PATENT DOCUMENTS

| | | |
|---|---|---|
| 5,196,782 A | 3/1993 | D et al. |
| 5,264,761 A | 11/1993 | Johnson et al. |
| 6,169,377 B1 | 1/2001 | Bryde et al. |
| 6,492,908 B1 | 12/2002 | Cheng et al. |
| 6,608,617 B2 | 8/2003 | Hoffknecht et al. |
| 6,750,564 B2 | 6/2004 | Cencur |
| 6,977,808 B2 | 12/2005 | Lam et al. |
| 7,242,150 B2 | 7/2007 | Dejonge et al. |
| 7,531,921 B2 | 5/2009 | Cencur |
| 7,546,473 B2 | 6/2009 | Newman et al. |
| 7,566,995 B2 | 7/2009 | Altonen et al. |
| 7,566,996 B2 | 7/2009 | Spira et al. |
| 7,573,208 B2 | 8/2009 | Newman et al. |
| 7,608,948 B2 | 10/2009 | Nearhoof et al. |
| 7,791,595 B2 | 9/2010 | Altonen et al. |
| 7,834,856 B2 | 11/2010 | Grinshpoon et al. |
| 7,896,674 B2 | 3/2011 | Altonen et al. |
| 8,029,166 B2 | 10/2011 | Hotelling et al. |
| 8,167,457 B1 | 5/2012 | Forster et al. |
| 8,173,920 B2 | 5/2012 | Altonen et al. |
| 8,228,163 B2 | 7/2012 | Cash et al. |
| 8,330,638 B2 | 12/2012 | Altonen et al. |
| 8,395,330 B2 | 3/2013 | Hotelling et al. |
| 8,664,881 B2 | 3/2014 | Salvestrini et al. |
| 8,692,786 B2 | 4/2014 | Diederiks et al. |
| 8,729,825 B2 | 5/2014 | Hotelling et al. |
| 8,786,196 B2 | 7/2014 | Biery et al. |
| 8,866,343 B2 | 10/2014 | Pessina et al. |
| 9,021,646 B2 | 5/2015 | Lo et al. |
| 9,208,965 B2 | 12/2015 | Busby et al. |
| 9,232,672 B2 | 1/2016 | Merz et al. |
| D761,277 S | 7/2016 | Harvell |

(56) References Cited

U.S. PATENT DOCUMENTS

| | | |
|---|---|---|
| 9,418,802 B2 | 8/2016 | Romano et al. |
| 9,430,044 B2 | 8/2016 | Zizza et al. |
| 9,520,247 B1 | 12/2016 | Finnegan et al. |
| 9,524,633 B2 | 12/2016 | Mcdonald et al. |
| 9,583,288 B2 | 2/2017 | Jones et al. |
| 9,609,719 B2 | 3/2017 | Shivell et al. |
| 9,633,557 B2 | 4/2017 | Twaddell et al. |
| 9,652,979 B2 | 5/2017 | Camden et al. |
| 9,656,742 B2 | 5/2017 | Guillemaut et al. |
| 9,746,138 B1 | 8/2017 | Thomas et al. |
| 9,799,469 B2 | 10/2017 | Bailey et al. |
| 9,838,008 B2 | 12/2017 | Lark et al. |
| 9,839,099 B2 | 12/2017 | Lark et al. |
| 9,959,997 B2 | 5/2018 | Bailey et al. |
| 11,232,916 B2 * | 1/2022 | Dimberg ............... H05B 45/20 |
| 2003/0019733 A1 | 1/2003 | Sato |
| 2003/0019734 A1 | 1/2003 | Sato et al. |
| 2003/0230982 A1 | 12/2003 | Pagano et al. |
| 2007/0291009 A1 | 12/2007 | Wright et al. |
| 2007/0291010 A1 | 12/2007 | Altonen et al. |
| 2008/0111491 A1 | 5/2008 | Spira et al. |
| 2008/0315798 A1 | 12/2008 | Diederiks et al. |
| 2009/0256483 A1 | 10/2009 | Gehman et al. |
| 2010/0013649 A1 | 1/2010 | Spira |
| 2010/0084996 A1 | 4/2010 | Van De Sluis et al. |
| 2010/0127626 A1 | 5/2010 | Altonen et al. |
| 2010/0244706 A1 | 9/2010 | Steiner et al. |
| 2010/0244709 A1 | 9/2010 | Steiner et al. |
| 2011/0074672 A1 * | 3/2011 | Diederiks ............ H05B 47/115 345/156 |
| 2011/0089857 A1 | 4/2011 | Diederiks et al. |
| 2012/0292174 A1 | 11/2012 | Mah et al. |
| 2013/0099011 A1 | 4/2013 | Matsuoka et al. |
| 2013/0099124 A1 | 4/2013 | Filson et al. |
| 2013/0300679 A1 * | 11/2013 | Oh ..................... G06F 1/1626 345/173 |
| 2013/0338839 A1 | 12/2013 | Rogers et al. |
| 2014/0117859 A1 | 5/2014 | Swatsky et al. |
| 2014/0117871 A1 | 5/2014 | Swatsky et al. |
| 2014/0145646 A1 | 5/2014 | Zhang et al. |
| 2014/0152186 A1 | 6/2014 | Zhang |
| 2014/0203710 A1 * | 7/2014 | Li ........................ H05B 47/10 315/129 |
| 2014/0266669 A1 | 9/2014 | Fadell et al. |
| 2014/0267008 A1 | 9/2014 | Jain et al. |
| 2014/0268628 A1 | 9/2014 | Mann et al. |
| 2015/0077021 A1 | 3/2015 | Mccarthy et al. |
| 2015/0084515 A1 | 3/2015 | Werner et al. |
| 2015/0139483 A1 | 5/2015 | Shen |
| 2015/0153768 A1 * | 6/2015 | Shih ..................... G06F 3/0416 345/173 |
| 2015/0186350 A1 * | 7/2015 | Hicks .................. G06F 3/04842 715/230 |
| 2015/0189726 A1 | 7/2015 | Spira |
| 2015/0256355 A1 | 9/2015 | Pera et al. |
| 2015/0294816 A1 | 10/2015 | Evers et al. |
| 2015/0357133 A1 | 12/2015 | Keirstead et al. |
| 2015/0371534 A1 | 12/2015 | Dimberg et al. |
| 2016/0007431 A1 | 1/2016 | Bosua et al. |
| 2016/0029462 A1 | 1/2016 | Koch et al. |
| 2016/0073479 A1 | 3/2016 | Erchak et al. |
| 2016/0150624 A1 | 5/2016 | Meerbeek et al. |
| 2016/0224036 A1 | 8/2016 | Baker et al. |
| 2016/0242251 A1 | 8/2016 | Lashina et al. |
| 2016/0262223 A1 | 9/2016 | Schevardo et al. |
| 2016/0270194 A1 | 9/2016 | Newton et al. |
| 2017/0062968 A1 | 3/2017 | Richardson et al. |
| 2017/0102493 A1 | 4/2017 | Simchayoff et al. |
| 2017/0105176 A1 | 4/2017 | Finnegan et al. |
| 2017/0120808 A1 | 5/2017 | Suzuki et al. |
| 2017/0226799 A1 | 8/2017 | Hebeisen et al. |
| 2017/0292712 A1 * | 10/2017 | Alexander ............ G06F 3/016 |
| 2018/0190451 A1 | 7/2018 | Scruggs |

FOREIGN PATENT DOCUMENTS

| | | |
|---|---|---|
| CN | 101347050 A | 1/2009 |
| CN | 101558689 A | 10/2009 |
| CN | 102293060 A | 12/2011 |
| CN | 103327679 A | 9/2013 |
| CN | 203491998 U | 3/2014 |
| CN | 103747574 A | 4/2014 |
| CN | 104053286 A | 9/2014 |
| CN | 104206024 A | 12/2014 |
| DE | 102015005863 A1 | 11/2016 |
| EP | 2642830 A2 | 9/2013 |
| EP | 2934068 A1 | 10/2015 |
| EP | 2982541 A2 | 2/2016 |
| TW | 201343001 A | 10/2013 |
| WO | 2008120127 A1 | 10/2008 |
| WO | 2009093179 A1 | 7/2009 |
| WO | 2012099718 A1 | 7/2012 |
| WO | 2013101779 A1 | 7/2013 |
| WO | 2014066269 A1 | 5/2014 |
| WO | 2014066272 A1 | 5/2014 |
| WO | 2014134637 A2 | 9/2014 |
| WO | WO-2015021406 A1 * | 2/2015 ............... G06F 1/32 |
| WO | 2015052612 A1 | 4/2015 |
| WO | 2015145778 A1 | 10/2015 |

* cited by examiner

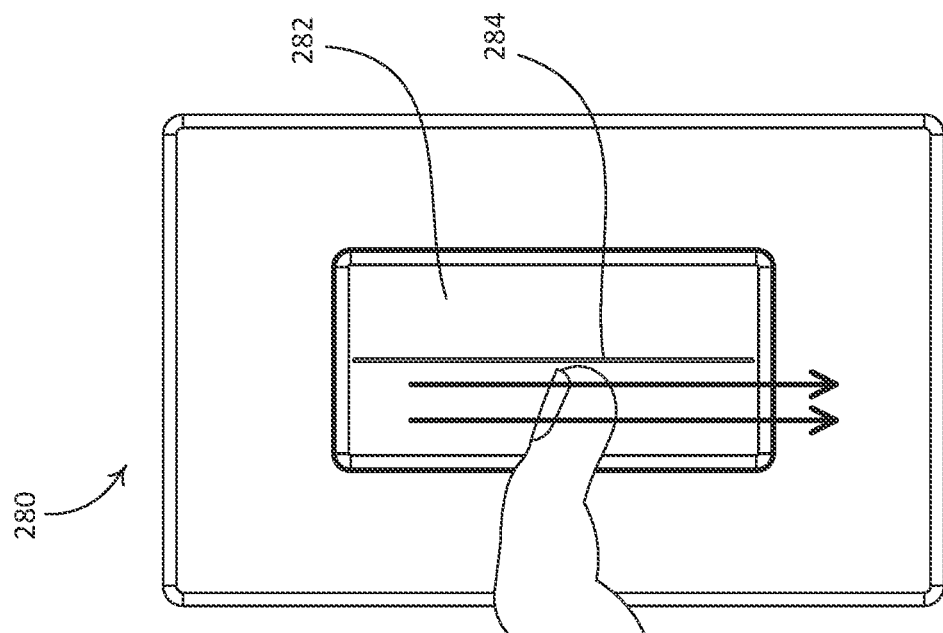
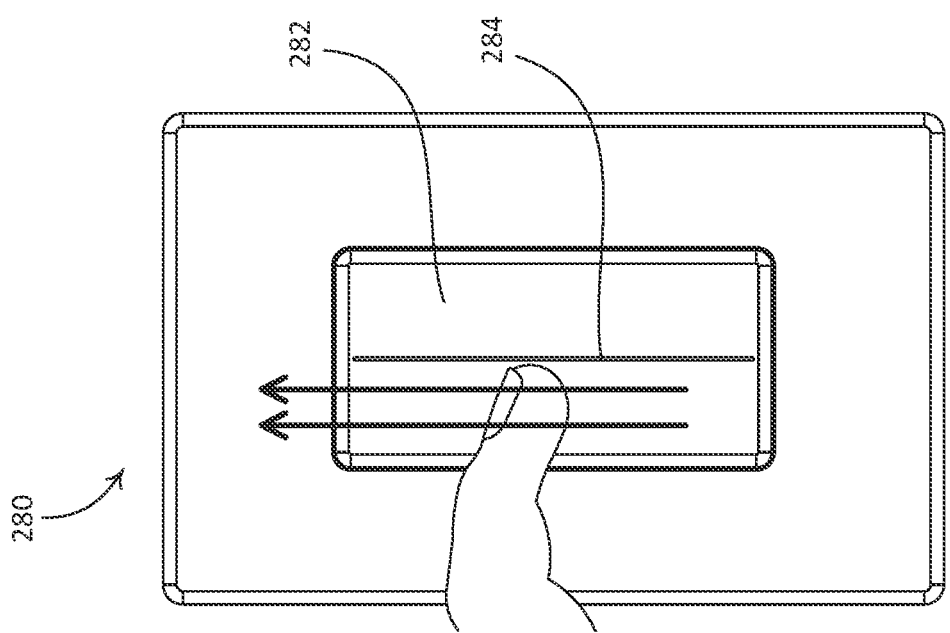

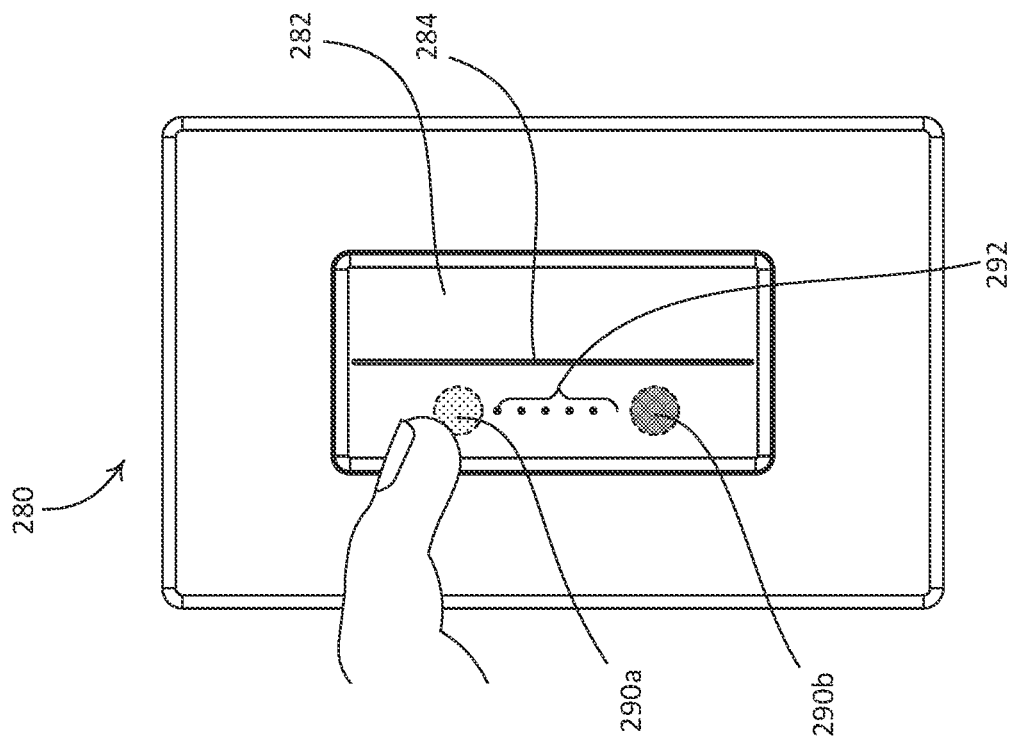
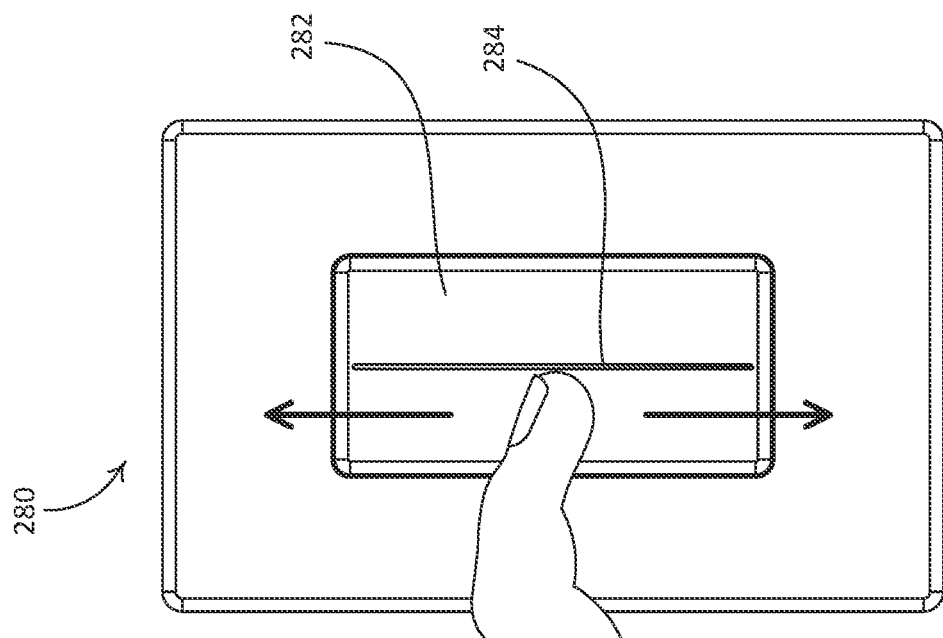

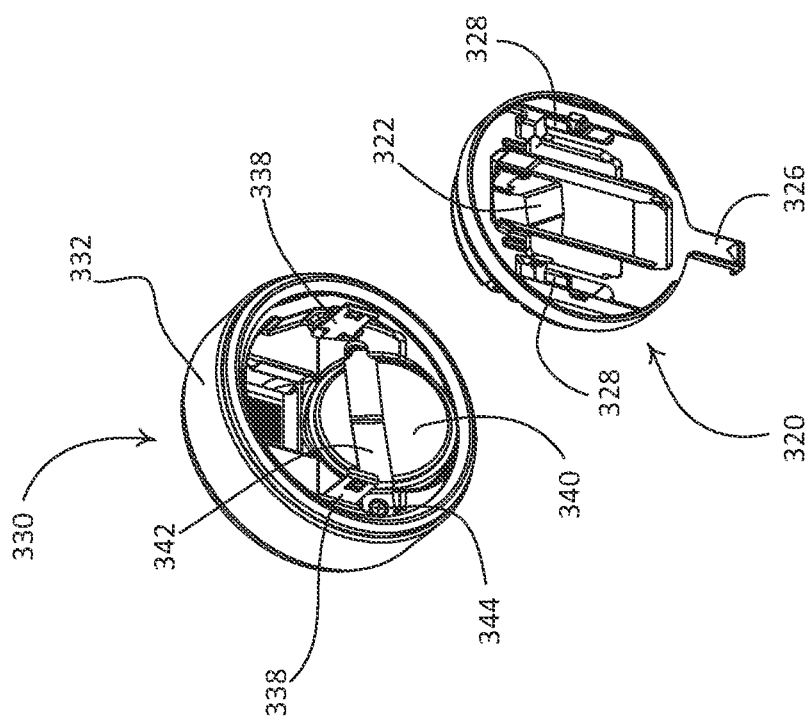
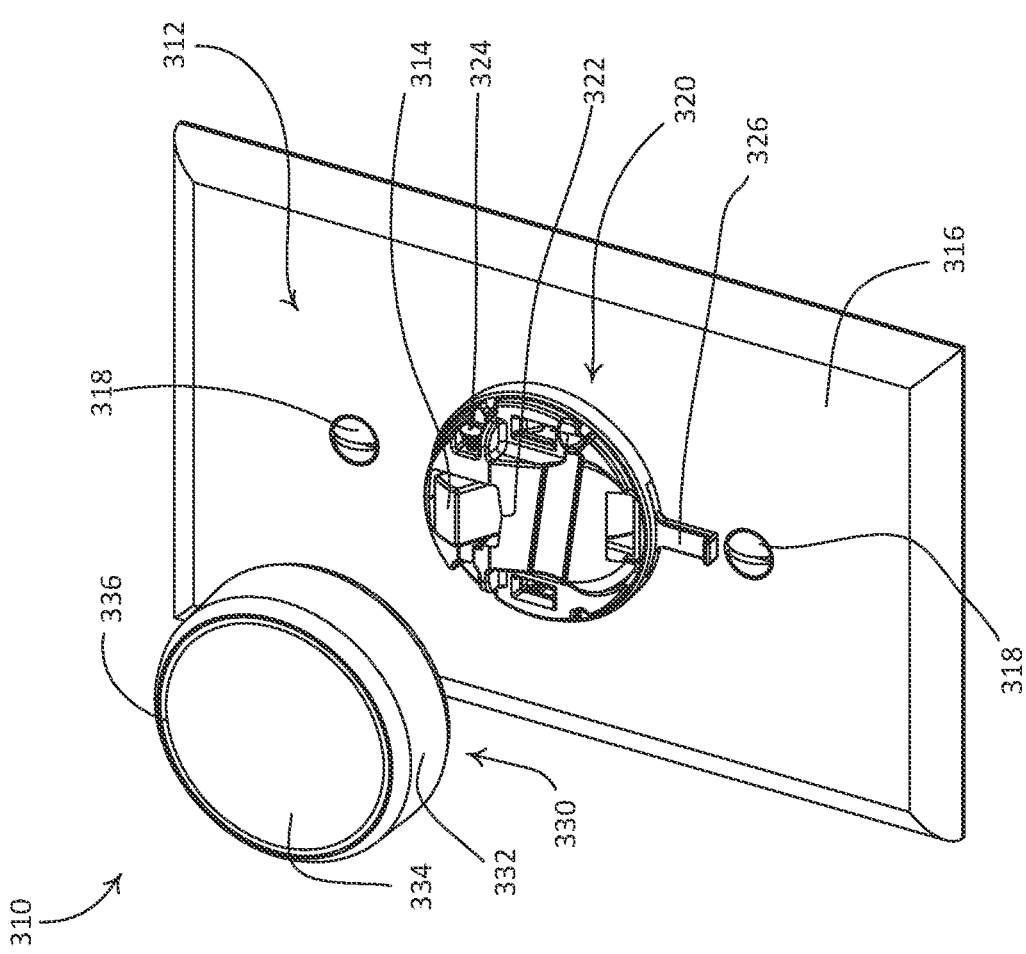
FIG. 6B
FIG. 6A

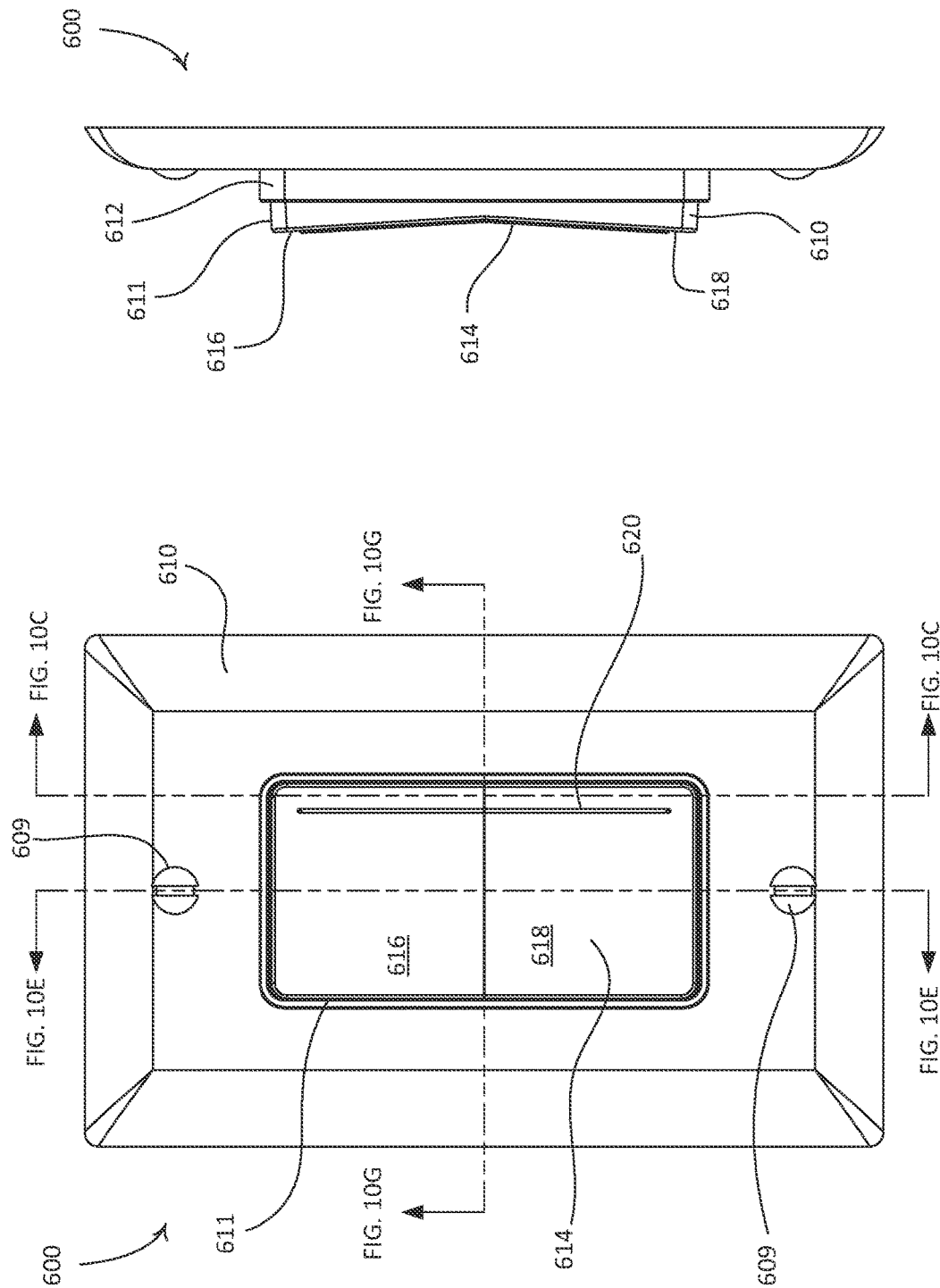

GESTURE-BASED CONTROL DEVICE FOR CONTROLLING AN ELECTRICAL LOAD

CROSS-REFERENCE TO RELATED APPLICATIONS

This application is a continuation of U.S. patent application Ser. No. 17/993,040, filed Nov. 23, 2022, which is a continuation of U.S. patent application Ser. No. 17/554,632, filed Dec. 17, 2021, which is a continuation of U.S. patent application Ser. No. 16/860,395, filed Apr. 28, 2020, which is a continuation of U.S. patent application Ser. No. 16/571,295, filed Sep. 16, 2019, now U.S. Pat. No. 10,672,261, issued Jun. 2, 2020, which is a continuation of U.S. patent application Ser. No. 16/125,450, filed Sep. 7, 2018, now U.S. Pat. No. 10,475,333, issued Nov. 12, 2019, which is a continuation of U.S. patent application Ser. No. 15/593,272, filed May 11, 2017, now U.S. Pat. No. 10,102,742, issued Oct. 16, 2018, which is a continuation of U.S. patent application Ser. No. 15/469,459, filed Mar. 24, 2017, now U.S. Pat. No. 10,109,181, issued Oct. 23, 2018, which claims the benefit of Provisional U.S. Patent Application No. 62/312,863, filed Mar. 24, 2016, Provisional U.S. Patent Application No. 62/345,449, filed Jun. 3, 2016, Provisional U.S. Patent Application No. 62/345,222, filed Jun. 3, 2016, Provisional U.S. Patent Application No. 62/345,464, filed Jun. 3, 2016, Provisional U.S. Patent Application No. 62/356,007, filed Jun. 29, 2016, Provisional U.S. Patent Application No. 62/356,179, filed Jun. 29, 2016, Provisional U.S. Patent Application No. 62/356,288, filed Jun. 29, 2016, and Provisional U.S. Patent Application No. 62/411,223, filed Oct. 21, 2016, the disclosures of which are incorporated herein by reference in their entireties.

BACKGROUND

A load control system may include one or more electrical loads that a user may wish to control via a single load control device. These electrical loads may include, for example, lighting loads, HVAC units, motorized window treatment or projection screens, humidity control units, audio systems or amplifiers, Internet of Things (IoT) devices, and/or the like. The electrical loads may have advanced features. For example, a lighting load may be controlled to emit light of varying intensities and/or colors in response to a user command. The amount of power delivered to the electrical loads may be adjusted to an absolute level or by a relative amount. Multiple electrical loads may be manipulated such that one or more presets or scenes (e.g., combinations of particular lighting conditions, temperature settings, speaker volume, and/or the like) may be created, and a user may desire the ability to browse through the presets or scenes, and activate one that fits a particular occasion. With a traditional load control device such as a mechanical toggle switch, a user will not able to perform any of the aforementioned functions, let alone performing multiple of them through one device.

The insufficiencies of traditional load control devices arise at least in part from the actuation mechanism utilized in those devices. More specifically, traditional load control devices are typically only capable of responding to simple user actions such as moving a lever or pushing a button. As such, the number and/or types of control that may be applied through a load control device is limited. To meet the demand of advanced electrical loads, there is a need to employ alternative user interface technologies such as those capable of detecting human gestures and translating the gestures into control data (e.g., control signals) for controlling the electrical loads. These technologies may expand the capacity of a load control device, while at the same time enhancing its usability and aesthetic appeal, for example.

A traditional load control device may also lack the capacity to provide visual feedback to a user about the operation of the load control device and/or the electrical loads controlled by the load control devices. Such capacity is an important aspect of user experience in an advanced load control system where a user may be able to manipulate multiple operating parameters of an electrical load or to control multiple electrical loads via a single control device. Provision of feedback in those environments can keep the user informed about the state and/or mode of the control device and electrical loads, and may help the user navigate through the various functionalities of the control device.

SUMMARY

As described herein, a control device may be configured for use in a load control system to control one or more electrical loads. The control device may be external to the plurality of lighting loads, and may include an actuation portion, one or more light sources, and a control circuit. The actuation portion may define a front surface that comprises a plurality of touch sensitive areas. The one or more light sources may be controlled to illuminate the plurality of touch sensitive areas in a first situation and to not illuminate the plurality of touch sensitive areas in a second situation. The control circuit may be configured to perform one or more of the following. The control circuit may control the one or more light sources to present a first user interface on the front surface of the actuation portion. The control circuit may control the one or more light sources to not illuminate the plurality of touch sensitive areas in the first user interface. Subsequently, the control circuit may determine that a user input has been received for activating a second user interface on the front surface of the actuation portion, and control the one or more light sources to present the second user interface on the front surface of the actuation portion. In the second user interface, the control circuit may control the one or more light sources to illuminate the plurality of touch sensitive areas. A user may actuate one of the plurality of touch sensitive areas via the second user interface. In response, the control circuit may generate control data for controlling an amount of power delivered to the one or more electrical loads. For example, each of the touch sensitive areas may represent a preset associated with the one or more electrical loads. The preset may include at least one predetermined setting of the one or more electrical loads, and the control circuit may activate the preset in response to an actuation of the touch sensitive area associated with the preset.

Also described herein is a control device configured for use in a load control system to control a lighting load. The control device may be located external to the lighting load, and may include a user input device, a light bar, and a control circuit. The user input device may include a touch sensitive surface. The light bar may be configured to be illuminated by one or more light sources (e.g., such as LEDs) under the control of the control circuit. When illuminated, the light bar may present a color gradient on which one or more available color settings for the lighting load may be indicated. For example, the light bar may be substantially circular in shape, and the control circuit may control the one or more light sources to illuminate the light bar to multiple colors each representing an available color setting for the lighting load. A user may actuate an area of the touch sensitive surface adjacent to the light bar, and the control circuit may generate control data to adjust a color of the lighting load based on the location of the actuation.

Described further herein is a control device comprising a user input device that may be backlit to display multiple discrete points of illumination on the user input device. Each of the multiple discrete points of illumination may represent a preset associated with one or more electrical loads configured to be controlled by the control device. The backlighting may be provided via a plurality of light sources such as LEDs. A user may actuate one of the multiple discrete points of illumination. In response, the control circuit may perform the actions. The control circuit may control the plurality of light sources to illuminated the selected discrete point in a manner distinguishable from the rest of the multiple discrete points of illumination. The control circuit may further generate control data to control the plurality of electrical loads based on the preset associated with the selected discrete point.

BRIEF DESCRIPTION OF THE DRAWINGS

FIG. 4C depicts an example of using a gesture to control an electrical load via the example control device illustrated in FIG. 4A.

FIG. 4D depicts another example of using a gesture to control an electrical load via the example control device illustrated in FIG. 4A.

FIG. 4E depicts an example of applying color control over a lighting load using a light bar located on the example control device illustrated in FIG. 4A.

FIG. 4F depicts an example of applying color control over a lighting load using backlit virtual buttons located on the example control device illustrated in FIG. 4A.

FIG. 6A is a perspective view of an example remote control device that may be deployed as a remote control device of the load control system illustrated in FIG. 1 with a control module detached from a base portion.

FIG. 6B are rear views of the control module and the base portion of the remote control device depicted in FIG. 6A.

FIG. 9A is a front view of an example remote control device that may be deployed as a remote control device of the load control system illustrated in FIG. 1.

FIG. 9A.

FIG. 9B is a right side view of the example remote control device illustrated in FIG. 10A is a front perspective view of the example remote control device illustrated in FIG. 9A, with the remote control device unmounted from a light switch that the remote control device is configured to be mounted on.

DETAILED DESCRIPTION

Figure 1:
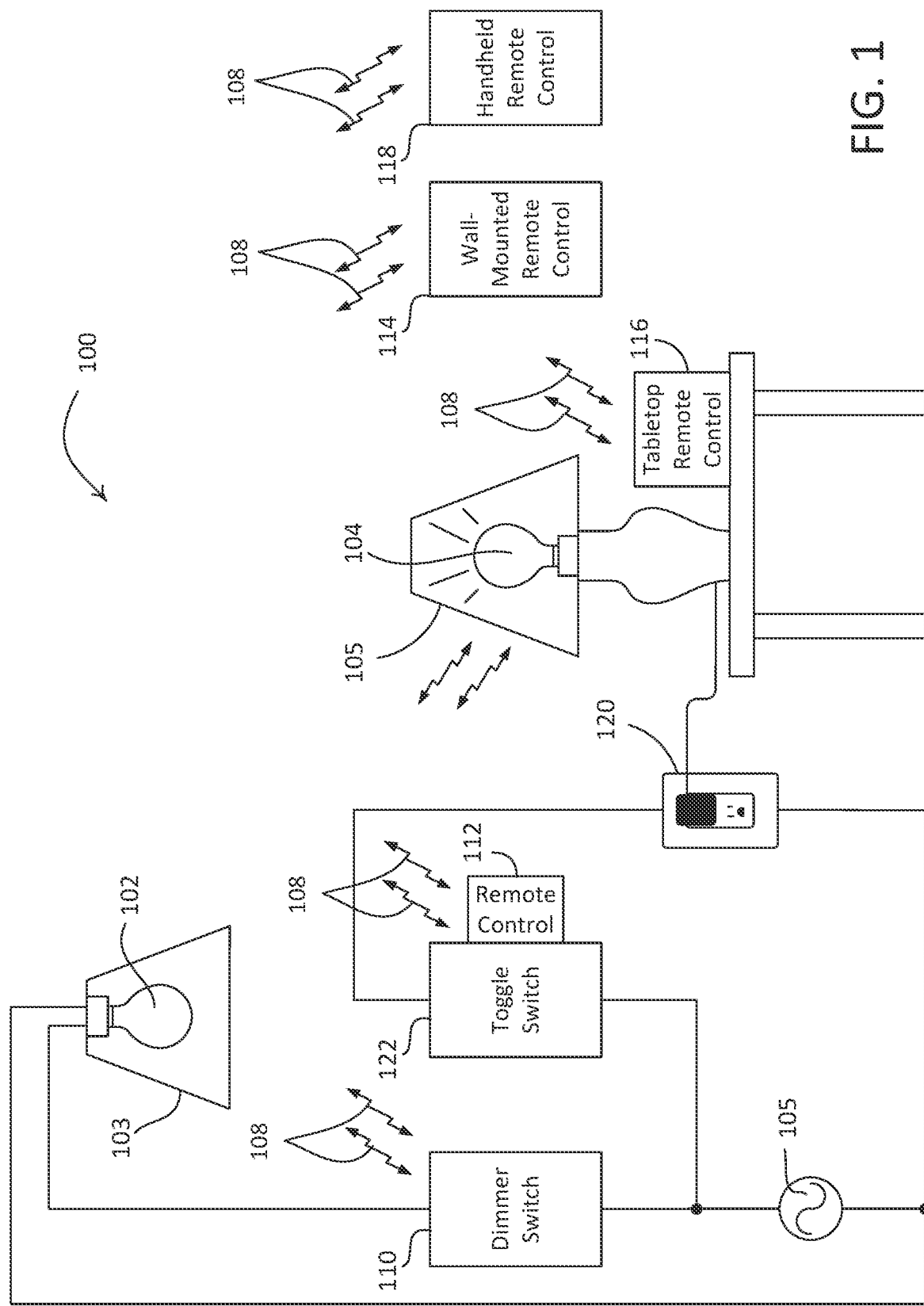
FIG. 1 depicts an example load control system that includes one or more example control devices.

FIG. 1 is a simplified block diagram of an example load control system. As shown, the load control system is configured as a lighting control system 100 for control of one or more lighting loads, such as a lighting load 102 that is installed in a ceiling-mounted downlight fixture 103 and a controllable lighting load 104 that is installed in a table lamp 105. The lighting loads 102, 104 shown in FIG. 1 may include light sources of different types (e.g., incandescent lamps, fluorescent lamps, and/or LED light sources). The lighting loads may have advanced features. For example, the lighting loads may be controlled to emit light of varying intensities and/or colors in response to a user command. The amount of power delivered to the lighting loads may be adjusted to an absolute level or by a relative amount. The lighting control system 100 may be configured to control one or more of the lighting loads (e.g., and/or other electrical loads) according to one or more configurable presets or scenes. These presets or scenes may correspond to, for example, predefined light intensities and/or colors, predefined entertainment settings such as music selection and/or volume settings, predefined window treatment settings such as positions of shades, predefined environmental settings such as HVAC settings, or any combination thereof. The presets or scenes may correspond to one or more specific electrical loads (e.g., bedside lamps, ceiling lights, etc.) and/or one or more specific locations (e.g., a room, an entire house, etc.).

The lighting load 102 may be an example of a lighting load that is wired into a power control and/or delivery path of the lighting control system 100. As such, the lighting load 102 may be controllable by a wall-mounted control device such as a dimmer switch. The lighting load 104 may be an example of a lighting load that is equipped with integral load control circuitry and/or wireless communication capabilities such that the lighting load may be controlled via a wireless control mechanism (e.g., by a remote control device).

The lighting control system 100 may include one or more control devices for controlling the lighting loads 102, 104 (e.g., controlling an amount of power delivered to the lighting loads). The lighting loads 102, 104 may be controlled substantially in unison, or be controlled individually. For example, the lighting loads may be zoned so that the lighting load 102 may be controlled by a first control device, while the lighting load 104 may be controlled by a second control device. The control devices may be configured to turn the lighting loads 102, 104 on and off. The control devices may be configured to control the magnitude of a load current conducted through the lighting loads (e.g., so as to control an intensity of the lighting loads 102, 104 between a low-end intensity LLE and a high-end intensity LHE). The control devices may be configured to control an amount of power delivered to the lighting loads to an absolute level (e.g., to a maximum allowable amount), or by a relative amount (e.g., an increase of 10% from a current level). The control devices may be configured to control a color of the lighting load 102, 104 (e.g., by controlling a color temperature of the lighting loads or by applying full color control over the lighting loads).

The control devices may be configured to activate a preset associated with the lighting load 102, 104 (e.g., a preset may be associated with one or more predetermined settings of the lighting loads such as an intensity level of the lighting loads and/or a color of the lighting loads). The presets may be configured via the control device and/or via an external device (e.g., a mobile device) by way of a wireless communication circuit of the control device. The control devices may be configured to activate control of a zone. A zone may correspond to one or more electrical loads that are configured to be controlled by the control devices. A zone may be associated with a specific location (e.g., a living room) or multiple locations (e.g., an entire house with multiple rooms and hallways). The control devices may be configured to switch between different operational modes. An operational mode may be associated with controlling different types of electrical loads or different operational aspects of one or more electrical loads. Examples of operational modes may include a lighting control mode for controlling one or more lighting loads (e.g., which in turn may include a color control mode and an intensity control mode), an entertainment system control mode (e.g., for controlling music selection and/or the volume of an audio system), an HVAC system control mode, a winter treatment device control mode (e.g., for controlling one or more shades), and/or the like.

The control device described herein may be, for example, a dimmer switch 110, a retrofit remote control device 112, a wall-mounted control device 114, a tabletop remote control device 116, and/or a handheld remote control device 118, as shown in FIG. 1. The dimmer switch 110 may be configured to be mounted to a standard electrical wallbox (e.g., via a yoke) and be coupled in series electrical connection between an alternating-current (AC) power source 105 and a lighting load that is wired into the control path of the dimmer switch 110 (e.g., such as the lighting load 102). The dimmer switch 110 may receive an AC mains line voltage Vac from the AC power source 105, and may generate a control signal for controlling the lighting load 102. The control signal may be generated via various phase-control techniques (e.g., a forward phase-control dimming technique or a reverse phase-control dimming technique). The dimmer switch 110 may be configured to receive wireless signals (e.g., from a remote control device) representative of commands to control the lighting load 102, and generate respective control signals for executing the commands. Examples of wall-mounted dimmer switches are described in greater detail with reference to FIG. 13, and in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSORCONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The retrofit remote control device 112 may be configured to be mounted to a mechanical switch (e.g., a toggle switch 122) that may be pre-existing in the lighting control system 100. Such a retrofit solution may provide energy savings and/or advanced control features, for example without requiring significant electrical re-wiring and/or without requiring the replacement of existing mechanical switches. As an example, a consumer may replace an existing lamp with the controllable lighting load 104, switch a toggle switch 122 that is coupled to the lighting load 104 to the on position, install (e.g., mount) the remote control device 112 onto the toggle switch 122, and associate the remote control device 112 with the lighting source 104. The retrofit remoted control 112 may then be used to perform advanced functions that the toggle switch 122 may be incapable of performing (e.g., such as dimming the intensity level of the light output, changing the color of the light output, providing feedback to a user, etc.). As shown, the toggle switch 122 is coupled (e.g., via a series electrical connection) between the AC power source 105 and an electrical receptacle 120 into which the lighting load 104 may be plugged (e.g., as shown in FIG. 1). Alternative, the toggle switch 122 may be coupled between the AC power source 105 and one or more of the lighting loads 102, 104, without the electrical receptacle 120.

The wall-mounted remote control device 114 may be configured to be mounted to a standard electrical wallbox and be electrically connected to the AC power source 105 for receiving power. The wall-mounted remote control device 114 may be configured to receive a user input and may generate and transmit a control signal (e.g., control data such as a digital message) for controlling the lighting loads 102, 104 in response to the user input. The tabletop remote control device 116 may be configured to be placed on a surface (e.g., an end table or night stand), and may be powered by a direct-current (DC) power source (e.g., a battery or an external DC power supply plugged into an electrical outlet). The tabletop remote control device 116 may be configured to receive a user input, and may generate and transmit a signal (e.g., a digital message) for controlling the lighting loads 102, 104 in response to the user input. The handheld remote control device 118 may be sized to fit into a user's hand, and may be powered by a direct-current (DC) power source (e.g., a battery or an external DC power supply plugged into an electrical outlet). The handheld remote control device 118 may be configured to receive a user input, and may generate and transmit a signal (e.g., a digital message) for controlling the lighting loads 102, 104 in response to the user input. Examples of battery-powered remote controls are described in greater detail in commonly assigned U.S. Pat. No. 8,330,638, issued Dec. 11, 2012, entitled "Wireless Battery Powered Remote Control Having Multiple Mounting Means," and U.S. Pat. No. 7,573,208, issued Aug. 11, 2009, entitled "Method Of Programming A Lighting Preset From A Radio-Frequency Remote Control," the entire disclosures of which are hereby incorporated by reference.

The control devices described herein (e.g., the dimmer switch 110 and/or remote control devices 112-118) may each include a user input unit. The user input unit may be configured to receive (e.g., detect) user inputs for controlling one or more of the lighting loads 102, 104, and/or the control device itself. A plurality of mechanisms for receiving the user inputs may be implemented on the user input unit, including, for example, a rotating mechanism (e.g., such as a rotary knob or a dial), a button or switch or an imitation thereof, and a touch sensitive device (e.g., such as a capacitive touch surface) configured to detect both point actuations and gestures.

A point actuation, as described herein, may be characterized by a contact applied at a specific location of a detection surface (e.g., a touch sensitive surface). Examples of point actuations may include a "tap" or "poke" (e.g., a quick touch and release applied at a single point of detection), a "press and hold" (e.g., a finger press applied at a single point of detection for a period of time), and a "double tap" (e.g., two taps applied in quick succession at a single point of detection). A user input device (e.g., which may include a touch sensitive surface and/or a touch sensitive circuit as described herein) may be configured to detect a point actuation and generate an output signal indicating the detection. Such a user input device may be further configured to interpret other types of user inputs as multiple, continuous point actuations. For example, the user input device may be configured to detect a finger sliding or dragging across a touch sensitive surface and interpret such a "slide" or "drag" as multiple, continuous point actuations. The user input device may generate multiple output signals in response to the "slide" or "drag" (e.g., one output signal corresponding to each of the point actuations).

A gesture, as described here, may be distinguishable from a point actuation in at least a spatial and/or timing aspect. A gesture may represent a motion associated with specific timing characteristics. A user input device sensitive to gestures may be configured to detect a gesture, interpret the gesture as a single action, and generate an output signal indicating the detection and/or action. Gestures may be contact based (e.g., effectuated via one or more physical contacts with a detection surface), or non-contact based (e.g., effectuated without direct physical contact with a detection surface).

Contact based gestures, as described herein, may include a "swipe," a "smack," a multi-finger "pinch," a multi-finger "spread" or "open," and/or the like. A "smack" may be characterized by contacts applied at multiple locations of a detection surface within a predetermined time window (e.g., a narrow time window for detecting simultaneity of the contacts). Contacts with multiple locations may indicate that multiple fingers, palm of a hand, and/or the like, are involved, and a narrow time window may indicate that the contacts are brief and simultaneous to indicate a smacking motion. A "swipe" may be characterized by consecutive contacts with multiple locations within a brief time period. Consecutive contacts with multiple locations may indicate a movement (e.g., by one or more fingers) over the detection surface, and the brevity of time may indicate that the movement was performed with quickness to indicate a swiping motion. A multi-finger "pinch" may be characterized by multiple fingers (e.g., two fingers) moving together, and a multi-finger "spread" or "open" may be characterized by multiple fingers (e.g., two fingers) moving apart. It should be noted that the terms used to describe the above gestures may be varied and should not limit the scope of the disclosure. Gestures may be user-programmable, reprogrammable, and custom gestures. For example, a user may pre-program a control device (e.g., via a mobile app) to recognize additional gestures such as a "rotate," a "zig-zag," and/or a "circling" motion as commands to control a certain operational aspect of an electrical load.

Non-contact based gestures, as described herein, may include various hand, arm, or body movements in front of a detection surface. For example, the user input unit may be configured to detect, via a capacitive touch element, a finger hovering over a front surface of the control device and interpret such a motion as a command to change a state of the control device or an electrical load controlled by the control device. Such non-contact based gestures may be detected by a touch sensitive device (e.g., a capacitive based touch surface) even without physical contact with the surface, for example, as long as the gestures are within a limited distance from the touch sensitive device (e.g., within 2 cm).

The control devices described herein (e.g., the dimmer switch 110 and/or remote control devices 112-118) may each include one or more visual indicators (e.g., a light bar) configured to be illuminated by one or more light sources (e.g., one or more LEDs). The one or more visual indicators may be provided on the user input unit or may be separate from the user input unit. The one or more visual indicators may be operable to provide feedback to a user of the control device. Such feedback may indicate, for example, a status of a lighting load (e.g., the lighting loads 102, 104) controlled by the control device. The status may reflect, for example, whether the lighting load is on or off, a present intensity of the lighting load, a color of the lighting load, and so on. The feedback may indicate a status of the control device itself, for example, such as a present operational mode of the control device (e.g., an intensity control mode or a color control mode), a power status of the control device (e.g., remaining battery power), and so on. As an example, the control device may provide feedback via the visual indicators while the control device is being actuated and/or after the control device is actuated. The feedback may indicate to the user that the control device is transmitting control signals (e.g., RF signals) in response to the actuation. The control device may be configured to keep the visual indicators illuminated while the condition triggering the feedback continues to exist. The control device may be configured to illuminate the visual indicators for a few seconds (e.g., 1-2 seconds) and then turn off the visual indicators (e.g., to conserve battery life).

The one or more visual indicators may be illuminated in response to detection of a user within close proximity of the control device. Such detection may be based on, for example, a finger hovering near the front surface of the control device, as described above. To illustrate, the visual indicators may be dim (e.g., not illuminated) when the control device is in an idle state. As a user approaches the control device (e.g., as the user reaches for the control device with a finger or hand, but before the finger or hand actually touches the control device), the control device may detect the proximity of the user (e.g., the user's finger or hand), and may illuminate the visual indicators in response to the detection. As described above, the proximity of the user's finger or hand to the control device may be detected, for example, via a capacitive touch element comprised in the control device. The exact distance between the user and the control device that may trigger the illumination of the visual indicator may vary, for example, depending on the properties of the capacitive touch element employed.

The one or more visual indicators may assist with a control function of the control device. For example, the one or more visual indicators may be illuminated to present virtual buttons on a touch sensitive surface of the control device. Each of the virtual buttons (e.g., illuminated touch sensitive areas) may be used, for example, to activate a preset associated with one or more electrical loads (e.g., the lighting loads 102, 104). Each of the virtual buttons (e.g., illuminated touch sensitive areas) may be used, for example, to activate an operational mode associated with controlling one or more electrical loads (e.g., a mode for controlling the lighting loads 102, 104, a mode for controlling one or more winter treatment devices, a mode for controlling a HVAC system, etc.). Each of the virtual buttons (e.g., illuminated touch sensitive areas) may be used, for example, to activate control of a specific electrical load or a zone including multiple electrical loads (e.g., a zone for one room, a zone for an entire house, etc.). Further, the one or more visual indicators (e.g., a light bar) may be illuminated to display a color gradient representative of a plurality color settings for a lighting load. A user of the control device may actuate an area of the touch sensitive surface next to the color gradient to select a corresponding color for the lighting load.

The control devices described herein (e.g., the dimmer switch 110 and/or remote control devices 112-118) may each include a control circuit. The control circuit may be configured to be responsive to a user input received via the user input unit. The control circuit may be configured to generate control data (e.g., a control signal) for controlling the lighting loads 102, 104 in response to the user input. The control data may include commands and/or other information for controlling the lighting loads 102, 104. The control data may be included in a control signal transmitted to the lighting loads 102, 104 via a wireless communication circuit. The control circuit may be configured to illuminate the one or more visual indicators to provide feedback of the control being applied and/or its outcome.

The control device may be configured to operate in multiple operational modes, and the control circuit may be configured to switch the control device from one mode to another. For example, the control circuit may be configured to switch the control device between an intensity control mode for controlling an intensity of the lighting loads 102, 104 and a color control mode for controlling a color of the lighting loads 102, 104. The control circuit may be configured to provide feedback (e.g., via the visual indicators described herein) about the operational mode of the control device.

The control devices described herein (e.g., the dimmer switch 110 and/or remote control devices 112-118) may each include a wireless communication circuit for transmitting and/or receiving radio frequency (RF) signals 108. The wireless communication circuit may be used to transmit a control signal that includes the control data (e.g., a digital message) generated by the control device to the lighting loads 102, 104 or to a central controller of the lighting control system 100, for example. As described herein, the control data may be generated in response to a user input (e.g., a gesture) to adjust one or more operational aspects of the lighting loads 102, 104. The control data may include a command and/or identification information (e.g., such as a unique identifier) associated with the control device and/or one or more of the lighting loads 102, 104 (e.g., and/or other electrical loads of the load control system 100).

The control devices (e.g., the remote control devices 112-118) may be associated with one or more lighting loads and/or other control devices (e.g., the dimmer switch 110) for controlling the lighting loads (e.g., through a configuration procedure). Upon such association, the lighting loads 102, 104 may be responsive to control signals transmitted by the control devices. To illustrate, the association may be accomplished by actuating an actuator on the concerned lighting loads and/or control devices, and then actuating (e.g., pressing and holding) an actuator on the control device for a predetermined amount of time (e.g., approximately 10 seconds). Examples of a configuration procedure for associating a control device with an electrical load is described in greater detail in commonly-assigned U.S. Patent Publication No. 2008/0111491, published May 15, 2008, entitled "Radio-Frequency Lighting Control System," the entire disclosure of which is hereby incorporated by reference. The wireless communication circuit may also be controlled to transmit/receive feedback information regarding the control device and/or the lighting loads 102, 104 via RF signals.

The control device described herein (e.g., the dimmer switch 110 and/or remote control devices 112-118) may include a memory (not shown). The memory may be used, for example, to store operational settings associated with the control device and/or the lighting loads 102, 104 (e.g., such as lighting presets and their associated light intensities and/or colors). The memory may be implemented as an external integrated circuit (IC) or as an internal circuit (e.g., as part of a control circuit).

Greater detail about the control devices (e.g., the dimmer switch 110 and/or remote control devices 112-118) will be provided herein with reference to FIGS. 2-13 and examples of a retrofit remote control device (e.g., such as the retrofit remote control device 112 of FIG. 1). It should be appreciate, however, that although examples are described with reference to a retrofit remote control device, the examples (e.g., those related to gesture-based user interfaces) are applicable to other types of control devices, including wall-mounted dimmer switches (e.g., such as the dimmer switch 110), wall-mounted remote control devices (e.g., such as the wall-mounted remote control 114), tabletop remote control devices (e.g., such as the tabletop remote control 116), handheld remote control devices (e.g., such as the handheld remote control 118), and/or the like.

Further, it should be appreciated that, although a lighting control system with two lighting loads is provided as an example above, a load control system as described herein may include more or fewer lighting loads, other types of lighting loads, and/or other types of electrical loads that may be configured to be controlled by the one or more control devices. For example, the load control system may include one or more of: a dimming ballast for driving a gas-discharge lamp; an LED driver for driving an LED light source; a dimming circuit for controlling the intensity of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a set-point temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and/or the like.

Figure 2:
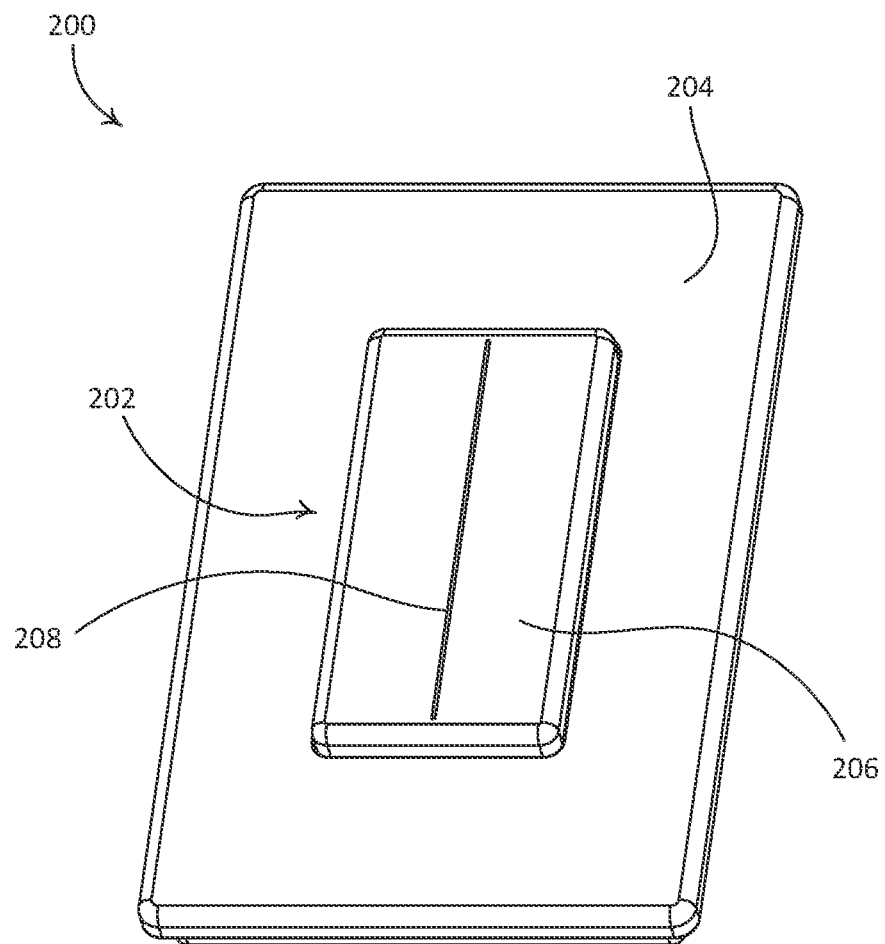
FIG. 2 is a perspective view of an example control device that may be deployed as a dimmer switch and/or a remote control device of the load control system illustrated in FIG. 1.

FIG. 2 depicts an example control device 200 that may be deployed as the dimmer switch 110 and/or the retrofit remote control device 112 in the lighting control system 100. The control device 200 may comprise a user interface 202 and a faceplate 204. The user interface 202 may include a touch sensitive surface 206 (e.g., a capacitive touch surface) that is configured to receive (e.g., detect) inputs, such as gestures, from a user of the control device 200. The user interface 202 may also include a light bar 208 configured to be illuminated by one or more light sources (e.g., one or more LEDs) to visibly display information.

Figure 3A:
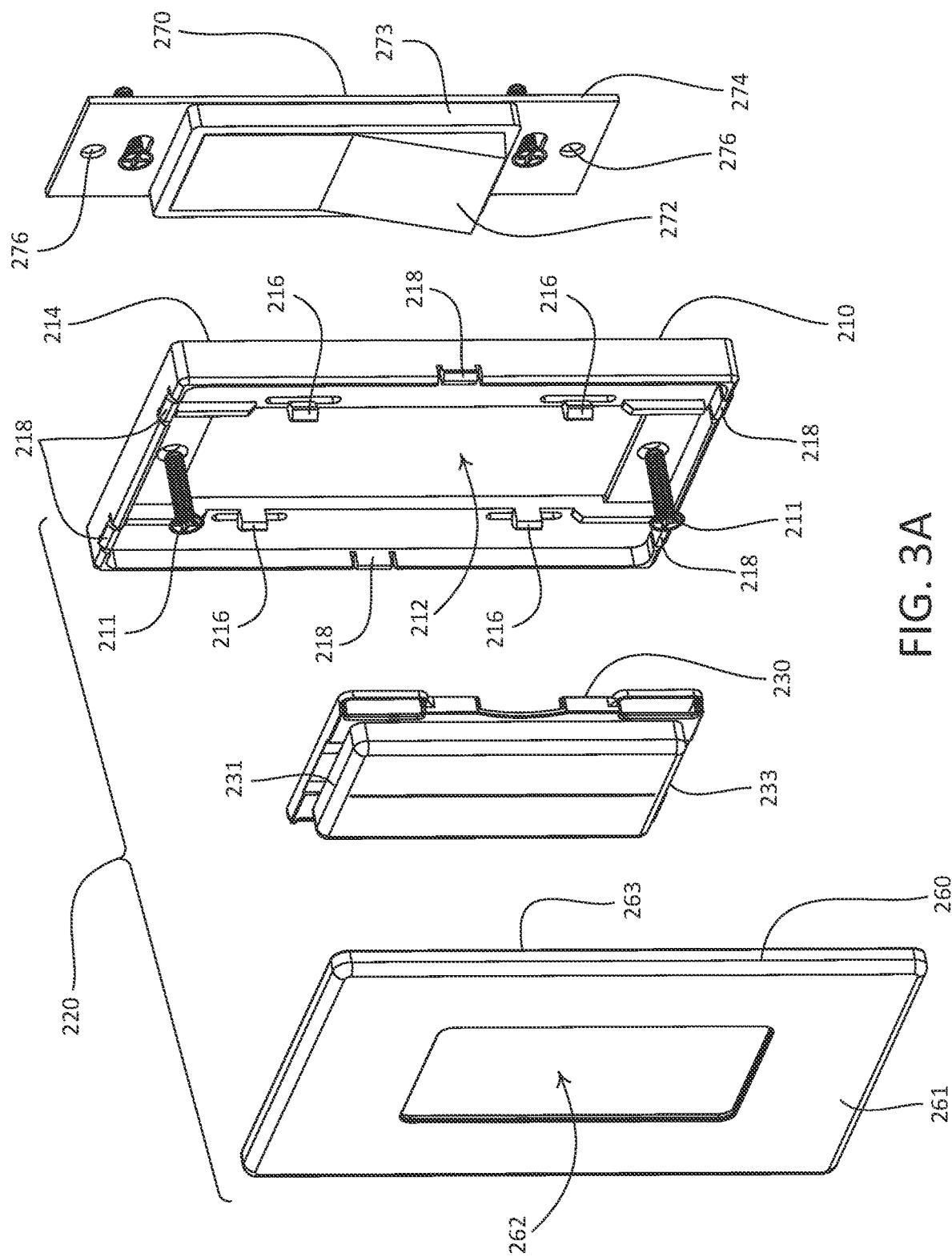
FIG. 3A is an exploded view of an example remote control device that may be deployed as a remote control device of the load control system illustrated in FIG. 1.
Figure 3B:
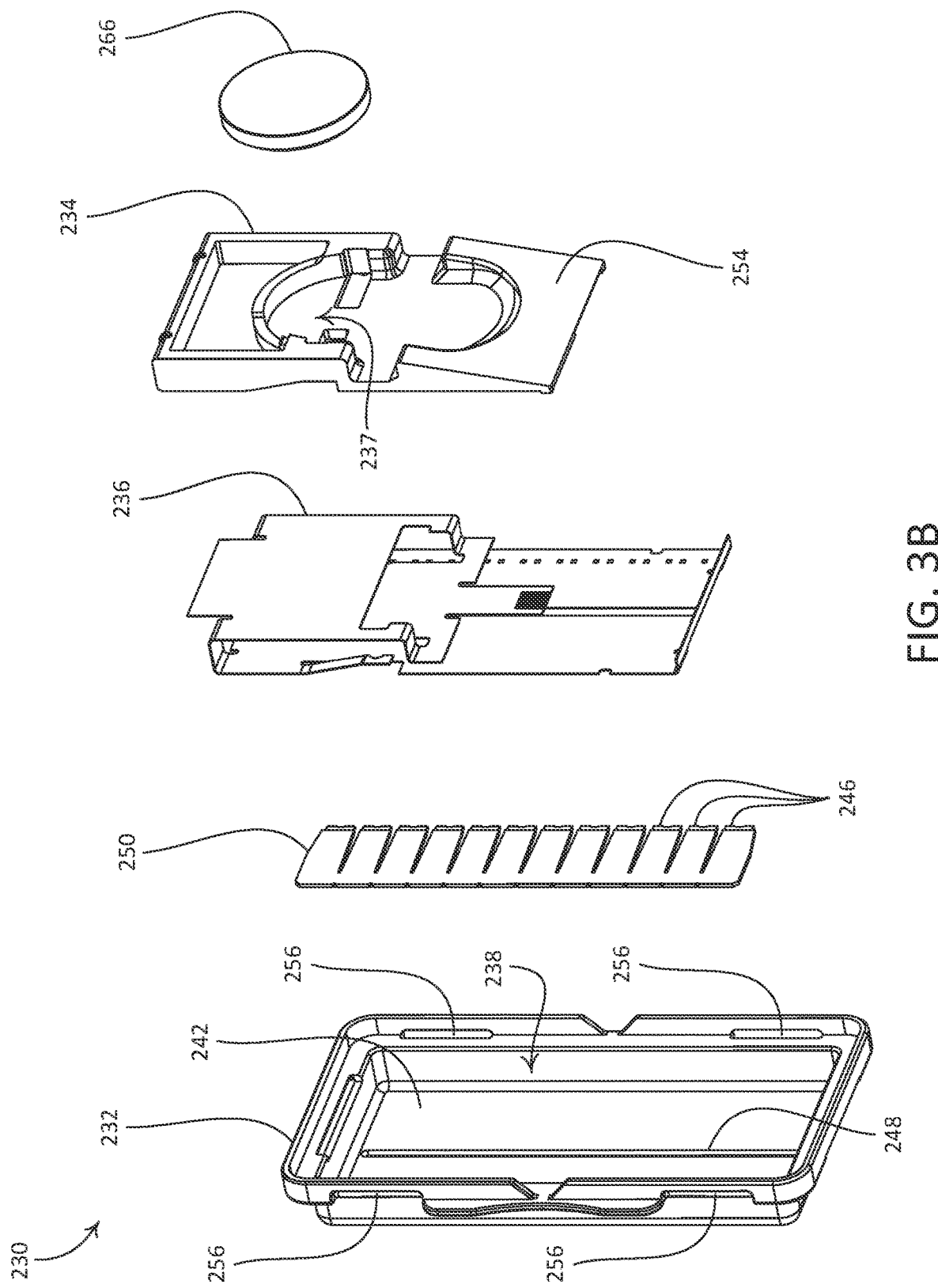
FIG. 3B is an exploded rear perspective view of a control unit component of the example remote control device illustrated in FIG. 3A.
Figure 3C:
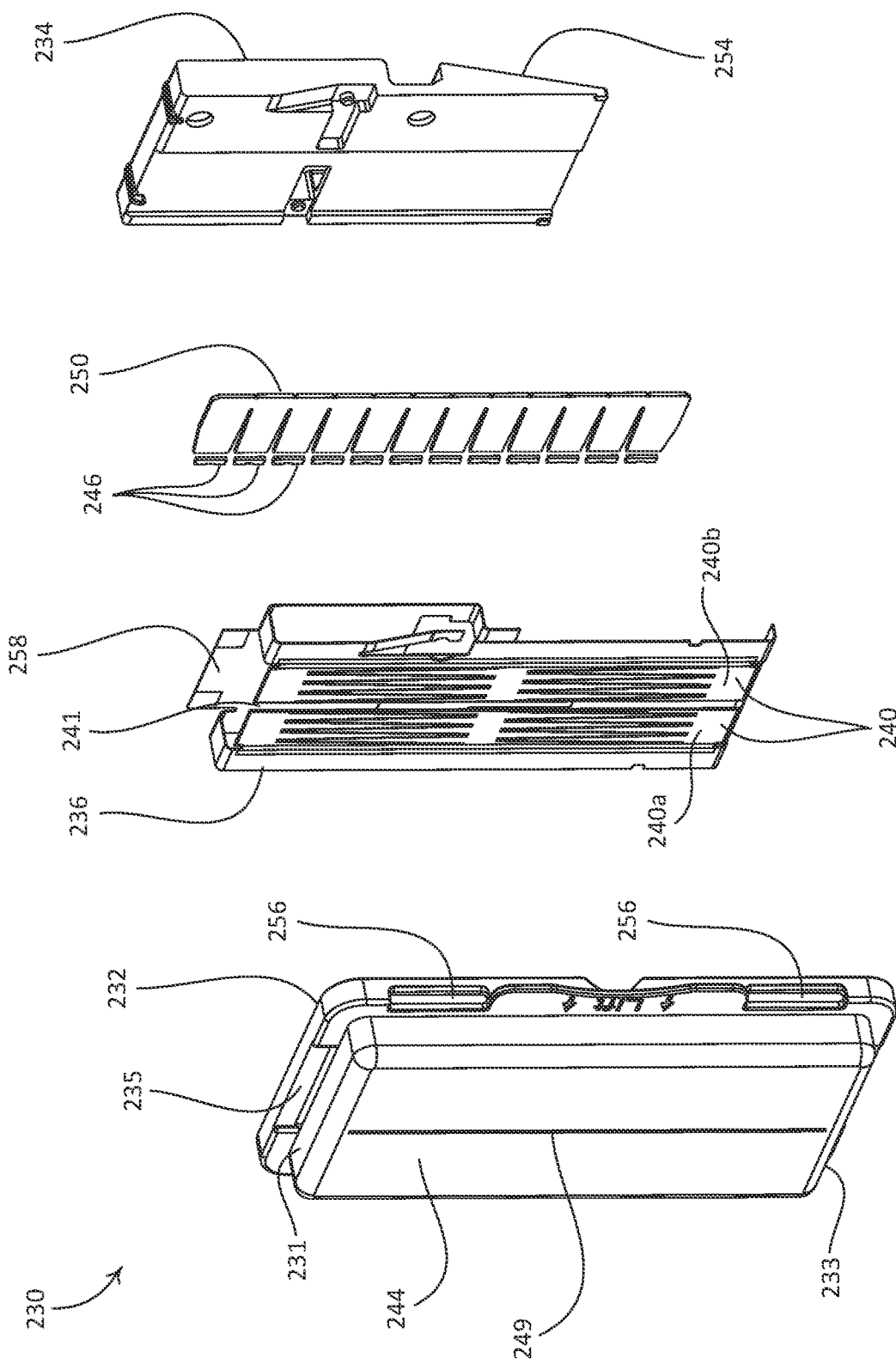
FIG. 3C is an exploded front perspective view of the control unit component of the example remote control device illustrated in FIG. 3A.

FIGS. 3A-3C depict an example remote control device 220 that may be deployed as the retrofit remote control device 112 in a the lighting control system 100 and/or the control device 200 shown in FIG. 2. The lighting control system 100 may include a mechanical switch 270 that may be in place prior to installation of the remote control device 220 (e.g., the mechanical switch 270 may be pre-existing in the lighting control system). As shown, the mechanical switch 270 may be a standard decorator paddle switch. The lighting control system 100 may further include one or more lighting loads, such as the lighting loads 102, 104. The mechanical switch 270 may be coupled in series electrical connection between an AC power source (e.g., the AC power source 105 of FIG. 1) and the one or more lighting loads. The mechanical switch 270 may include an actuator 272 that may be actuated to turn on and/or turn off, the one or more lighting loads. The mechanical switch 270 may include a yoke 274 that enables mounting of the mechanical switch 270 to a structure. For example, the yoke 274 may be fastened to a single-gang wallbox that is installed in an opening of a wall.

As shown, the example remote control device 220 may include an adapter 210, a control unit 230, and a faceplate 260. Prior to installation of the remote control device 100, a pre-existing faceplate (not shown) may be removed from the mechanical switch 270, for instance by removing faceplate screws (no shown) from corresponding faceplate screw holes 276 in the yoke 274. The adapter 210 may be made of any suitable material, such as plastic. The adapter 210 may be configured to be attached to the yoke 274 of the mechanical switch 270. For example, the adapter 210 may be secured to the yoke 274 using fasteners, such as screws 211 that are installed into the faceplate screw holes 276 in the yoke 274. As shown, the adapter 210 may define an opening 212 that extends therethrough. The opening 212 may be configured to receive a portion of the mechanical switch 270 that may include, for example, the actuator 272 and a frame 273 that surrounds a perimeter of the actuator 272. The adapter 210 may define a rear surface 214 that is configured to abut a surface of a structure to which the mechanical switch 270 is installed, such as a wallboard surface that surrounds a wallbox in which the mechanical switch 270 is installed.

The adapter 210 may be configured to enable removable attachment of the control unit 230 to the adapter 210. For example, the adapter 210 may define one or more attachment members that are configured to engage with complementary features of the control unit 230. As shown, the adapter 210 may define one or more resilient snap fit connectors 216 that are configured to engage with complementary features of the control unit 230. The adapter 210 may be configured to enable removable attachment of the faceplate 260 to the adapter 210. For example, the adapter 210 may define one or more attachment members that are configured to engage with complementary features of the faceplate 260. As shown, the adapter 210 may define one or more resilient snap fit connectors 218 that are configured to engage with complementary features of the faceplate 260.

The faceplate may define a front surface 261 and an opposed rear surface 263. The front surface 261 may alternatively be referred to as an outer surface of the faceplate 260, and the rear surface 263 may alternatively be referred to as an inner surface of the faceplate 260. The faceplate 260 may define an opening 262 therethrough that is configured to receive a portion of the control unit 230, such that the control unit 230 protrudes from the faceplate 260 when the remote control device 220 is in an assembled configuration. As shown, the faceplate 260 may define recessed ledges 264 that are configured to engage with corresponding ones of the snap fit connectors 218 of the adapter 210, to releasably attach the faceplate 260 to the adapter 210. The faceplate 260 may be made of any suitable material, such as plastic.

As shown in FIGS. 3B and 3C, the control unit 230 may include a cover 232, an insert 234 that is configured to be received in the cover 232, and a flexible circuit board 236 that may be configured to be wrapped around a portion of the insert 234. The cover 232 and the insert 234 may be made of any suitable material, such as plastic. The illustrated control unit 230 is rectangular in shape and is elongate between a first end 231 and an opposed second end 233. It should be appreciated that the control unit 230 is not limited to the illustrated rectangular geometry, and that control unit may alternatively be configured with other suitable geometries. In accordance with the illustrated orientation of the control unit 230, the first end 231 may be referred to as an upper end of the control unit 230 and the second end 233 may be referred to as a lower end of the control unit 230. The first and second ends 231, 233 of the control unit 230 may also be referred to as first and second ends of the cover 232, respectively. The cover 232 may define a void 238 that is configured to receive the insert 234 with the flexible circuit board 236 wrapped around the insert 234 in an attached position. The cover 232 may define an inner surface 242 and an opposed outer surface 244. The outer surface 244 of the cover 232 may alternatively be referred to as a front surface of the cover 232, and more generally as an outer surface of the control unit 230.

The control unit 230 may include a touch sensitive device (e.g., a capacitive touch device) that is configured to receive (e.g., detect) inputs, such as gestures, from a user of the remote control device 220. For example, the flexible circuit board 236 may include one or more capacitive touch elements on a capacitive touch circuit 240 of the flexible circuit board 236. As shown, the capacitive touch circuit 240 faces the inner surface 242 of the cover 232 (e.g., behind the outer surface 244 of the control unit 230) when the flexible circuit board 236 is wrapped around the insert 234 and disposed in the void 238. The one or more capacitive touch elements on the capacitive touch circuit 240 may form multiple (e.g., two) capacitive touch channels or zones 240a, 240b that may be located on both sides of a central vertical axis of the capacitive touch circuit 240. The capacitive touch circuit 240 may be configured to detect touches (e.g., gestures applied on the outer surface 244) along an x axis, a y axis, or both an x and y axis. The capacitive touch circuit 240 may be further configured to detect gestures that are effectuated without any physical contact with the outer surface 244. For example, the capacitive touch circuit 240 may be capable of detecting a hovering finger in the proximity of the outer surface 244 based on changes occurred in the electromagnetic field near the capacitive touch circuit 240. Since the capacitive touch circuit 240 resides behind the outer surface 244 and is capable of detect user inputs applied via the outer surface 244, the outer surface 244 may also be regarded herein as a touch sensitive surface.

The control unit 230 may further include a control circuit (not shown) and a wireless communication circuit (not shown). The control circuit and the wireless communication circuit may be mounted to the flexible circuit board 236, for example. The control circuit may be in electrical communication with the capacitive touch circuit 240, and the wireless communication circuit may be in electrical communication with the control circuit. The flexible circuit board 236 may be configured to wrap around the insert 234 such that the capacitive touch circuit 240 is spaced from the control circuit, the wireless communication circuit, and/or other "noisy" circuitry of the flexible circuit board 236 along a direction that extends perpendicular to the outer surface 244 of the cover 232. This arrangement may, for example, improve operational efficiency of the capacitive touch circuit 240.

The control unit 230 may be configured to provide visual indications about a status of an electrical load controlled by the remote control device 220 or a status of the remote control device 220 itself. Alternatively or additionally, the control unit 230 may be configured to provide visual indications related to a control function of the remote control device 220 (e.g., such as preset selection or color control). The visual indications may be provided in response to receiving user inputs (e.g., such as gestures) via the capacitive touch circuit 240, for example.

The remote control device 220 may include a plurality of light sources 246 (e.g., LEDs) that are configured to provide the visual indications described herein. The plurality of light sources 246 may be arranged in a linear array that extends between the upper and lower ends 231, 233 of the control unit 230, and may be attached to the flexible circuit board 236 approximate to an outer edge thereof. The cover 232 may define an opening that allows light from one or more of the light sources 246 to be emitted outward from an interior of the cover 232. For example, as shown, the cover 232 defines a narrow slot 248 that extends between the upper and lower ends 231, 233 of the cover 232. The cover 232 may include a light bar 249 that is disposed in the slot 248. The capacitive touch circuit 240 may define a gap 241, for example approximately midway between opposed sides of the flexible circuit board 236 or near a side thereof. The control unit may further include a light guide 250 that may be configured to diffuse light emitted from the light sources 246 through the gap 241 at respective locations along the slot 248. The light guide 250 may comprise light guide film, for example. It should be appreciated that the scope of the disclosure is not limited to the illustrated array of light sources 246 and/or the illustrated geometry of the slot 248.

The control unit 230 may be configured to translate a user input, such as a point actuation (e.g., a "tap") or a gesture (e.g., such as a "swipe," a "smack," a two-finger "pinch," a two-finger "open," etc.), into control data (e.g., a control signal) for controlling one or more electrical loads (e.g., the lighting loads 102, 104 of FIG. 1) controlled by the remote control device 220. For example, the control circuit may be configured to receive signals (e.g., from the capacitive touch circuit 240) that correspond to user inputs applied via the capacitive touch circuit 240, interpret the received signals into various control commands, and generate control data (e.g., a control signal) to cause the commands to be executed. For example, the control circuit may be configured to, in response to a point actuation, generate first control data (e.g., a first control signal) for changing a first characteristic of an electrical load, and in response to a gesture, generate second control data (e.g., a second control signal) for changing a second characteristic of the electrical load.

It should be appreciated that the control unit 230 described herein is not limited to interpreting signals associated with the above-described example gestures, and that the control unit 230 may be configured to interpret signals associated with more, fewer, or different gestures as desired. Gestures may be user-programmable, reprogrammable, and custom gestures. Further, as shown, the capacitive touch circuit 240 defines linear columns (e.g., one-dimensional columns) that may provide a Y-axis output. However, it should further be appreciated that the capacitive touch circuit 240 is not limited to the illustrated configuration. For example, the capacitive touch circuit 240 may define, for example, one or more linear columns that may provide respective Y-axis outputs, one or more linear rows that provide respective X-axis outputs, or any combination thereof. The capacitive touch circuit 240 may include, for example, a two-dimensional touch element having both X-axis and Y-axis outputs. Such implementations may enable the remote control device 200 to control multiple electrical loads from the control unit 230. For example, gestures applied to a first capacitive touch column may cause commands to be issued to a first lighting load associated with the first capacitive touch column, gestures applied to a second capacitive touch column may cause commands to be issued to a second lighting load associated with the second capacitive touch column, and gestures applied simultaneously to both the first and second capacitive touch columns may cause a command to be issued to both the first and second lighting loads.

Figure 4B:
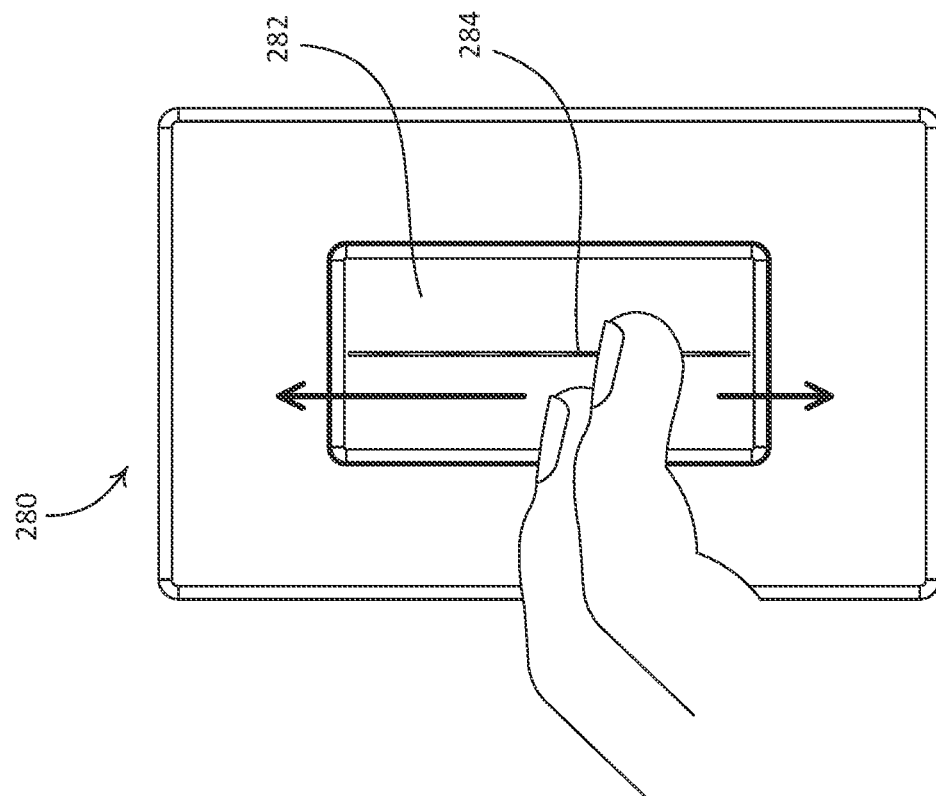
FIG. 4B depicts an example of applying relative control over an electrical load using the example control device illustrated in FIG. 4A.
Figure 4A:
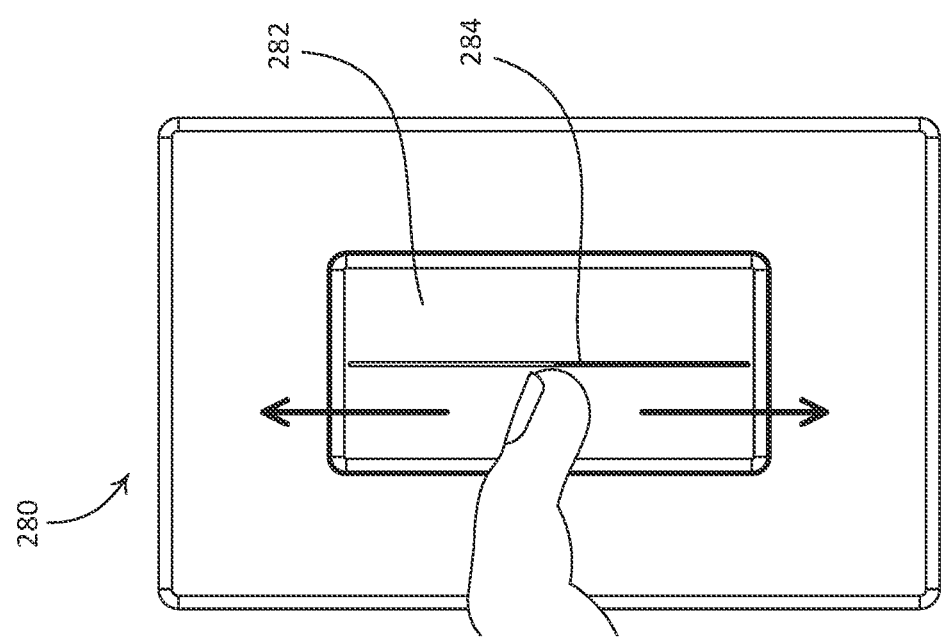
FIG. 4A depicts an example of applying absolute control over an electrical load using an example control device that may be deployed as a dimmer switch and/or a remote control device of the load control system illustrated in FIG. 1.

FIGS. 4A-4H depicts an example control device 280 that may be deployed as the dimmer switch 110 and/or the retrofit remote control device 112 in the lighting control system 100, as the control device 200, and/or as the remote control device 220. FIGS. 4A and 4B depict examples of user inputs that may be recognized by the control device 280 and translated into respective control signals for adjusting an amount of power delivered to one or more electrical loads. The user inputs may be provided via a touch sensitive surface 282 (e.g., the outer surface 244 of the control unit 230), and may have different characteristics (e.g., in term of spatial and/or timing properties) so that they may be interpreted as commands to apply different types of control over the electrical loads. For example, in FIG. 4A, the user input may be characterized by a point actuation (e.g., a tap) applied to an area of the touch sensitive surface 282 adjacent to a light bar 284 (e.g., the light bar 249 of the control unit 230). The user input may be detected by a capacitive touch circuit (e.g., the capacitive touch circuit 240), and may cause a signal to be transmitted to a control circuit of the control device 280 to indicate the detection. The signal may be reflective of the characteristics of a "tap." The control circuit may interpret the signal based on the characteristics reflected therein, and generate corresponding control data (e.g., a control signal) to control an electrical load controlled by the control device 280. For example, the control circuit may, in response to the user input depicted in FIG. 4A, generate control data (e.g., a control signal) to set an amount of power delivered to a plurality of electrical loads to an absolute level that is dependent upon the location of the user input. This way, as the user slides a finger along the light bar 284, the amount of power delivered to the electrical loads may be raised or lowered according to the position of the finger along the length of the light bar 284.

In an illustrative example of applying such absolute control, the control device 280 may control (e.g., may be associated with) first and second dimmable lighting loads (e.g., the lighting loads 102, 104 in FIG. 1) in a lighting control system. The control circuit may be configured to map multiple locations of the touch sensitive surface 282 along the light bar 284 to respective absolute intensity levels for the lighting loads. For example, if the control circuit receives a signal indicating that a "tap" (e.g., as depicted in FIG. 4A) is detected at a location corresponding to 25% intensity, the control circuit may generate control data (e.g., a control signal) to dim both the first and second lighting loads to 25% intensity. The control data may be transmitted to the lighting loads by a wireless communication circuit of the control device 280 via a control signal that includes the control data.

The control device 280 may also be configured to, in certain situations, rescale the adjustment amount that corresponds to a point actuation (e.g., a "tap") along the light bar 284. For example, the control device 280 may be configured to apply such rescaling when the current intensity levels of the lighting loads are near the low-end (e.g., 5%). In those scenarios, the control device 280 (e.g., the control circuit of the control device) may rescale the adjustment amount so that a user may be able to apply a smaller amount of adjustment to the concerned intensity levels (e.g., fine-tuning) in response to a point actuation along the light bar 284. The control circuit may be configured to perform the rescaling in response to a user input (e.g., a gesture). For example, the user input may be a multi-finger "open" gesture applied to an area of the touch responsive surface adjacent to the light bar 284. The control device 280 may rescale the adjustment amounts back to their original values (e.g., when the light intensities of the lighting loads are no longer near the low-end) in response to a multi-finger "pinch" gesture applied to an area of the touch responsive surface adjacent to the light bar 284.

In FIG. 4B, the user input may be characterized by contacts with the touch sensitive surface 282 by multiple fingers (e.g., two fingers) in an area of the touch sensitive surface 282 adjacent to the light bar 284. In an example, such contacts may be a multi-finger slide applied by a user along the light bar 284. The user may slide the multiple fingers simultaneously (e.g., substantially simultaneously) along both sides of the light bar 284 to actuate two capacitive touch channels of the capacitive touch circuit (e.g., the capacitive touch channels 240a, 240b of the capacitive touch circuit 240). The control circuit may be configured to recognize such a user input as a command for applying relative control, and generate corresponding control data (e.g., a control signal) to adjust (e.g., gradually adjust) an amount of power delivered to a plurality of electrical loads by a relative adjustment amount (e.g., relative to a starting level), while allowing the lighting loads to maintain respective absolute power levels that are different from one another. For example, the control circuit may cause the power delivered to the electrical loads to be adjusted by a percentage based on how far the fingers slide up or down the touch sensitive surface 282. The adjustment may be made gradually (e.g., at a predetermined rate) as the fingers are moved across the touch sensitive surface 282.

In an illustrative example of relative control, the control device 280 may control first and second dimmable lighting loads (e.g., the lighting loads 102, 104) in a lighting control system. The first lighting load may be powered at approximately 30% intensity, and the second lighting load may be powered at approximately 50% intensity. If the control circuit receives a signal indicating that a multi-finger slide (e.g., as depicted in FIG. 4B) is applied via the touch sensitive surface 282, the control circuit may issue one or more commands (e.g., one or more control signals) to cause the first and second lighting loads to adjust their intensities by a same number of percentage points (e.g., percentage points) based on how far the fingers are moved across the touch sensitive surface 282, while maintaining the difference in the respective intensities of the two lighting loads. As such, the first lighting load may be controlled to 20% intensity, and the second lighting load may be controlled to 40% intensity. Additionally or alternatively, based on how far the fingers are moved across the touch sensitive surface 282, the control circuit may be configured to issue one or more commands (e.g., one or more control signals) to cause the first and second lighting loads to adjust their intensity by a percentage of their respective present intensity levels. For example, the control circuit may instruct the first and second lighting loads to reduce their respective intensity levels by 10% of the present levels (e.g., as opposed to 10 percentage points). As such, the first lighting load may be controlled to 27% intensity (e.g., 10% down the previous level of 30%), and the second lighting load may be controlled to 45% intensity (e.g., 10% down the previous level of 50%).

The control device 280 may be configured to, in certain situations, rescale the relative adjustment amount that corresponds to a user input (e.g., a multi-finger slide). The control device 280 may be configured to apply such rescaling to accomplish fine-tune adjustments of the intensity of a lighting load. The control device 280 (e.g., the control circuit of the control device 280) may rescale the relative adjustment amount as a function of the current intensity level of the lighting load and the distance between a starting location of the user input and an end of the touch sensitive surface 282. For example, when raising the intensity levels of the lighting loads, the control circuit may rescale the relative adjustment amount so that a user may change the intensity level of the lighting load from a present intensity to a high-end intensity over the distance from an initial location of the user input (e.g., a starting point of the user input) and the top of the touch sensitive surface 282. When lowering the intensity level of a lighting load, the control circuit may rescale the relative adjustment amount so that a user may change the intensity level from a present intensity to a low-end intensity over the distance from an initial location of the user input and the bottom of the touch sensitive surface 282. To illustrate, if the current intensity of the lighting load is at 20%, the control circuit may rescale the relative adjustment amount so that a user may be able to dim the intensity down from 20% to a minimum intensity (e.g., to an off state) over the distance from a starting point of the user input to the bottom of the touch sensitive surface 282. Similarly, if the current intensity of the lighting load is at 80%, the control circuit may rescale the relative adjustment amount so that a user may be able to raise the intensity from 80% to a maximum intensity over the distance from a starting point of the user input to the top of the touch sensitive surface 282.

The control device 280 may be configured to perform the rescaling in response to a user input. Such a user input may be any of the point actuations or gestures described herein. For example, to fine-tune the intensity of a lighting load near the low-end, a user may press and hold a finger near the top of the touch sensitive surface 282. In response to such press-and-hold, the control circuit may rescale the relative adjustment amount over the distance between the location of the press-and-hold and the bottom of the touch sensitive surface 282. This way, as the user slides the finger across the touch sensitive surface 282, the intensity of the lighting load may be adjusted down from the present level based on the location of the finger.

The control circuit may be configured to perform rescaling for one lighting load and for multiple lighting loads. In the case of multiple lighting loads, the control circuit may rescale the relative adjustment amount based on the intensity of one of the lighting loads. For example, when raising the intensities of the multiple lighting loads, the control circuit may rescale the relative adjustment amount based on the lighting load that has the highest intensity level. When lowering the intensities of the multiple lighting loads, the control circuit may rescale the relative adjustment amount based on the lighting load that has the lowest intensity level.

Rescaling may also be accomplished if the control circuit is configured to translate a user input (e.g., a multi-finger slide) into an adjustment amount that is a percentage of the respective current intensity levels of the multiple lighting loads (e.g., rather than absolute percentage points). Using such an approach, a user may be able to utilize the distance between the top and bottom of the touch sensitive surface 282 near the light bar 284 to effectuate an adjustment that may range between of the current intensity levels.

The control device 280 may be configured to provide a visual indication in response to detecting the user inputs depicted in FIGS. 4A and 4B. For example, the control circuit of the control device 280 may be configured to, upon receiving a signal that is indicative of a user command to set an amount of power delivered to an electrical load to an absolute level (e.g., as depicted in FIG. 4A), indicate the level on the light bar 284. For example, the control circuit may illuminate the light bar 249 to an intensity proportional to the absolute level (e.g., a higher intensity for a higher power level). Alternatively or additionally, the control circuit may illuminate the light bar 284 along a length that extends from the bottom of the light bar to a position along the length of the light bar. The length of such an illumination (e.g., as defined by an amount of the light bar 284 that is illuminated) may correspond to and be indicative of the absolute level of power delivered to the electrical load. The illumination may fade away after a predetermined amount of time, or be maintained until the next adjustment.

In another example, the control circuit of the control device 280 may be configured to, upon receiving a signal from the capacitive touch circuit indicative of a user command to change an amount of power delivered to an electrical load by a relative amount (e.g., as depicted in FIG. 4B), illuminate the light bar 284 in a particular manner to indicate that relative control is being applied. For instance, the control circuit may be configured to, in response to detecting a user input for relative control, illuminate the light bar 284 into a specific pattern (e.g., multiple segments of varying intensities or colors). The control circuit may be further configured to alter the illumination pattern (e.g., successively alter the intensities or colors of the multiple segments) for the duration of the user input, so that an animation (e.g., imitation of a moving scrollbar and/or ridges of a scroll wheel) may be displayed on the light bar 284 to indicate that the power delivered to the electrical loads is being gradually adjusted (e.g., by a predetermined amount at a time). The animation may move at a constant rate as the control is being applied or with varying speed dependent upon the user input (e.g., to match the position and/or speed of the user input). Alternatively, the control circuit may be configured to illuminate the light bar 284 (e.g., in a manner similar to the indication of an absolute power level described above) to indicate an average of the power levels at a plurality of electrical loads.

FIGS. 4C and 4D depict examples of additional user inputs (e.g., such as gestures) that may be recognized by the control device 280 and translated into control data (e.g., a control signal) for controlling an electrical load. The user inputs may be applied via the touch sensitive surface 282 of the control device 280 with or without physically contacting the surface. As shown in FIG. 4C, for example, the user input may be an upward "swipe" gesture, as described herein. The gesture may be detected by the capacitive touch circuit, which may cause a signal to be transmitted to the control circuit of the control device 280 to indicate the detection. For example, the signal may indicate to the control circuit that the user input has the characteristics of an upward "swipe." The control circuit may interpret the signal based on the characteristics reflected therein, and generate corresponding control data (e.g., a control signal) to control an electrical load controlled by the control device 280.

Similarly, as shown in FIG. 4D, the user input may be a downward "swipe" gesture. The gesture be detected by the capacitive touch circuit, which may cause a signal to be transmitted to the control circuit of the control device 280. The signal may indicate, for example, that the user input has the characteristics of a downward "swipe." The control circuit may interpret the signal based on the characteristics reflected therein, and generate corresponding control data (e.g., a control signal) to control an electrical load controlled by the control device 280.

Although FIGS. 4C and 4D depict upward and downward swipes, it should be appreciated that a swipe gesture can be applied in other directions and/or manners. For example, a swipe may be applied in a horizontal direction in either a left-to-right or right-to-left direction, or diagonally from one area of the touch sensitive surface 280 to another. The scope of the disclosure herein with respect to a "swipe" is not limited to any particular manner in which the swipe is applied.

The control circuit may be configured to interpret a user input corresponding to a "swipe" gesture as a command for an associated electrical load to enter a particular state. Such a particular state may be predetermined, and may correspond to, for example, an on/off state of the electrical load, a specific power level of the electrical load (e.g., a desired intensity level of a lighting load), a particular setting of the electrical load (e.g., a temperature setting of an HVAC system), and/or the like. For example, upon receiving a signal indicative of a "swipe" gesture in an upward direction, the control circuit may be configured to generate control data (e.g., a control signal) to cause a lighting load to go to a full intensity dimming level (e.g., a high-end intensity). And upon receiving a signal indicative of a "swipe" gesture in a downward direction, the control circuit may be configured to generate control data (e.g., a control signal) to cause a lighting load to go to a minimal dimming level (e.g., a low-end intensity, such as 1% or off).

The control circuit may be configured to interpret a signal corresponding to a "swipe" gesture as a command to switch the control device 280 into a specific operational mode. Such an operational mode may be, for example, an intensity control mode or a color control mode for a lighting load, a preset selection mode, an absolute or relative power control mode, and/or the like. For example, the control device 280 may be configured to, by default, operate in an intensity control mode. Upon receiving a signal indicative of a "swipe" gesture in a right-to-left direction, the control circuit may be configured to switch the control device 280 from the intensity control mode to a color control mode.

The control device 280 may be configured to provide a visual indication in response to detecting the user inputs depicted in FIGS. 4C and 4D. For example, if the control circuit is configured to put an associated electrical load into a particular state in response to detecting a "swipe" gesture, the control circuit may be further configured to illuminate the light bar 284 to indicate the particular state. For instance, upon controlling a lighting load to go to a full intensity dimming level (e.g., a high-end intensity) or a minimal dimming level (e.g., a low-end intensity, such as 1% or off), the control circuit may illuminate the light bar 284 to indicate the respective dimming levels, as described above.

Relevant features described herein with reference to FIGS. 4C and 4D may be applicable to other types of user inputs. For example, the touch sensitive surface 282 may be configured to be responsive to a "tap" or "poke" applied at a specific location of the touch sensitive surface. Such a "tap" or "poke" may, for example, be characterized by a touch-and-release, as described herein. The control circuit may be configured to interpret such a user input as a command for an associated electrical load to go to a desired power level, such as a command for a lighting load to go to a desired dimming level. The desired power level may be dependent upon a location on the touch sensitive surface 280 at which the "tap" or "poke" is detected (e.g., such as a position along the light bar 284). The control circuit may generate control data (e.g., a control signal) to cause the command to be executed.

The touch sensitive surface 282 may be configured to be responsive to a "smack" gesture. Such a "smack" gesture may, for example, be characterized by contacts with the touch sensitive surface 282 at multiple locations within a predetermined time window (e.g., indicative of multiple fingers contact the surface simultaneously, palm of a hand contacting the surface, etc.). The contacts may be determined to occur in a larger area of the touch sensitive surface 282 than that associated with a "tap" or "poke," which may be effectuated by a single finger. The control circuit may be configured to interpret such a gesture as a command to toggle a state of an associated electrical load, for example from on to off or from off to on. In an example, the control circuit may be configured to, upon toggling an associated electrical load on in response to a "smack" gesture, put the associated electrical load into a last-known state (e.g., a state before the associated electrical load was turned off). Alternatively or additionally, the control circuit may be configured to interpret a "smack" gesture as a command for an associated electrical load to enter a predetermined state, including, for example, a particular power state of the electrical load (e.g., a desired intensity level of a lighting load), a particular setting of the electrical load (e.g., a temperature setting of an HVAC system), and/or the like.

The control device 280 may be used to control the color of light emitted by a lighting load. To facilitate a color control operation, the control device 280 may be configured to provide one or more visual indications on a front surface of the control device to assist with the color control operation. Such visual indications may be provided, for example, on the touch sensitive surface 282 of the control device 280. The visual indications may include a color gradient and/or one or more backlit virtual buttons that may be used to adjust a color setting of the lighting load.

FIG. 4E depicts an example of a color gradient that may be provided on the control device 280 to facilitate a color control operation. A color gradient, as described herein, may refer to any visual representation of a set of colors arranged in accordance to an order. The number of colors and the order in which those colors are arranged may vary from one implementation to the next, and should not limit the scope of this disclosure. Further, in the example shown in FIG. 4E, a color gradient is provided on the light bar 284 that extends through the touch sensitive surface 282 of the control device 280. It should be appreciated, however, that the presentation of such a color gradient is not limited to any particular location, and does not need to be in a bar shape. Further, it should be noted that the color gradient may be applied to the colors associated with the color temperatures of a black body radiator.

The control device 280 (e.g., a control circuit of the control device 280) may be configured to present the color gradient in response to a user input. The user input may be, for example, a gesture applied to the touch sensitive surface 280 of the control device 280 (e.g., a "swipe" or "smack" gesture). The control circuit may be configured to be responsive to such gestures and illuminate the light bar 284 to present the color gradient in response. Alternatively or additionally, the user input may be a gesture effectuated without any physical contact with the control device 280. For example, the capacitive touch circuit of the control device 280 may be configured to detect a finger or hand hovering over the touch sensitive surface 282, and transmit a signal to the control circuit indicating such detection (e.g., the detection may more generally indicate proximity of a user to the control device 280). The control circuit may, in response to receiving the signal, illuminate the light bar 284 to present the color gradient.

The control circuit may be configured to present the color gradient in different ways. In an example, the control circuit may illuminate the light bar 284 with different colors each centering in a portion of the light bar 284 and gradually transitioning into the color of a neighboring portion. The different colors may be arranged in an order reflective of the respective red/green/blue (RGB) values of the colors, for example. Each of the colors displayed on the light bar 284 (e.g., the location of the corresponding color) may correspond to a desired color for one or more lighting loads controlled by the control device 280. The relationship between desired light colors for the lighting loads and positions along the color gradient (e.g., the respective locations of the colors on the light bar 284) may be stored, for example, in a memory of the control device 280.

To select a color for the one or more lighting loads, a user of the control device 280 may manipulate an area of the touch sensitive surface 282 adjacent to one of the colors displayed on the light bar 284 to cause an actuation of the capacitive touch circuit. The actuation may be, for example, a point actuation (e.g., a "tap" or "poke"). The capacitive touch circuit may be configured to detect the actuation, and transmit a signal to the control circuit indicating the actuation (e.g., indicating the location of the actuation). Upon receiving the signal, the control circuit may determine a color corresponding to the location of the actuation, and generate control data (e.g., a control signal) to set a color of the one or more lighting loads to the determined color. For instance, the control circuit may be capable of identifying which color of the gradient displayed on the light bar 284 is adjacent to the location of actuation, and set the color of the lighting loads to the identified color. This way, as a user slides a finger along the light bar 284, the color of the lighting loads may be adjusted accordingly based on the position of the finger along the length of the light bar 284.

The control circuit may be configured to assign a color to multiple lighting loads (e.g., in a zone controlled by the control device 280) in response to a single "tap" along the color gradient. Alternatively, the control circuit may be configured to assign a color for one lighting load in the zone of control in response to each "tap," and assign the color to additional lighting loads in the zone of control in response to additional "taps" by a user. Further, the control circuit may be configured to, in response to a first "tap" by a user, associate a first color to one or more lighting loads, and, in response to a second "tap" by a user, associate a second color to the one or more lighting loads. The control circuit may be further configured to cause the one or more lighting loads to dynamically switch between the first and second associated colors (e.g., at a predetermine rate or in accordance with an external condition).

A user may manipulate the touch sensitive surface 282 to change the color gradient displayed on the light bar 284. For example, the control circuit may initially illuminate the light bar 284 into a first set of colors (e.g., to present a first color gradient on the light bar 284). Each of the first set of colors may represent a section of the visible color spectrum that corresponds to a specific wavelength range. A user may manipulate an area of the touch sensitive surface 282 adjacent to one of the first set of colors to cause an actuation of the capacitive touch circuit. The actuation may be, for example, a two-finger "open" gesture (e.g., fingers moving apart) or a force (e.g., via a finger press) applied next to one of the first set of colors. The capacitive touch circuit may be configured to detect the actuation, and transmit a signal to the control circuit indicating the actuation. The control circuit may determine, based on the signal, a section of the color spectrum that corresponds to the location of the actuation, and control the one or more light sources to illuminate the light bar so that the first set of colors is replaced with a second set of colors (e.g., to present a second color gradient on the light bar 284). The second set of colors may correspond to colors that are within the section of the color spectrum associated with the location of the actuation (e.g., the second color gradient may represents a smaller range of the first color gradient). A user may then set a color for one or more lighting loads controlled by the control device 280 by actuating an area of the touch sensitive surface 282 next to one of the second set of colors, as described above.

While the second set of colors (e.g., the second color gradient) is displayed on the light bar 284, the control circuit may be configured to change the display to revert to the first set of colors (e.g., the first color gradient) in response to a user input. For example, the control circuit may receive a signal indicating that of a two-finger "pinch" gesture (e.g., fingers moving together) or a force (e.g., applied via a finger press) is detected by the touch sensitive surface 282 in an area adjacent to the second color gradient. The control circuit may interpret such a signal as a command to switch the display on the light bar 284 back to the first color gradient, and may control the light bar 284 to effectuate the switch accordingly.

FIG. 4F depicts an example of another mechanism for adjusting a color (e.g., color temperature) of one or more lighting loads controlled by the control device 280. Although described with reference to color temperature control, it should be appreciated that the mechanism and user control described with reference to FIG. 4F may also be applied to full range color control. As shown, areas of the outer surface 244 may be backlit to display soft or virtual buttons 290a, 290b, and/or indicator lights 292. The virtual buttons 290a, 290b and/or indicator lights 292 may be configured to be backlit by the light bar 284. The control circuit may be configured to dim the backlighting (e.g., turn off the backlighting or make it not easily perceivable by a user) when the control device 280 is in a different operational mode or in an idle state so that a first user interface may be presented to a user of the control device 280. The control circuit may then illuminate the backlighting to reveal the virtual buttons 290a, 290b and/or the indicator lights 292 in response to a user input or a particular event (e.g., a predetermined timing event) so that a second user interface may be presented to the user. Alternatively, the control circuit may be configured to maintain the backlighting in an "on" state so that the virtual buttons are always shown on the control device 280.

The user input that may trigger the display of the virtual buttons 290a, 290b and/or the indicator lights 292 may be, for example, a gesture applied to the touch sensitive surface 282 of the control device 280 (e.g., a "swipe" or "smack" gesture). As described herein, such a gesture may trigger to the control circuit to change the control device 280 into a color control mode. Alternatively or additionally, the user input may be a gesture effectuated without any physical contact with the control device 280. For example, the capacitive touch circuit of the control device 280 may be configured to be responsive to a finger or hand hovering over the touch sensitive surface 282, and transmit a signal to the control circuit to indicate such detection (e.g., the detection may more generally indicate proximity of a user to the control device 280). The control circuit may, in response to receiving the signal, activate the backlighting to reveal the virtual buttons 290a, 290b and/or the indicator lights 292.

The areas of the touch sensitive surface 282 that correspond to the virtual buttons 290a, 290b may be associated with adjusting (e.g., increasing and decreasing) the color temperature of one or more lighting loads controlled by the control device 280. For example, a user may make contact with the area of the touch sensitive surface 282 occupied by virtual button 290a to cause an actuation of the capacitive touch circuit. The actuation may be, for example, a point actuation (e.g., a "tap" or "poke"). In response to the actuation, a signal may be transmitted to the control circuit indicating that virtual button 290a has been actuated. The control circuit may interpret the actuation as a command to increase the color temperature of the lighting loads, and generate control data (e.g., a control signal) to effectuate the increase accordingly. The increase may be, for example, a gradual increase (e.g., by a predetermined amount at each step) while the actuation (e.g., a press-and-hold) lasts, or a one-time increase (e.g., by a predetermined amount) in response to the actuation (e.g., a "tap").

Similarly, the capacitive touch circuit may be configured to detect that the area of the touch sensitive surface 282 occupied by the virtual buttons 290b has been actuated. The actuation may be, for example, a point actuation (e.g., a "tap" or "poke"). The capacitive touch circuit may detect the actuation, and a signal may be transmitted to the control circuit indicating that the actuation has occurred. The control circuit may be configured to interpret the actuation as a command to decrease the color temperature of the lighting loads, and generate control data (e.g., a control signal) to effectuate the decrease accordingly. The decrease may be, for example, a gradual decrease (e.g., by a predetermined amount at each step) while the actuation (e.g., a press-and-hold) lasts, or a one-time decrease (e.g., by a predetermined amount) in response to the actuation (e.g., a "tap").

The control circuit of the control device 280 may be configured to illuminate the indicator lights 292 to provide feedback about color temperature adjustments in response to the virtual buttons 290a, 290b being actuated. For example, as the user actuates the virtual button 90a, the indicator lights 292 may be turn on one after another from bottom up to signal that the color temperature of the lighting load is being increased. As the user actuates the virtual button 290b, the indicator lights 292 may be turned off one after another from top to bottom to signal that the color temperature of the lighting load is being decreased.

The control circuit of the control device 280 may be further configured to illuminate the light bar 284 to indicate a current color temperature of the one or more lighting loads controlled by the control device 280. For example, the control circuit may illuminate a selected number of light sources to cause the light bar 284 to be illuminated to different intensities and/or lengths in proportion to a current color temperature of the one or more lighting loads. For instance, the light bar 284 may be illuminated to a higher intensity and/or a greater length in response to a higher color temperature.

The control device 280 may be used to activate a preset, zone, or an operational mode associated with one or more electrical loads. A preset may correspond to one or more predetermined settings of the one or more electrical loads. The electrical loads may be located at a specific location (e.g., a living room) or across multiple locations (e.g., different rooms of a house). For example, a preset may correspond to a preconfigured lighting scene (e.g., predetermined intensity/color settings of one or more lighting loads), a preconfigured combination of entertainment settings (e.g., music selection, volume of speakers, etc.), a preconfigured combination of environmental settings (e.g., temperature, humidity, shades, etc.), and/or any combination thereof. Such presets may be configured via the control device 280 and/or via an external device (e.g., a mobile device) by way of a wireless communication circuit of the control device 280. A zone may correspond to one or more electrical loads that are configured to be controlled by the control device 380. A zone may be associated with one specific location (e.g., a living room) or multiple locations (e.g., an entire house with multiple rooms and hallways). An operational mode of the control device 380 may be associated with controlling different types of electrical loads or different operational aspects of one or more electrical loads. Examples of operational modes may include a lighting control mode for controlling one or more lighting loads (e.g., controlling intensity and/or color of the lighting loads), an entertainment system control mode (e.g., controlling music selection and/or the volume of an audio system), an HVAC system control mode, a winter treatment device control mode (e.g., for controlling one or more shades), and/or the like. Once configured, the presets, zones, or operational modes may be stored by the control device 280 in memory.

Figure 4H:
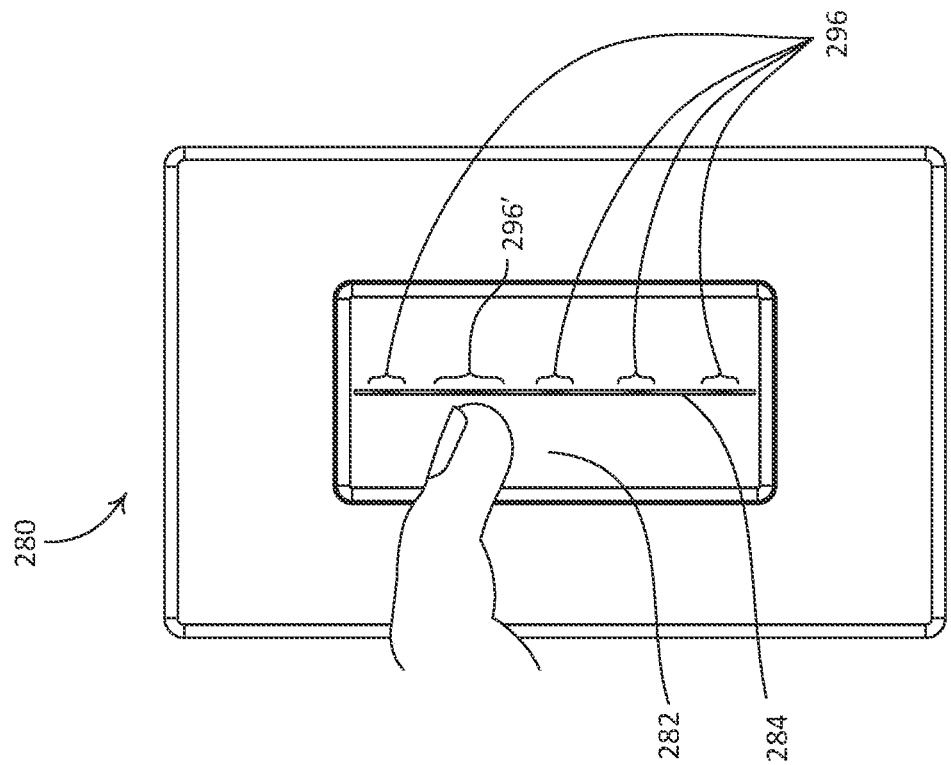
FIG. 4H depicts an example of preset selection using a light bar located on the example control device illustrated in FIG. 4A.
Figure 4G:
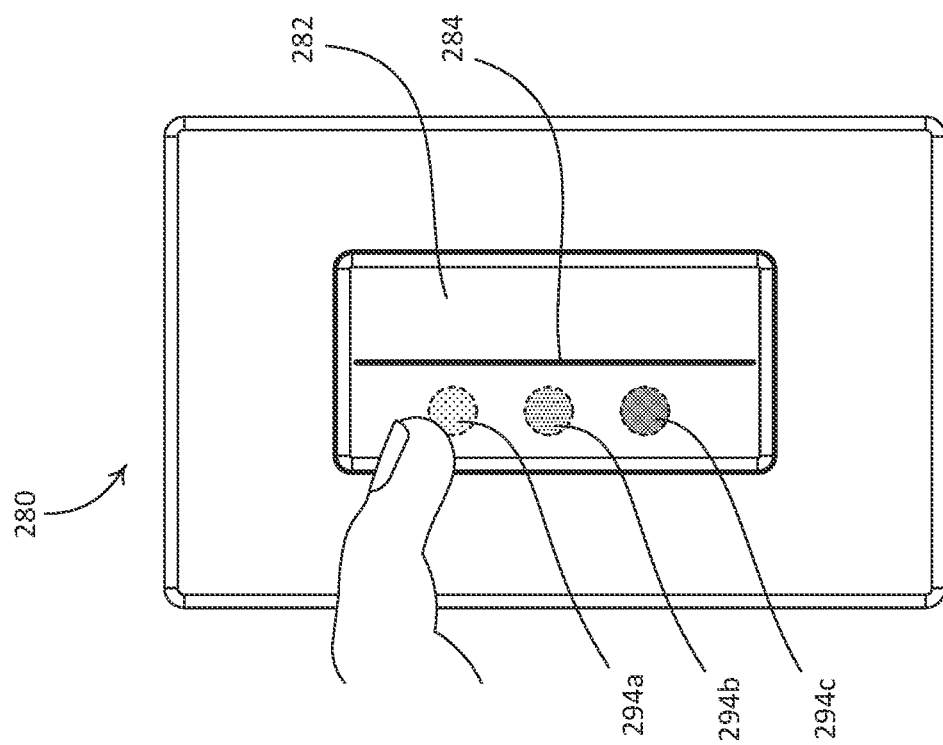
FIG. 4G depicts an example of preset selection using backlit virtual buttons located on the example control device illustrated in FIG. 4A.

FIG. 4G depicts an example of a user interface that may be provided on the touch sensitive surface 282 of the control device 280 to facilitate preset, zone, and/or operational mode selection. As shown, areas of the touch sensitive surface may be illuminated (e.g., backlit) to display soft or virtual buttons 294a, 294b, 294c. The illuminated areas may have different shapes, such as, for example, circles, squares, rectangles, etc. The illuminated areas may be backlit with different intensities or colors that represent the preset, zone, or operational mode to be selected (e.g., an average intensity of an intensity preset or a dominant color of a color preset). The areas may be thinned out compared to the rest of the touch sensitive surface to allow backlighting to emit through the thinned-out areas. The areas may be associated with respective indicia (e.g., texts or graphics) that indicate the purposes of the virtual buttons 294a-294c. Backlighting may be provided, for example, by light sources (e.g., LEDs) of the control device 280. The control circuit may be configured to dim the backlighting (e.g., turn off the backlighting or make it not easily perceivable by a user) when the control device 280 is in a different operational mode or in an idle state so that a first user interface may be presented to a user of the control device 280. The control circuit may illuminate the backlighting to reveal the virtual buttons 294a-294c in response to a user input or a particular event (e.g., a predetermined timing event) so that a second user interface may be presented to the user. Alternatively, the control circuit of the control device 180 may be configured to maintain the backlighting in an "on" state so that the virtual buttons are always shown on the control device 280.

The user input that may trigger the display of the virtual buttons 294a-294c may be, for example, a gesture applied to the touch sensitive surface 282 of the control device 280 (e.g., a "swipe" or "smack" gesture). Such a gesture may be detected by the capacitive touch circuit, which may transmit a signal to the control circuit to indicate the detection. The control circuit may, in response to receiving the signal, activate the backlighting to reveal the virtual buttons 294a, 294b, 294c. Alternatively or additionally, the user input may be a gesture effectuated without any physical contact with the control device 280. For example, the capacitive touch circuit of the control device 280 may be configured to be responsive to a finger or hand hovering over the touch sensitive surface 280, and transmit a signal to the control circuit to indicate such detection (e.g., the detection may more generally indicate proximity of a user to the control device 280). The control circuit may, in response to receiving the signal, activate the backlighting to reveal the virtual buttons 294a, 294b, 294c.

The areas of the touch sensitive surface 282 that correspond to the virtual buttons 294a-294c may be designated for activating respective presets, zones, or operational modes associated with one or more electrical loads controlled by the control device 280. The association between the virtual buttons 294a-294c (e.g., locations of the virtual buttons 294a-294c) and the presets, zones, or operational modes may be stored, for example, in a memory of the control device 280. To illustrate, a user of the control device 280 may make contact with the area of the touch sensitive surface 282 occupied by virtual button 294a to cause an actuation of the capacitive touch circuit. The actuation may be, for example, a point actuation (e.g., a "tap" or "poke"). In response to the actuation, the capacitive touch circuit may transmit a signal to the control circuit indicating that virtual button 294a has been actuated. The control circuit may interpret the actuation as a command to activate a first preset (e.g., a first lighting scene), a first zone (e.g., which may include one or more electrical loads at a specific location such as a room or an entire house), or a first operational mode (e.g., a lighting control mode, a window treatment control mode, an HVAC control mode, etc.), and generate control data (e.g., a control signal) to effectuate the activation accordingly.

Similarly, the capacitive touch circuit may be configured to detect that the area of the touch sensitive surface 282 occupied by virtual button 294b (or 294c) has been actuated by, for example, a point actuation (e.g., a "tap" or "poke"). In response to the actuation, the capacitive touch circuit may transmit a signal to the control circuit indicating that virtual button 294b (or 294c) has been actuated. The control circuit may interpret the actuation as a command to activate a second preset (e.g., an entertainment scene), a second zone, or a second operational mode if the actuated button is virtual button 294b, or to activate a third preset (e.g., a second lighting scene), a third zone, or a third operational mode if the actuated button is virtual button 294c. The control circuit may generate control data (e.g., a control signal) to effectuate either activation accordingly.

The control circuit may be further configured to provide an indication about which preset, zone, or operational mode has been activated. For example, the control circuit may illuminate the light bar 284 in different manners (e.g., with varying intensity and/or color) corresponding to different presets, zones, or operational mode being activated. Alternatively or additionally, the control circuit may uniquely illuminate the virtual button associated with an activated preset, zone, or operational mode (e.g., to cause the virtual button to flash) to inform the user of the activated preset, zone, or operational mode.

A user may use a gesture to cycle through a plurality of presets, zones, or operational modes on the touch sensitive surface 282 of the control device 280. For example, there may be more presets, zones, or operational modes configured in a load control system than what can be displayed on the touch sensitive surface 282 of the control device 280. In those scenarios, a user may apply a gesture (e.g., a "swipe") via the touch sensitive surface 282, and the control circuit may be configured to, in response to the gesture, replace a first set of presets, zones, or operational modes that may be activated via the virtual buttons 294a-294c with a second set. This way, the user may be able to cycle through all available presets, zones, or operational modes to choose one that meets the user's needs. The control circuit may be further configured to change the indicia associated with the virtual buttons 294a-294c to indicate currently associated presets, zones, or operational modes.

FIG. 4H depicts another example of a user interface that may be provided on the touch sensitive surface 282 of the control device 280 to facilitate preset, zone, and operational selections. As shown, the control circuit of the control device 280 may illuminate the light bar 284 to display discrete points 296 of illumination. For example, the discrete points 296 may correspond to different segments of the light bar 284 illuminated to different intensities and/or colors, or segments of the light bar 284 that may be illuminated to a same intensity and/or color but separated by segments of different intensities and/or colors. Each of the discrete points 296 (e.g., the location of each discrete point) may correspond to a preset associated with one or more electrical loads controlled by the control device 280, a zone including one or more electrical loads, or an operational mode associated with controlling one or more electrical loads. The illumination of the discrete points 296 may be based on their respective associated presets, zones, or operational modes. For example, when a discrete point is associated with a preset that corresponds to a lighting scene, the corresponding discrete point on the light bar 284 may be illuminated to display the dominant color of the lighting scene. Alternatively, the illumination of the corresponding discrete point on the light bar 284 may be periodically altered (e.g., at a predetermined rate) to display each light color of the lighting scene (e.g., to cycle through the colors of the lighting loads in the lighting scene). The relationship between the presets, zones, or operational modes and the discrete points 296 of the light bar 284 (e.g., the respective locations of the illuminated segments) may be stored, for example, in a memory of the control device 280. The control circuit of the control device 280 may be configured to keep the light bar 284 illuminated in the aforementioned manner. Alternatively, the control circuit may be configured to dim the light bar 284 (e.g., turn off the illumination or make it not easily perceivable by a user) when the control device 280 is in a different operational mode or in an idle state, and illuminate the light bar 284 to reveal the multiple discrete points 296 in response to a user input or a particular event (e.g., a predetermined timing event).

The user input that may trigger the display of the discrete points 296 on the light bar 284 may be, for example, a gesture applied to the touch sensitive surface 282 of the control device 280 (e.g., a "swipe" or "smack" gesture). Alternatively or additionally, the user input may be a gesture effectuated without any physical contact with the control device 280. For example, the capacitive touch circuit of the control device 280 may be configured to be responsive to a finger or hand hovering over the touch sensitive surface 282, and transmit a signal to the control circuit to indicate such detection (e.g., the detection may more generally indicate proximity of a user to the control device 280). The control circuit may, in response to receiving the signal, illuminate the light bar 284 to display the multiple discrete points 296 for preset, zone, or operational mode selection.

To activate a specific preset, zone, or operational mode, a user may manipulate an area of the touch sensitive surface 282 adjacent to one of the multiple discrete points 296 of the light bar 284 to cause an actuation of the capacitive touch circuit. The actuation may be, for example, a point actuation (e.g., a "tap" or "poke"). The capacitive touch circuit may be configured to detect the actuation, and transmit a signal to the control circuit indicating the actuation. Upon receiving the signal, the control circuit may determine a location of the actuation, and generate control data (e.g., a control signal) to activate the preset, zone, or operational mode associated with the determined location (e.g., based on the stored relationship described above).

The control circuit may be further configured to provide an indication of which preset, zone, or operational mode has been activated. For example, once a user has activated a preset, zone, or operational mode, the control circuit may uniquely illuminate one of the discrete points 296 of the light bar 284 corresponding to the activated preset, zone, or operational mode (e.g., the discrete points 296'). The unique illumination may be realized, for example, by flashing the relevant discrete point or illuminating the discrete point with a higher intensity so that it is highlighted relative to the other discrete points.

In addition to or in lieu of the user interfaces described with reference to FIGS. 4G and 4H, the control device 280 may be configured to associate particular user gestures with presets, zones, or operational modes, and generate control data (e.g., a control signal) to activate a preset, zone, or operational mode in response to detecting an associated gesture. The gestures may be applied via the capacitive touch circuit of the control device 280. The gestures may be applied by direct contact with the touch sensitive surface 282 of the control device 280 (e.g., a "swipe," a "smack," etc.), via proximity of anatomy to the touch sensitive surface 282 (e.g., by hovering a finger over the touch sensitive surface 282), or otherwise. The association of user gestures with presets, zones, or operational modes may be user-programmable and reprogrammable. The association may be stored, for example, in a memory of the control device 280. The capacitive touch circuit may be configured to detect a gesture, and transmit a signal to a control circuit of the control device 280 indicating the detection of the gesture. The control circuit may, in response, identify a preset, zone, or operational mode associated with the gesture, and generate control data (e.g., a control signal) to activate the preset, zone, or operational mode.

Although described as separate mechanisms and user inputs in FIG. 4A-H, it should be appreciated that the control device 280 may incorporate any number and/or combinations of the mechanisms and user inputs described with reference to FIG. 4A-H.

Figure 5:
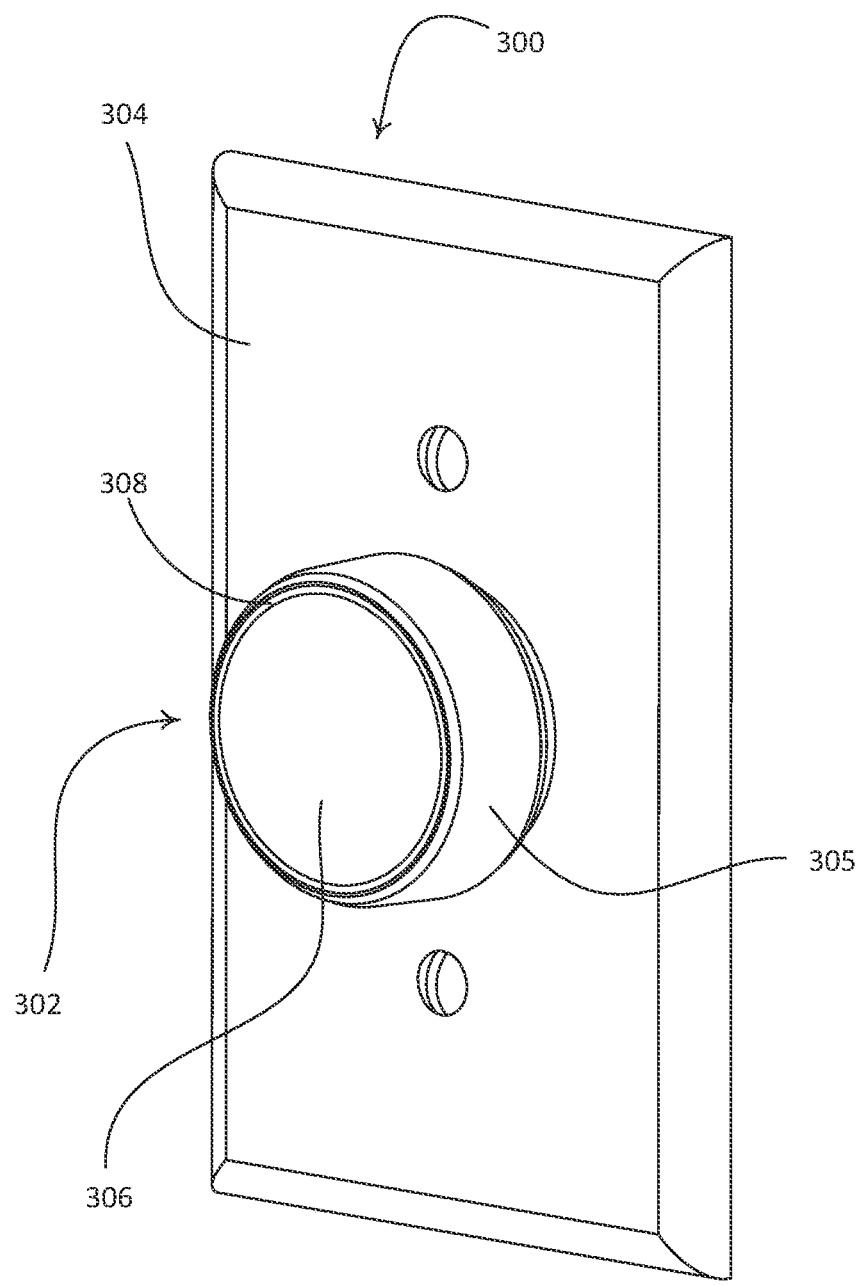
FIG. 5 is a perspective view of another example control device that may be deployed as a dimmer switch and/or a remote control device of the load control system illustrated in FIG. 1.

FIG. 5 depicts another example control device 300 that may be deployed as the dimmer switch 110 and/or the retrofit remote control device 112 in the lighting control system 100. The lighting control system 100 may include one or more lighting loads, such as the lighting loads 102, 104. The control device 300 may comprise a user interface 302 and a faceplate 304. The user interface 302 may include a rotating portion 305 that is rotatable with respect to the faceplate 304 for adjusting the amount of power delivered to the lighting loads controlled by the control device. The user interface 302 may also include an actuation portion 306 that may be pressed in towards the faceplate 304 for turning the lighting loads on and off (e.g., toggling the lighting loads). More generally, the control device 300 may be responsive to a dynamic motion of the actuation portion 306 (e.g., an actuation that causes movement of the surface of the actuation portion). At least a portion of the surface of the actuation portion 306 may be a touch sensitive surface configured to received (e.g., detect) point actuations and/or gestures. More generally, the control device 300 may be responsive to a static operation of the actuation portion 306 (e.g., an actuation that does not cause movement of the surface of the actuation portion). The user interface 302 may also include a light bar 308 configured to be illuminated by one or more light sources (e.g., one or more LEDs) to visibly display information.

FIGS. 6A and 6B are front and rear exploded perspective views of another example remote control device 310 that may be deployed as the retrofit remote control device 112 in the lighting control system 100 shown in FIG. 1 and/or the control device 300 shown in FIG. 5. The remote control device 310 may be configured to be mounted over an actuator of a standard light switch 312 (e.g., a toggle actuator of a single pole single throw (SPST) maintained mechanical switch). The remote control device 310 may be installed over of an existing faceplate 316 that is mounted to the light switch 312 (e.g., via faceplate screws 318). The remote control device 310 may include a base portion 320 and a control module 330 that may be operably coupled to the base portion 320. The control module 330 may be supported by the base portion 310 and may include a rotating portion 332 (e.g., an annular rotating portion) that is rotatable with respect to the base portion 320.

As shown in FIG. 6A, the control module 330 may be detached from the base portion 320. The base portion 320 may be attached (e.g., fixedly attached) to a toggle actuator 314 and may be configured to maintain the toggle actuator 314 in the on position. The toggle actuator 314 may be received through a toggle actuator opening 322 in the base portion 320. A screw 324 may be tightened to attach (e.g., fixedly attached) the base portion 320 to the toggle actuator 314. In this regard, the base portion 320 may be configured to prevent a user from inadvertently switching the toggle actuator 314 to the off position when the remote control device 310 is attached to the light switch 312.

The control module 330 may be released from the base portion 320. For example, a control module release tab 326 may be provided on the base portion 320. By actuating the control module release tab 326 (e.g., pushing up towards the base portion or pulling down away from the base portion), a user may remove the control module 330 from the base portion 320.

The control module 330 may comprise one or more clips 338 that may be retained by respective locking members 328 connected to the control module release tab 326 when the base portion 320 is in a locked position. The one or more clips 338 may be released from the respective locking members 328 of the base portion 320 when the control module release tab 326 is actuated (e.g., pushed up towards the base portion or pulled down away from the base portion) to put the base portion 320 in an unlocked position. In an example, the locking members 328 may be spring biased into the locked position and may automatically return to the locked position after the control module release tab 326 is actuated and released. In an example, the locking members 328 may not be spring biased, in which case the control module release tab 326 may be actuated to return the base portion 320 to the locked position.

The control module 330 may be installed on the base portion 320 without adjusting the base portion 320 to the unlocked position. For example, the one or more clips 338 of the control module 330 may be configured to flex around the respective locking members 328 of the base portion and snap into place, such that the control module is fixedly attached to the base portion.

The control module 330 may be released from the base portion 320 to access one or more batteries 340 (e.g., as shown in FIG. 6B) that provides power to at least the remote control device 310. The batteries 340 may be held in place in various ways. For example, the batteries 340 may be held by a battery retention strap 342, which may also operate as an electrical contact for the batteries. The battery retention strap 342 may be loosened by untightening a battery retention screw 344 to allow the batteries 340 to be removed and replaced. Although FIG. 6B depicts the batteries 340 as being located in the control module 330, it should be appreciated that the batteries 340 may be placed elsewhere in the remote control device 310 (e.g., in the base portion 320) without affecting the functionality of the remote control device 310.

When the control module 330 is coupled to the base portion 320 as shown in FIG. 5, the rotating portion 332 may be rotatable in opposed directions about the base portion 320 (e.g., in the clockwise or counter-clockwise directions). The base portion 320 may be configured to be mounted over the toggle actuator 314 of the switch 312 such that the rotational movement of the rotating portion 332 may not change the operational state of the toggle actuator 314 (e.g., the toggle actuator 314 may remain in the on position to maintain functionality of the remote control device 310).

The control module 330 may comprise an actuation portion 334. The actuation portion 334 may in turn comprise a part or an entirety of a front surface of the control module 330. For example, the control module 330 may have a circular surface within an opening defined by the rotating portion 332. The actuation portion 334 may comprise a part of the circular surface (e.g., a central area of the circular surface) or approximately the entire circular surface. In an example, the actuation portion 334 may be configured to move towards the light switch 312 to actuate a mechanical switch (not shown) inside the control module 330 as will be described in greater detail below. The actuation portion 334 may return to an idle position (e.g., as shown in FIG. 5) after being actuated. In an example, the front surface of the actuation portion 334 may be a touch sensitive surface (e.g., a capacitive touch surface). The actuation portion 334 may comprise a touch sensitive element (e.g., a capacitive touch element such as the touch sensitive circuit 240) adjacent to the rear surface of the actuation portion. The touch sensitive element may be actuated in response to a touch of the touch sensitive surface of the actuation portion 334.

The remote control device 310 may be configured to transmit one or more wireless communication signals (e.g., the RF signals 108 of FIG. 1) to an electrical load (e.g., the lighting loads 102, 104 of the lighting control system 100 of FIG. 1). The remote control device 310 may include a wireless communication circuit (e.g., an RF transceiver or transmitter (not shown)) via which one or more wireless communication signals may be sent and/or received. The control module 330 may be configured to transmit digital messages (e.g., including commands to control the controllable electrical load) via the wireless communication signals. For example, the control module 330 may be configured to transmit a command to raise the intensity of a controllable lighting load in response to a clockwise rotation of the rotating portion 332 and to transmit a command to lower the intensity of the controllable light source in response to a counterclockwise rotation of the rotating portion 332.

The control module 330 may be configured to transmit a command to toggle an electrical load (e.g., from off to on or vice versa) in response to an actuation of the actuation portion 334. In addition, the control module 330 may be configured to transmit a command to turn an electrical load on in response to an actuation of the actuation portion 334 (e.g., if the control module 330 possesses information indicating that the electrical load is presently off). The control module 330 may be configured to transmit a command to turn an electrical load off in response to an actuation of the actuation portion 334 (e.g., if the control module possesses information indicating that the electrical load is presently on).

The control module 330 may be configured to transmit a command to turn an electrical load on to a maximum power level (e.g., to turn a light source on to full intensity) in response to a double tap of the actuation portion 334 (e.g., two actuations in quick succession). The control module 330 may be configured to adjust the power level of an electrical load to a minimum level (e.g., to turn the intensity of a lighting load to a minimum intensity) in response to rotation of the rotating portion 332 and may only turn off the electrical load in response to an actuation of the actuation portion 334. The control module 330 may also be configured in a spin-to-off mode, in which the control module 330 may turn off an electrical load after the power level of the electrical load (e.g., intensity of the lighting load) is controlled to a minimum level in response to a rotation of the rotating portion 332.

The control module 330 may be configured to transmit a command (e.g., via one or more wireless communication signals such as the RF signal 108) to adjust the color of a lighting load. Color control through the remote control device 310 will be described in greater detail below.

The control module 330 may comprise a light bar 336 that may be illuminated by one or light sources (e.g., LEDs), for example, to provide feedback to a user of the remoted control device 310. The light bar 336 may be located in different areas of the remote control device 310 in different implementations. For example, the light bar 336 may be located between the rotating portion 332 and the actuation portion 334. The light bar may have different shapes. For example, the light bar 336 may form a full circle (e.g., a substantially full circle) as shown in FIGS. 5 and 6A. The light bar 336 may be attached to a periphery of the actuation portion 334 and move with the actuation portion 334 (e.g., when the actuation portion is actuated). The light bar 336 may have a certain width (e.g., a same width along the entire length of the light bar). The exact value of the width may vary, for example, depending on the size of the remote control device 310 and/or the intensity of the light source(s) that illuminates the light bar 336.

Figure 6C:
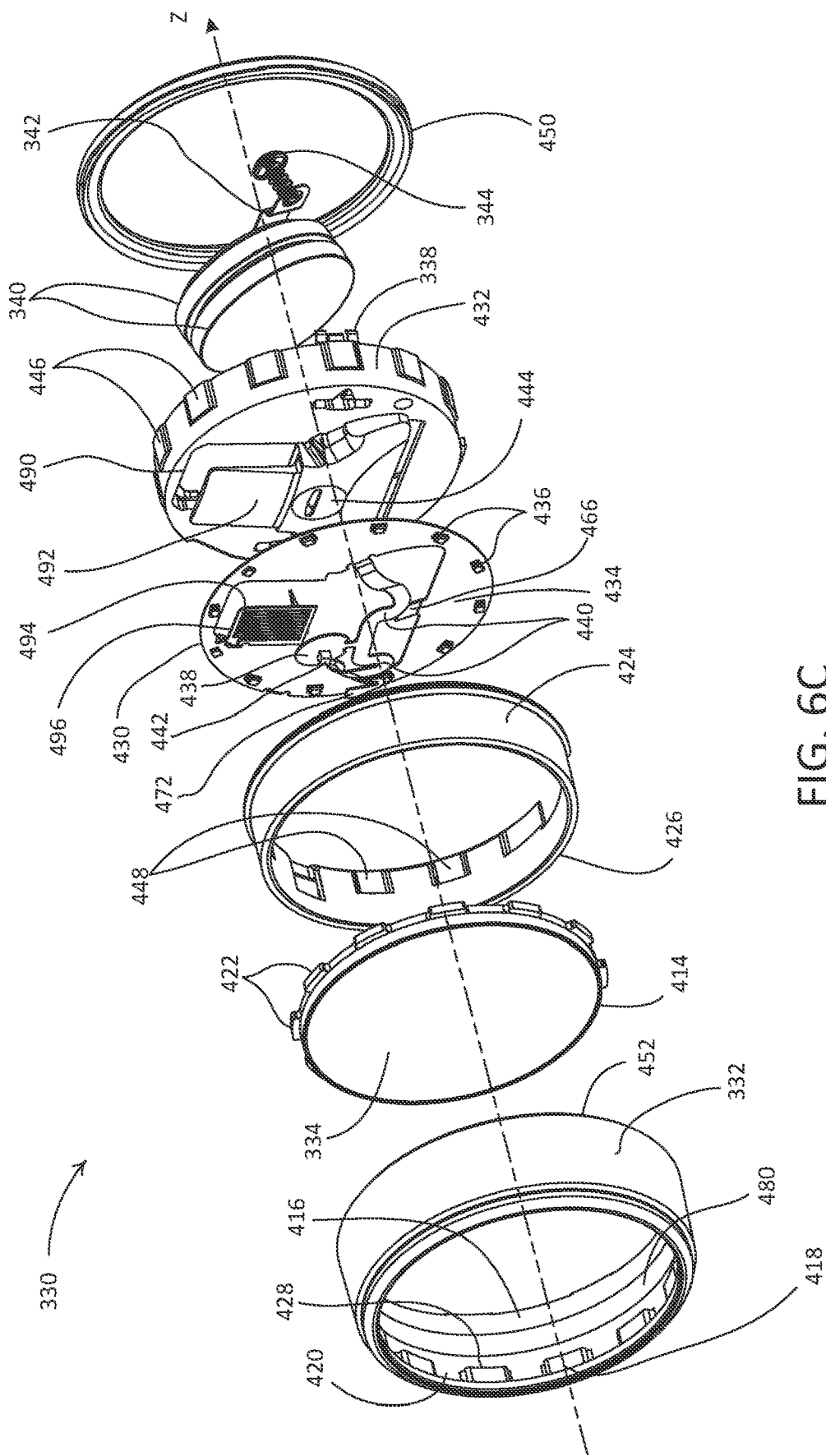
FIG. 6C is a front exploded view of the control module for the remote control device depicted in FIG. 6A.
Figure 6D:
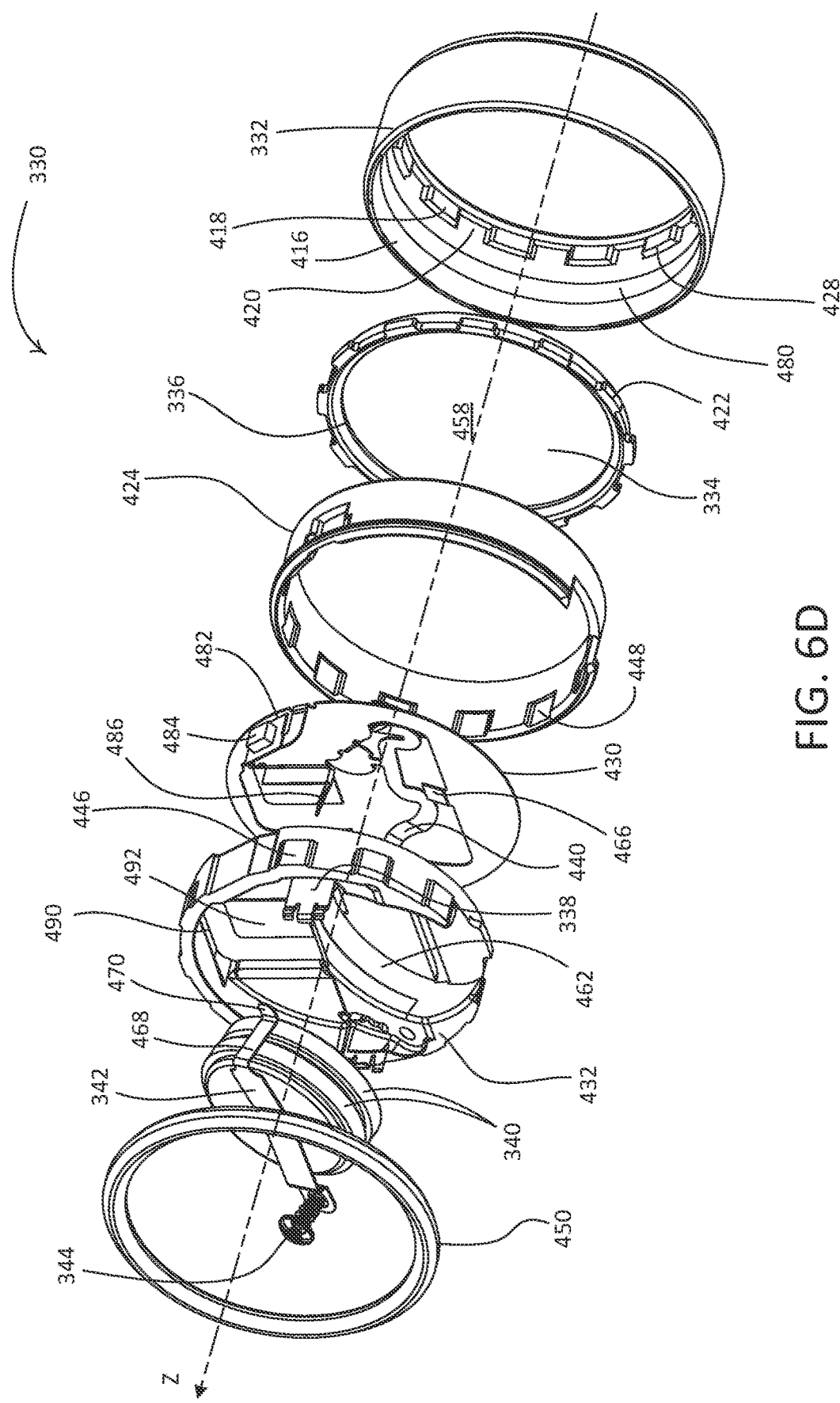
FIG. 6D shows a rear exploded view of the control module for the example remote control device depicted in FIG. 6C.

FIG. 6C is a front exploded view and FIG. 6D is a rear exploded view of the control module 330 of the remote control device 310. The actuation portion 334 may be received within an opening defined by the rotating portion 332. The light bar 336 may be attached to the actuation portion 334 around a periphery of the actuation portion. The rotating portion 332 may comprise an inner surface 416 having tabs 418 surrounding the circumference of the rotation portion. The tabs 418 may be separated by notches 420 that are configured to receive engagement members 422 of the actuation portion 334 to thus engage the actuation portion 334 with the rotating portion 332. The control module 330 may also comprise a bushing 424 that is received within the rotating portion 332, such that an upper surface 426 of the busing may contact lower surfaces 428 of the tabs 418 inside of the rotating portion.

When the actuation portion 334 is received within the opening of the rotating portion 332, the light bar 336 may be provided between the actuation portion 334 and the rotating portion 332. When the rotating portion 334 is rotated, the actuation portion 334 and/or the light bar 336 may rotate with the rotating portion. The engagement members 422 of the actuation portion 334 may be able to move through the notches 420 in a z-direction (e.g., towards the base portion), such that the actuation portion 334 (along with the light bar 336) may be able to move in the z-direction.

The control module 330 may further comprise a flexible printed circuit board (PCB) 430 that may be arranged over a carrier 432. The flexible PCB 430 may comprise a main portion 434 on which most of the control circuitry of the control module 330 (e.g., including a control circuit) may be mounted. The control module 330 may comprise a plurality of light-emitting diodes (LEDs) 436 arranged around the perimeter of the flexible PCB 430 to illuminating the light bar 336. The flexible PCB 430 may comprise a switch tab 438 that may be connected to the main portion 434 (e.g., via flexible arms 440). The switch tab 438 may have a mechanical tactile switch 442 mounted thereto. The switch tab 438 of the flexible PCB 430 may be configured to rest on a switch tab surface 444 on the carrier 432. The carrier 432 may comprise engagement members 446 configured to be received within notches 448 in the bushing 424. A ring 450 may snap to a lower surface 452 of the rotating portion to hold the control module 330 together. The clips 338 may be attached to the carrier 432 to allow the control module to be connected to the base portion.

When the actuation portion 334 is pressed, the actuation portion 334 may move along the z-direction until an inner surface 458 of the actuation member actuates the mechanical tactile switch 442. The actuation portion 334 may be returned to the idle position by the mechanical tactile switch 442. In addition, the control module 330 may comprise an additional return spring for returning the actuation portion 334 to the idle position. Actuations of the actuation portion 334 may not cause the actuation portion to move (e.g., the actuation portion 334 may substantially maintain its position along the z-direction). For example, the front surface of the actuation portion 334 may be a touch sensitive surface (e.g., a capacitive touch surface) configured to detect a user input via a point actuation and/or a gesture.

The batteries 340 may be adapted to be received with in a battery recess 462 in the carrier 432 as shown in FIG. 6D. The batteries 340 may be held in place by the battery retention strap 342, which may also operate as a negative electrical contact for the batteries and tamper resistant fastener for the batteries. The flexible PCB may comprise a contact pad 466 that may operate as a positive electrical contact for the batteries 340. The battery retention strap 342 may comprise a leg 468 that ends in a foot 470 that may be electrically connected to a flexible pad 472 (e.g., as shown in FIG. 6C) on the flexible PCB 430. The battery retention strap 342 may be held in place by the battery retention screw 344 received in an opening 476 in the carrier 432. When the battery retention screw 344 is loosened and removed from the opening 476, the flexible pad 472 may be configured to move (e.g., bend or twist) to allow the battery retention strap 342 to move out of the way of the batteries 340 to allow the batteries to be removed and replaced.

The control module 330 may further comprise a magnetic strip 480 located on the inner surface 416 of the rotating portion 332 and extending around the circumference of the rotating portion. The flexible PCB 430 may comprise a rotational sensor pad 482 on which a rotational sensor (e.g., a Hall effect sensor integrated circuit 484) may be mounted. The rotational sensor pad 482 may be arranged perpendicular to the main portion 434 of the flexible PCB 430 as shown in FIG. 6D. The magnetic strip 480 may comprise a plurality of alternating positive and negative sections, and the Hall effect sensor integrated circuit 484 may comprise two sensor circuits operable to detect the passing of the positive and negative sections of the magnetic strip as the rotating portion 332 is rotated. Accordingly, the control circuit of the control module 330 may be configured to determine the rotational speed and direction of rotation of the rotation portion 332 in response to the Hall effect sensor integrated circuit 484. The flexible PCB 430 may also comprise a programming tab 486 to allow for programming of the control circuit of the control module 330.

As shown in FIG. 6D, the carrier 432 may comprise an actuator opening 490 adapted to receive the toggle actuator of the light switch when the control module 330 is mounted to the base portion. The carrier 432 may comprise a flat portion 492 that may prevent the toggle actuator of the light switch from extending into the inner structure of the control module 330 (e.g., if the toggle actuator is particularly long). The flexible PCB 430 may also comprise an antenna 494 on an antenna tab 496 that may lay against the flat portion 492 in the actuator opening 490.

The control module 320 may be configured to translate a user input, such as a point actuation (e.g., a "tap") or a gesture (e.g., such as a "swipe," a "smack," a two-finger "pinch," a two-finger "open," etc.), into control data (e.g., a control signal) for controlling one or more electrical loads (e.g., the lighting loads 102, 104 of FIG. 1) controlled by the remote control device 300. For example, the control circuit of the control module 320 may be configured to receive signals that correspond to user inputs applied via the touch sensitive surface, interpret the received signals into various control commands, and generate control data (e.g., a control signal) to cause the commands to be executed. For example, the control circuit may be configured to, in response to a point actuation, generate first control data for changing a first characteristic of an electrical load, and in response to a gesture, generate second control data for changing a second characteristic of the electrical load.

It should be appreciated that the control circuit of control module 320 is not limited to interpreting signals associated with the above-described example gestures, and that the control circuit may be configured to interpret signals associated with more, fewer, or different gestures as desired. Gestures may be user-programmable, reprogrammable, and custom gestures. Further, the touch sensitive surface (e.g., a touch sensitive device residing behind the touch sensitive surface) of the remote control device 300 may define one or more linear columns (e.g., one-dimensional columns) that may provide a Y-axis output, one or more linear rows that provide respective X-axis outputs, or any combination thereof. The touch sensitive surface (e.g., a touch sensitive device residing behind the touch sensitive surface) may include, for example, a two-dimensional touch element having both X-axis and Y-axis outputs. Such implementations may enable the remote control device 300 to control multiple electrical loads from the control module 320. For example, gestures applied to a first capacitive touch column may cause commands to be issued to a first lighting load associated with the first capacitive touch column, gestures applied to a second capacitive touch column may cause commands to be issued to a second lighting load associated with the second capacitive touch column, and gestures applied simultaneously to both the first and second capacitive touch columns may cause a command to be issued to both the first and second lighting loads.

Figure 7B:
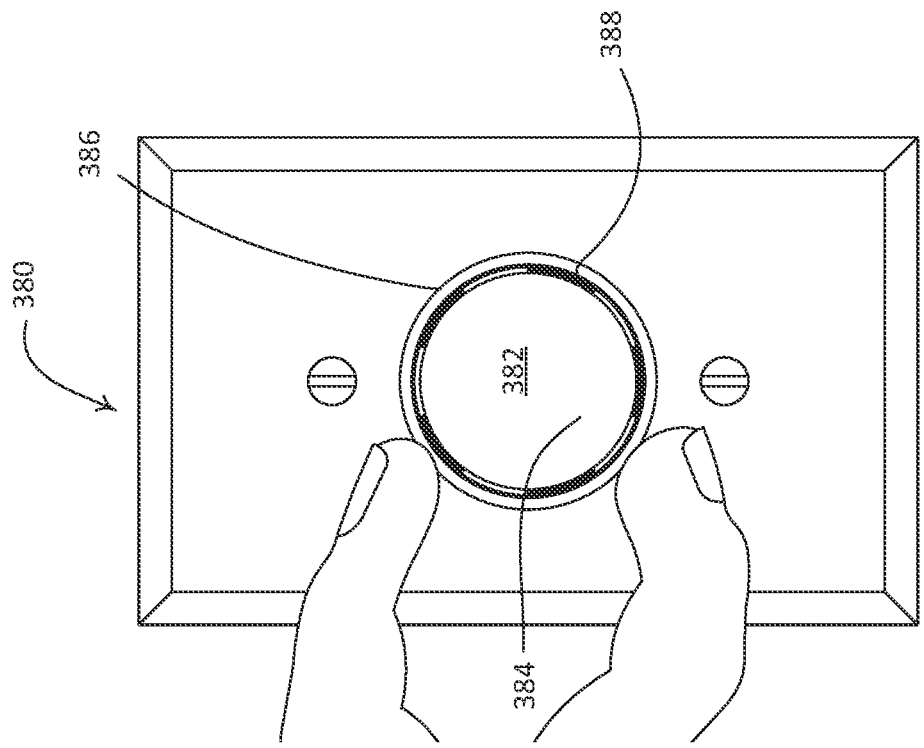
FIG. 7B depicts an example of applying relative control over an electrical load using the example control device illustrated in FIG. 7A.
Figure 7A:
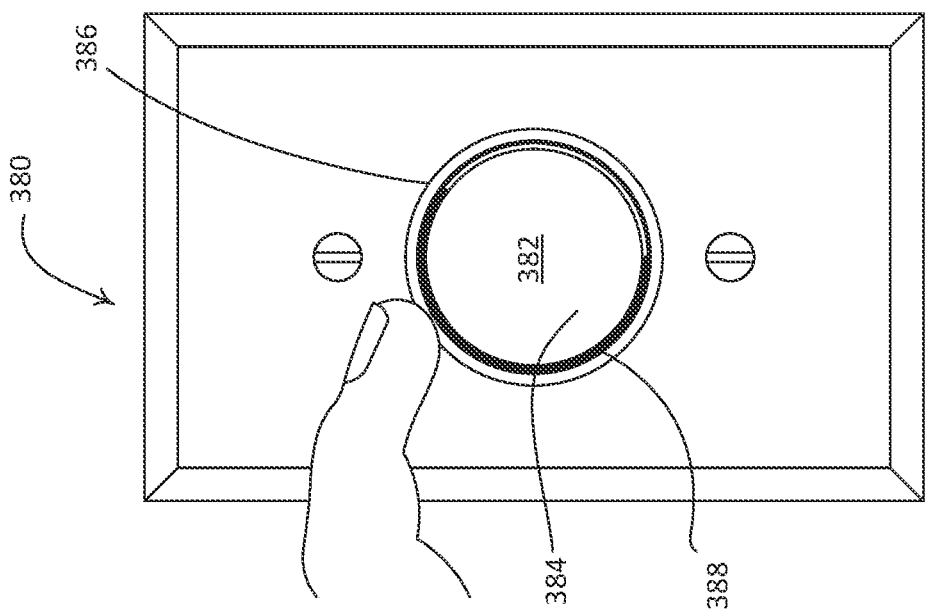
FIG. 7A depicts an example of applying absolute control over an electrical load using an example control device that may be deployed as a load control device and/or a remote control device of the load control system illustrated in FIG. 1.

FIGS. 7A-7H depicts an example control device 380 that may be deployed as the dimmer switch 110 and/or the retrofit remote control device 112 in the lighting control system 100, the control device 300, and/or the control device 310. The control device 380 may be configured to detect various types of user inputs (e.g., point actuations and/or gestures), and translate those user inputs into control data to control an electrical load controlled by the control device 380. FIGS. 7A and 7B depict examples of user inputs that may be recognized by the control device 380 and translated into control data for adjusting an amount of power delivered to an electrical load. The user inputs may be provided via a touch sensitive surface 382 (e.g., a capacitive touch surface) of an actuator portion 384 (e.g., the actuation portion 324), and may have different characteristics (e.g., in term of spatial and/or timing properties) so that they may be interpreted as commands to apply different types of control over the electrical loads. For example, the user input shown in FIG. 7A is characterized by a rotational movement of a rotating portion 386 (e.g., the rotating portion 322), and may be interpreted by the control device 380 (e.g., a control circuit of the control module 380) as a command to set an amount of power delivered to the electrical loads to an absolute level. The control circuit may determine the absolute level based on the degree of rotation, and generate control data (e.g., a control signal) accordingly to effectuate the control (e.g., by causing a wireless communication circuit of the control device 380 to transmitted a control signal including the control data to the electrical loads). The control circuit may rescale the adjustment amount that corresponds to a user input when the power level is near a low-end. The example rescaling techniques described in association with FIG. 4A may be equally applicable here.

The user input in FIG. 7B, on the other hand, may have different characteristics than those depicted in FIG. 7A, and may be interpreted as a different command for adjusting the amount of power delivered to the plurality of electrical loads. For example, the user input may be characterized by pushing in the rotating portion 386 (towards the faceplate 316 and/or the base portion 320) and rotating it at the same time. The control circuit may recognize such a user input as a command for relative control, and generate control data (e.g., a control signal) to effectuate the control accordingly. For example, the control circuit may cause the power delivered to the electrical loads to be adjusted (e.g., gradually adjusted) by a relative adjustment amount (e.g., relative to a starting level), while allowing the electrical loads to maintain respective absolute power levels that are different from one another. For example, the control circuit may cause the power delivered to the electrical loads to be adjusted by a percentage based on the amount of rotational movement of the rotating portion 386. The adjustment may be made gradually (e.g., at a predetermined rate) as the rotational portion 386 is being rotated. An illustrative example of relative control and example techniques for rescaling an adjustment amount have been provided in association with FIG. 4B (e.g., with reference to two lighting loads), and is equally applicable here.

User inputs for relative control are not limited to the example described above. For instance, a user may first manipulate the control device 380 to put it into a relative control mode, and then turn the rotating portion 386 to exercise relative control over the electrical loads. Various mechanisms for switching the control device 380 into a relative control mode may be provided. For example, a user may press and hold the actuation portion 384 to activate the relative control mode. A user may also activate the relative control mode through a contact based gesture (e.g., a "swipe" gesture, as described herein). The control device 380 may be configured to interpret such a "swipe" gesture as a command to put the control device into the relative control mode and act accordingly. As another example, a user may activate the relative control mode through a non-contact based gesture. For instance, a user may hover a finger or wave a hand over the touch sensitive surface 382 of the actuation portion 384 to signal an intent for the control device 380 to enter the relative control mode. The control device 380 may be configured to recognize the hovering or waving as a command to put the control device into a relative control mode and act accordingly The control circuit of the control device 380 may be configured to provide a visual indication in response to detecting the user inputs depicted in FIGS. 7A and 7B. For example, the control circuit may be configured to, upon detecting a user input to set an amount of power delivered to one or more electrical loads to an absolute level (e.g., as described with reference to FIG. 7A), indicate the absolute level on the light bar 388. For example, the control circuit may illuminate the light bar 388 to an intensity proportional to the absolute level (e.g., a higher intensity for a higher power level). Alternatively or additionally, the control circuit may illuminate the light bar 388 along a length that extends clockwise from a central position at the bottom of the light bar 388 to a position along the circumference of the light bar 388. The length of such an illumination (e.g., as defined by an amount of the light bar 388 that is illuminated) may correspond to and be indicative of the absolute level of power delivered to the electrical load. The illumination may fade away after a predetermined amount of time, or be maintained until the next adjustment.

When relative control is being applied, the control circuit of the control device 380 may be configured to illuminate the light bar 388 into a specific pattern (e.g., multiple segments of varying intensities or colors), as illustrated in FIG. 7B. The control circuit may be further configured to alter the illumination pattern (e.g., successively alter the intensities or colors of the multiple segments) as the user input for relative control is being applied, so that an animation (e.g., imitation of a moving scrollbar and/or ridges of a scroll wheel) may be displayed on the light bar 388 to indicate that the power delivered to the electrical load is being gradually adjusted (e.g., by a predetermined amount at a time). The animation may move at a constant rate as the control is being applied or with varying speed dependent upon the user input (e.g., dependent on the amount of relative adjustment). Alternatively, the control circuit may be configured to illuminate the light bar 388 (e.g., in a manner similar to the indication of an absolute power level described above) to indicate an average of the power levels delivered to a plurality of electrical loads.

Figure 7D:
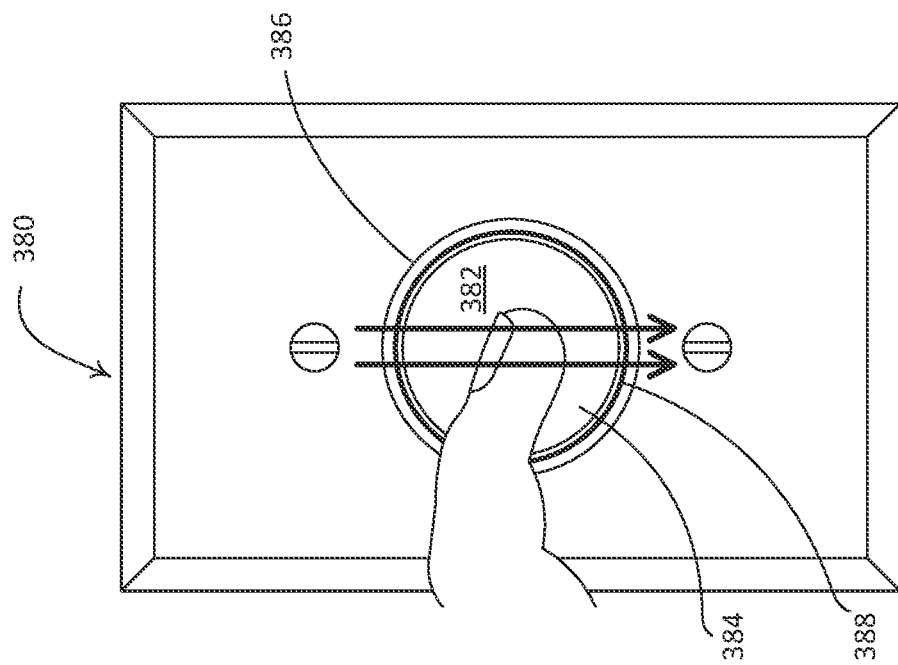
FIG. 7D depicts another example of using a gesture to control an electrical load via the example control device illustrated in FIG. 7A.
Figure 7C:
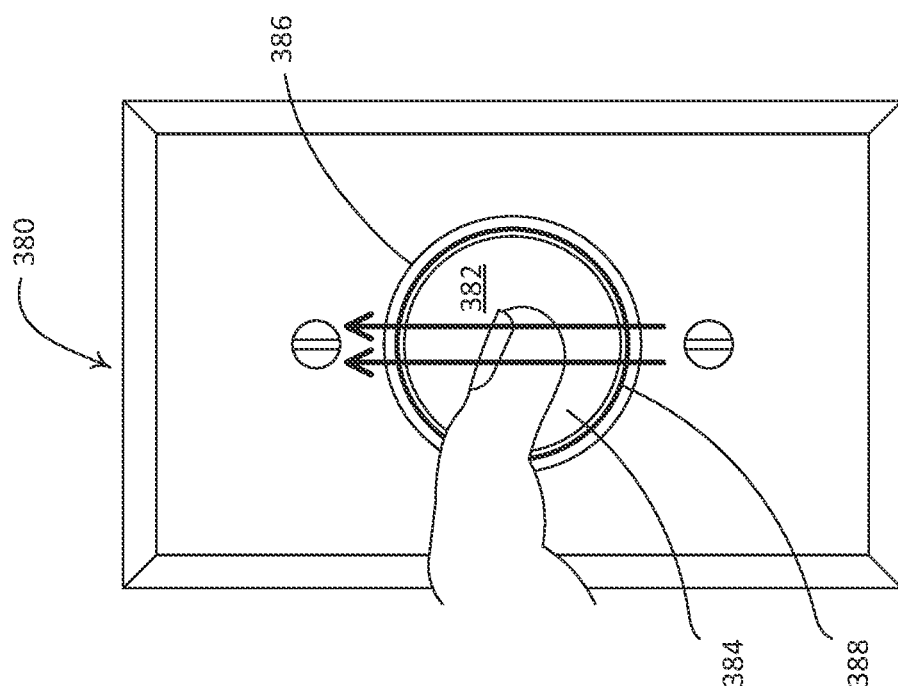
FIG. 7C depicts an example of using a gesture to control an electrical load via the example control device illustrated in FIG. 7A.

FIGS. 7C and 7D depict examples of additional user inputs (e.g., such as gestures) that may be recognized by the control device 380 and translated into control signals for controlling an electrical load. The user inputs may be applied via the touch sensitive surface 382 of the actuation portion 384 with or without physically contacting the touch sensitive surface. As shown in FIG. 7C, for example, the user input may have the characteristics of an upward "swipe" gesture, as described herein. The user input may cause a signal to be transmitted to the control circuit of the control device 380. The signal may indicate to the control circuit that the user input has the characteristics of an upward "swipe" gesture. The control circuit may interpret the signal based on the characteristics reflected therein, and generate a corresponding control data (e.g., a control signal) to control an electrical load controlled by the control device 380.

Similarly, as shown in FIG. 7D, the user input may be characterized by a downward "swipe" gesture applied to the touch sensitive surface 382 of the actuation portion 384, as described herein. A signal may be transmitted to the control circuit of the control device 380 in response to detecting the gesture. The signal may be reflective of the characteristics of the aforementioned downward "swipe" gesture. The control circuit may interpret the signal based on the characteristics reflected therein, and generate corresponding control data (e.g., a control signal) to control an electrical load controlled by the control device 380.

Although FIGS. 7C and 7D depict the "swipe" gestures as vertical upward and downward swipes, it should be appreciated that a swipe motion can be applied in other directions and/or manners. For example, a swipe may be applied in a horizontal direction in either a left-to-right or right-to-left direction, or diagonally from one area of the touch sensitive surface to another. The scope of the disclosure herein with respect to a "swipe" is not limited to any particular manner in which the swipe is applied.

The control circuit of the control device 380 may be configured to interpret a user input corresponding to a "swipe" gesture as a command for an associated electrical load to enter a particular state. Such a particular state may be predetermined, and may correspond to, for example, an on/off state of the electrical load, a specific power level of the electrical load (e.g., a desired intensity level of a lighting load), a particular setting of the electrical load (e.g., a temperature setting of an HVAC system), and/or the like. For example, upon receiving a signal indicative of a "swipe" gesture in an upward direction, the control circuit may be configured to generate control data (e.g., a control signal) to cause a lighting load to go to a full intensity dimming level (e.g., a high-end intensity). And upon receiving a signal indicative of a "swipe" gesture in a downward direction, the control circuit may be configured to generate control data (e.g., a control signal) to cause a lighting load to go to a minimal dimming level (e.g., a low-end intensity, such as 1% or off).

The control circuit of the control device 380 may be configured to interpret a user input corresponding to a "swipe" gesture as a command to change the control device 380 into a specific operational mode. Such an operational mode may be, for example, an intensity control mode or a color control mode for a lighting load, a preset selection mode, an absolute or relative power control mode, and/or the like. For example, the control device 380 may be configured to, by default, operate in an intensity control mode. Upon receiving a signal indicative of a "swipe" gesture in a right-to-left direction, the control circuit may be configured to change the control device 380 from the intensity control mode to a color control mode.

The control circuit of the control device 380 may be configured to provide a visual indication in response to detecting the user inputs depicted in FIGS. 7C and 7D. For example, if the control circuit is configured to put an associated electrical load into a particular state in response to detecting a "swipe" gesture, the control circuit may be further configured to illuminate the light bar 388 to indicate the particular state. For instance, upon controlling a lighting load to go to a full intensity dimming level (e.g., a high-end intensity) or a minimal dimming level (e.g., a low-end intensity, such as 1% or off), the control circuit may illuminate the light bar 388 to indicate the respective dimming levels, as described above.

Relevant features described herein with reference to FIGS. 7C and 7D may be applicable to other types of user inputs. For example, the touch sensitive surface 382 of the actuation portion 384 may be configured to be responsive to a "tap" or "poke" applied at a specific location of the touch sensitive surface. Such a "tap" or "poke" may, for example, be characterized by a touch-and-release, as described herein. The control circuit of the control device 380 may be configured to interpret such a "tap" or "poke" as a command for an associated electrical load to go to a desired power level, such as a command for a lighting load to go to a desired dimming level. The desired power level may be dependent upon a location of the touch sensitive surface 382 at which the "tap" or "poke" is detected (e.g., such as a position along the light bar 388). The control circuit may generate control data (e.g., a control signal) to cause the command to be executed.

The touch sensitive surface 382 of the actuation portion 384 may be configured to be responsive to a "smack" gesture, as described herein. The control circuit of the control device 380 may be configured to interpret such a gesture as a command to toggle a state of an associated electrical load, for example from on to off or from off to on. In an example, the control circuit may be configured to, upon toggling an associated electrical load on in response to a "smack" gesture, put the associated electrical load into a last-known state (e.g., a state before the associated electrical load was turned off). Alternatively or additionally, the control circuit may be configured to interpret a "smack" gesture as a command for an associated electrical load to enter a predetermined state, including, for example, a particular power state of the electrical load (e.g., a desired intensity level of a lighting load), a particular setting of the electrical load (e.g., a temperature setting of an HVAC system), and/or the like.

The control device 380 may be used to control the color of light emitted by a lighting load. To facilitate color control operations, the control device 380 may be configured to provide one or more visual indications on the touch sensitive surface 382 of the actuation portion 384 to assist with the color control operations. Such visual indications may be provided, for example, on the touch sensitive surface 382 of the actuation portion 384. The visual indications may include a color gradient and/or one or more backlit virtual buttons that may be used to adjust a color setting of the lighting load.

Figure 7F:
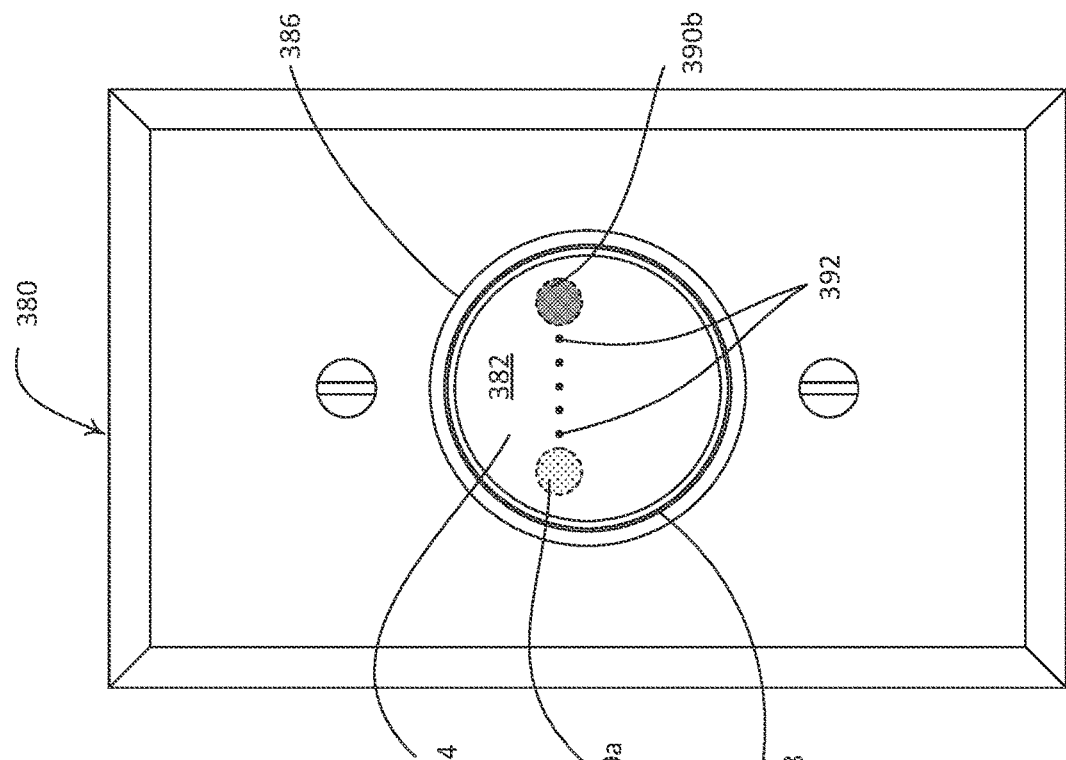
FIG. 7F depicts an example of applying color control over a lighting load using backlit virtual buttons located on the example control device illustrated in FIG. 7A.
Figure 7E:
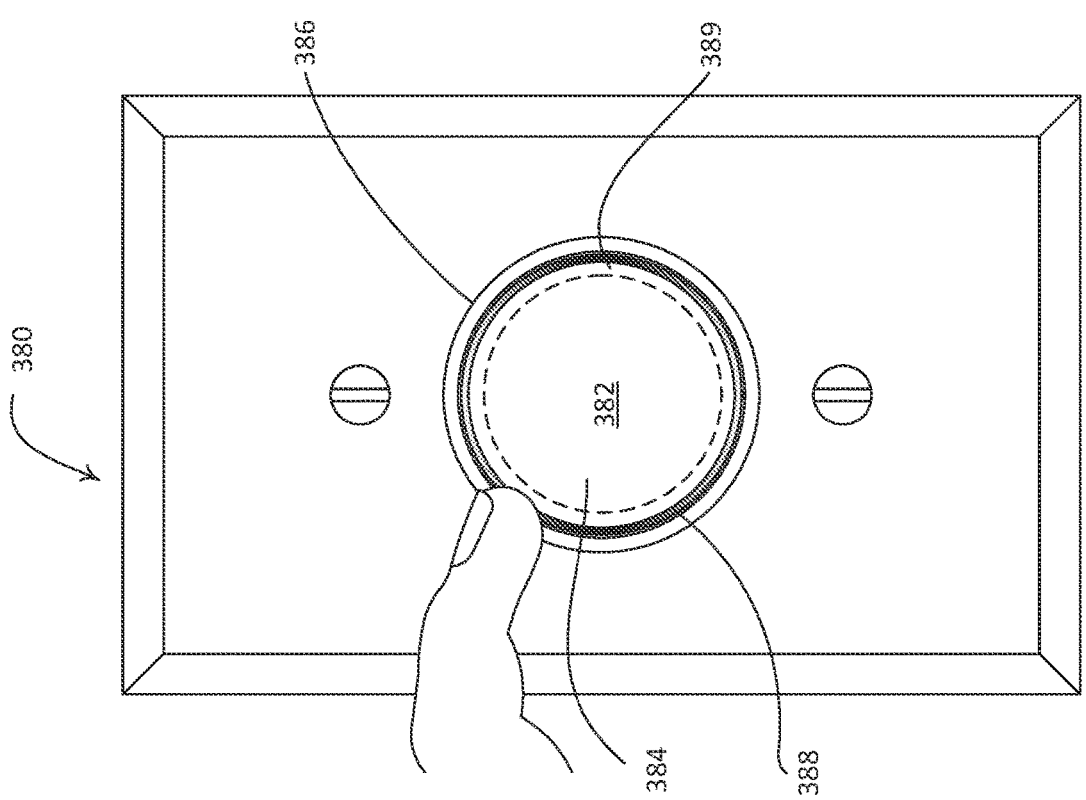
FIG. 7E depicts an example of applying color control over a lighting load using a light bar located on the example control device illustrated in FIG. 7A.

FIG. 7E depicts an example of a color gradient that may be provided on the light bar 388 to facilitate a color control operation. A color gradient, as described above, may refer to any visual representation of a set of colors arranged in accordance to an order. The number of colors and the order in which those colors are arranged may vary from one implementation to the next, and should not limit the scope of this disclosure. Further, in the example shown in FIG. 7E, a color gradient is provided on the light bar 388 that extends along a perimeter of the actuation portion 384. It should be appreciated, however, that the presentation of such a color gradient is not limited to any particular location, and does not need to be in a bar shape. Further, it should be noted that the color gradient may be applied to the colors associated with the color temperatures of a black body radiator.

The control circuit of the control device 380 may be configured to present the color gradient in response to a user input. For example, the user input may be a touch-based gesture applied to the touch sensitive surface 382 of the actuation portion 384 (e.g., a "swipe" or "smack" gesture). The control circuit may be configured to be responsive to such gestures and illuminate the light bar 388 to present the color gradient in response. Alternatively or additionally, the user input may be a wiggle of the rotating portion 386 (e.g., turning the rotating portion 386 in alternating rotational directions in rapid succession), and the control circuit may be configured to detect the wiggle (e.g., via an accelerometer) and illuminate the light bar 388 to present the color gradient in response. The user input may be a gesture effectuated without any physical contact with the control device 380. For example, the touch sensitive surface 382 of the actuation portion 384 may be configured to detect a finger or hand hovering over the touch sensitive surface, and a signal may be transmitted to the control circuit indicating such detection (e.g., the detection may more generally indicate proximity of a user to the control device 380). The control circuit may, in response to receiving the signal, illuminate the light bar 388 to present the color gradient.

The control circuit of the control device 380 may be configured to present the color gradient in different ways. In an example, the control circuit may illuminate the light bar 388 with multiple colors each centering in a portion of the light bar 388 and gradually transitioning into the color of a neighboring portion. The different colors may be arranged in an order reflective of the respective red/green/blue (RGB) values of the colors, for example. Each of the colors displayed on the light bar 388 (e.g., the location of the corresponding color) may correspond to a desired color for one or more lighting loads controlled by the control device 380. The relationship between desired light colors for the lighting loads and different positions the color gradient (e.g., the respective locations of the colors on the light bar 388) may be stored, for example, in a memory of the control device 380.

To select a color for the one or more lighting loads, a user of the control device 380 may actuate an area 389 of the touch sensitive surface 382 of the actuation portion 384 that is adjacent to desired color displayed on the color gradient of the light bar 388. The actuation may be, for example, a point actuation (e.g., a "tap" or "poke"). A signal may be transmitted to the control circuit of the control device 380 in response to the actuation. The signal may be indicative of the actuation (e.g., the location of the actuation). Upon receiving the signal, the control circuit may determine a color corresponding to the location of the actuation, and generate control data (e.g., a control signal) to set a color of the one or more lighting loads to the determined color. For instance, the control circuit may be capable of identifying which color of the gradient displayed on the light bar 388 is adjacent to the location of actuation, and set the color of the lighting loads to the color corresponding to the location along the color gradient. This way, as a user slides a finger along the light bar 388, the color of the lighting loads may be adjusted accordingly based on the position of the finger along the length of the light bar 388.

The control circuit may be configured to assign a color to multiple lighting loads (e.g., in a zone controlled by the control device 380) in response to a single "tap" along the color gradient. Alternatively, the control circuit may be configured to assign a color for one lighting load in the zone of control in response to each "tap," and assign the color to additional lighting loads in the zone of control in response to additional "taps" by a user. Further, the control circuit may be configured to, in response to a first "tap" by a user, associate a first color to one or more lighting loads, and, in response to a second "tap" by a user, associate a second color to the one or more lighting loads. The control circuit may be further configured to cause the one or more lighting loads to dynamically switch between the first and second associated colors (e.g., at a predetermine rate or in accordance with an external condition).

A user may manipulate the touch sensitive surface 382 of the actuation portion 384 to change the color gradient displayed on the light bar 388. For example, the control circuit of the control device 380 may initially illuminate the light bar 388 into a first set of colors (e.g., to display a first color gradient on the light bar 388). Each of the first set of colors may represent a section of the visible color spectrum that corresponds to a specific wavelength range. A user may manipulate an area 374 of the touch sensitive surface adjacent to one of the first set of colors by applying, for example, a two-finger "open" gesture (e.g., fingers moving apart) or a force (e.g., via a finger press), next to one of the first set of colors. The control circuit of the control device 380 may be configured to, in response to the gesture, determine the section of the color spectrum that corresponds to the location of the actuation, and adjust the illumination of the light bar 388 so that the first set of colors is replaced with a second set of colors (e.g., to display a second color gradient on the light bar 388). The second set of colors may correspond to colors that are within the section of the color spectrum associated with the location of the actuation (e.g., the second color gradient may represents a smaller range of the first color gradient). A user may then set a color for one or more lighting loads controlled by the control device 388 by actuating the area 389 of the touch sensitive surface adjacent to one of the second set of colors, as described above.

While the second set of colors (e.g., the second color gradient) is displayed on the light bar 388, the control circuit may be configured to change the display to revert to the first set of colors (e.g., the first color gradient) in response to a user input. For example, the control circuit may receive a signal indicating that a two-finger "pinch" gesture (e.g., fingers moving together) or a force (e.g., applied via a finger press) is detected by the touch sensitive surface in an area 389 adjacent to the second color gradient. The control circuit may interpret such a signal as a command to switch the display on the light bar 388 back to the first color gradient, and may illuminate the light bar 388 to effectuate the switch accordingly.

FIG. 7F depicts an example of another mechanism for adjusting a color (e.g., color temperature) of one or more lighting loads controlled by the control device 380. Although described with reference to color temperature control, it should be appreciated that the mechanism and user control described with reference to FIG. 7F may also be applied to full range color control. As shown, areas of the touch sensitive surface 382 of the actuation portion 384 may be backlit to display soft or virtual buttons 390a, 390b, and/or indicator lights 392. The virtual buttons 390a, 390b and/or indicator lights 392 may be configured to be backlit by one or more light sources (e.g., LEDs). The control circuit of the control device 380 may be configured to dim the backlighting (e.g., turn off the backlighting or make it not easily perceivable by a user) when the control device 380 is in a different operational mode or in an idle state so that a first user interface may be presented to a user of the control device 380. The control circuit may then illuminate the backlighting to reveal the virtual buttons 390a, 390b and/or the indicator lights 392 in response to a user input or a particular event (e.g., a predetermined timing event) so that a second user interface may be presented to the user. Alternatively, the control circuit may be configured to maintain the backlighting in an "on" state so that the virtual buttons are always shown on the control device 380.

The user input that may trigger the display of the virtual buttons 390a, 390b and/or the indicator lights 392 may be, for example, a touch-based gesture applied to the touch sensitive surface 382 of the control device 380 (e.g., a "swipe" or "smack" gesture). The control circuit of the control device 380 may be configured to be responsive to such gestures and activate the backlighting to present the virtual buttons 390a, 390b and/or the indicator lights 392 in response. Alternatively or additionally, the user input may be a wiggle of the rotating portion 394, and the control circuit may be configured to detect the wiggle and reveal the virtual buttons 390a, 390b and/or the indicator lights 392 in response. The user input may be a gesture effectuated without any physical contact with the control device 380. For example, the touch sensitive surface 382 of the actuation portion 384 may be configured to detect a finger or hand hovering over the touch sensitive surface 382, and a signal may be transmitted to the control circuit to indicate such detection (e.g., the detection may more generally indicate proximity of a user to the control device 380). The control circuit may, in response to receiving the signal, activate the backlighting to reveal the virtual buttons 390a, 390b and/or the indicator lights 392.

The areas of the touch sensitive surface 382 that correspond to the virtual buttons 390a, 390b may be associated with adjusting (e.g., increasing and decreasing) the color temperature of one or more lighting loads controlled by the control device 380. For example, a user may actuate the area of the touch sensitive surface 382 occupied by virtual button 390a via, for example, a point actuation (e.g., a "tap" or "poke"). In response to the actuation, a signal may be transmitted to the control circuit indicating that virtual button 390a has been actuated. The control circuit may interpret the actuation as a command to increase the color temperature of the lighting loads, and generate control data (e.g., a control signal) to effectuate the increase accordingly. The increase may be, for example, a gradual increase (e.g., by a predetermined amount at each step) while the actuation (e.g., a press-and-hold) lasts, or a one-time increase (e.g., by a predetermined amount) in response to the actuation (e.g., a "tap").

Similarly, the touch sensitive surface 382 may be configured to detect that the area of the surface occupied by the virtual buttons 390b has been actuated. The actuation may be, for example, a point actuation (e.g., a "tap" or "poke"). The touch sensitive surface 382 may detect the actuation, and a signal may be transmitted to the control circuit indicating the detection. The control circuit may be configured to interpret the actuation as a command to decrease the color temperature of the lighting loads, and generate control data (e.g., a control signal) to effectuate the decrease accordingly. The decrease may be, for example, a gradual decrease (e.g., by a predetermined amount at each step) while the actuation (e.g., a press-and-hold) lasts, or a one-time decrease (e.g., by a predetermined amount) in response to the actuation (e.g., a "tap").

The control circuit of the control device 380 may be configured to illuminate the indicator lights 392 to provide feedback about color temperature adjustments in response to the virtual buttons 390a, 390b being actuated. For example, as the user actuates the virtual button 390a, the indicator lights 392 may be turn on one after another from right to left to signal that the color temperature of the lighting load is being increased. As the user actuates the virtual button 390b, the indicator lights 392 may be turned off one after another from left to right to signal that the color temperature of the lighting load is being decreased.

The control circuit of the control device 380 may be further configured to illuminate the light bar 388 to indicate a current color temperature of the one or more lighting loads controlled by the control device 380. For example, the control circuit may cause the light bar 388 to be illuminated to different intensities and/or lengths in proportion to a current color temperature of the one or more lighting loads (e.g., the light bar 388 may be illuminated to a higher intensity and/or a greater length in response to a higher color temperature).

The control device 380 may be used to activate a preset, zone, or operational mode associated with one or more electrical loads. As described above, a preset may correspond to one or more predetermined settings of the one or more electrical loads. For example, a preset may correspond to a preconfigured lighting scene (e.g., predetermined intensity/color settings of one or more lighting loads), a preconfigured combination of entertainment settings (e.g., music selection, volume of speakers, etc.), a preconfigured combination of environmental settings (e.g., temperature, humidity, shades, etc.), and/or the like. A zone may correspond to one or more electrical loads that are configured to be controlled by the control device 380. A zone may be associated with one specific location (e.g., a living room) or multiple locations (e.g., an entire house with multiple rooms and hallways). An operational mode of the control device 380 may be associated with controlling different types of electrical loads or different operational aspects of one or more electrical loads. Examples of operational modes may include a lighting control mode for controlling one or more lighting loads (e.g., controlling intensity and/or color of the lighting loads), an entertainment system control mode (e.g., controlling music selection and/or the volume of an audio system), an HVAC system control mode, a winter treatment device control mode (e.g., for controlling one or more shades), and/or the like. Such presets, zones, or operational modes may be configured via the control device 380 and/or via an external device (e.g., a mobile device) by way of a wireless communication circuit of the control device 380. Once configured, the presets, zones, or operational modes may be stored by the control device 380 in memory.

Figure 7H:
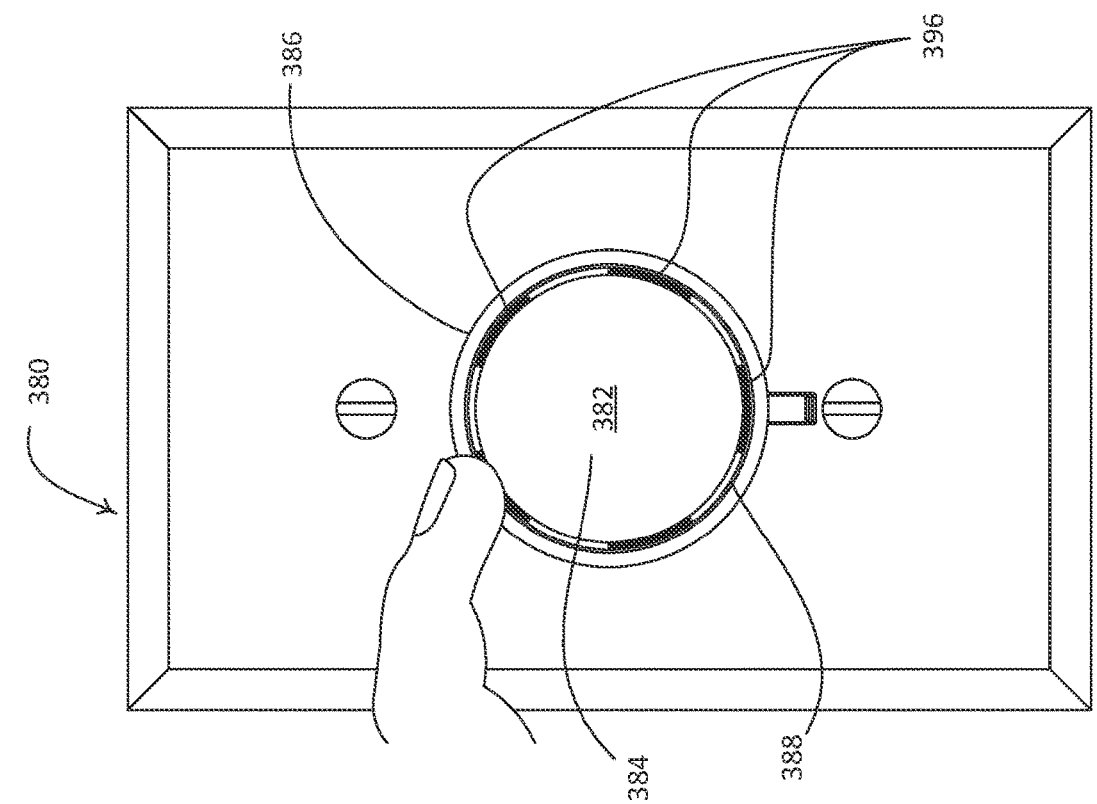
FIG. 7H depicts an example of preset selection using a light bar located on the example control device illustrated in FIG. 7A.
Figure 7G:
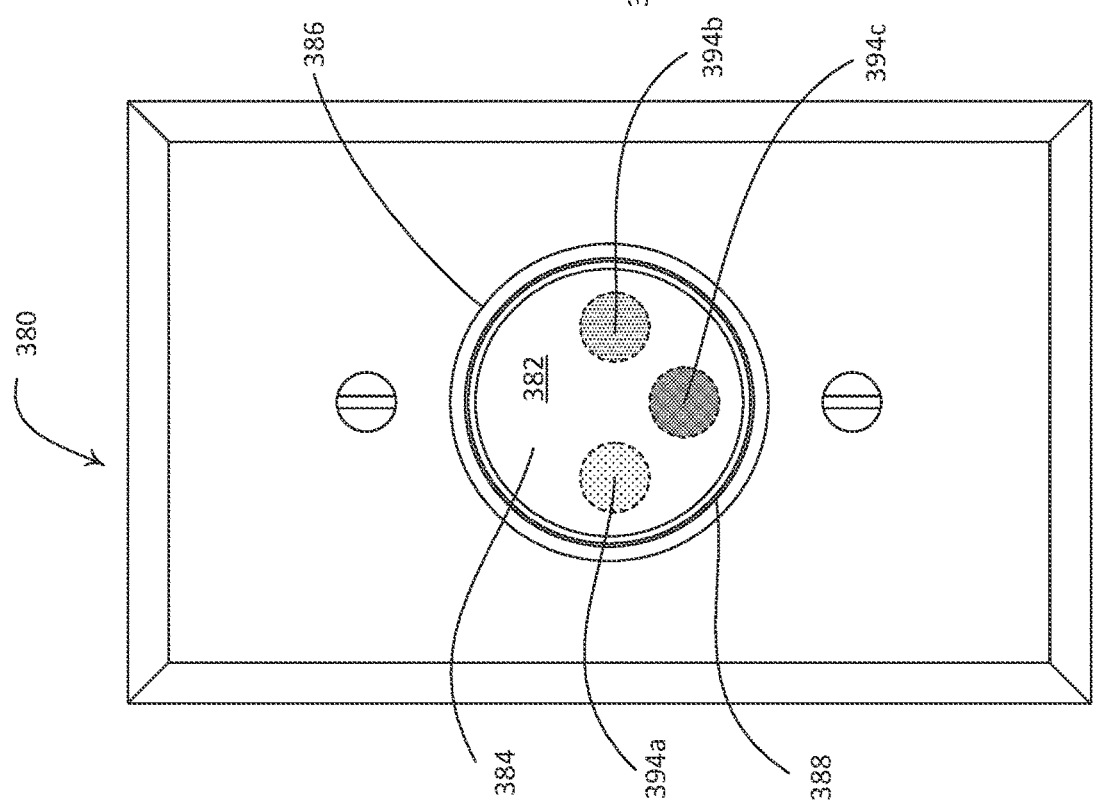
FIG. 7G depicts an example of preset selection using backlit virtual buttons located on the example control device illustrated in FIG. 7A.

FIG. 7G depicts an example of a user interface that may be provided on the touch sensitive surface 382 of the control device 380 to facilitate preset, zone, and operational mode selections. As shown, areas of the touch sensitive surface 382 may be illuminated (e.g., backlit) to display soft or virtual buttons 394a, 394b, 394c. The illuminated areas may have different shapes, such as, for example, circles, squares, rectangles, etc. The areas may be thinned out compared to the rest of the touch sensitive surface to allow backlighting to emit through the thinned-out areas. The areas may be associated with respective indicia (e.g., texts or graphics) that indicate the purposes of the virtual buttons 394a-394c. Backlighting may be provided, for example, by one or more light sources such as LEDs. The control circuit of the control device 380 may be configured to dim the backlighting (e.g., turn off the backlighting or make it not easily perceivable by a user) when the control device 380 is in a different operational mode or in an idle state so that a first user interface may be presented to a user of the control device 380. The control circuit may then illuminate the backlighting to reveal the virtual buttons 394a-394c in response to a user input or a particular event (e.g., a predetermined timing event) so that a second user interface may be presented to the user. Alternatively, the control circuit may be configured to maintain the backlighting in an "on" state so that the virtual buttons are always shown on the control device 380.

The user input that may trigger the display of the virtual buttons 394a-394c may be, for example, a gesture applied to the touch sensitive surface of the control device 380 (e.g., a "swipe" or "smack" gesture). Such a gesture may be detected by the touch sensitive surface, and a signal may be transmitted to the control circuit to indicate the detection. The control circuit may, in response to receiving the signal, activate the backlighting to reveal the virtual buttons 394a-394c. Alternatively or additionally, the user input may be a wiggle of the rotating portion 386 of the control device 380, and the control circuit may be configured to detect the wiggle and activate the backlighting to display the virtual buttons 394a-394c. The user input may be a gesture effectuated without any physical contact with the control device 380. For example, the touch sensitive surface 382 of the actuation portion 384 may be configured to detect a finger or hand hovering over the touch sensitive surface. A signal may then be transmitted to the control circuit to indicate the detection (e.g., the detection may more generally indicate proximity of a user to the control device 380). The control circuit may, in response to receiving the signal, activate the backlighting to reveal the virtual buttons 394a-394c.

The areas of the touch sensitive surface 382 that correspond to the virtual buttons 394a-394c may be designated for activating respective presets, zones, or operational modes associated with one or more electrical loads controlled by the control device 380. The association between the virtual buttons 394a-394c (e.g., locations of the virtual buttons 394a-394c) and the presets, zones, or operational modes may be stored, for example, in a memory of the control device 380. To illustrate, a user of the control device 380 may actuate the area of the touch sensitive surface occupied by virtual button 394a through, for example, a point actuation (e.g., a "tap" or "poke"). The control circuit may receive an indication of the actuation (e.g., from the touch sensitive surface), interpret the actuation as a command to activate a first preset (e.g., a preconfigured lighting scene), a first zone (e.g., a hallway zone), or a first operational mode (e.g., a lighting control mode), and generate control data (e.g., a control signal) to effectuate the activation.

Similarly, the touch sensitive surface of the actuation portion may be configured to detect that the area of the touch sensitive surface occupied by virtual button 394b (or 394c) has been actuated through, for example, a point actuation (e.g., a "tap" or "poke"). The control circuit may receive an indication of the actuation, and interpret the actuation as a command to activate a second preset (e.g., an entertainment scene), a second zone (e.g., a living room zone), or a second operational mode (e.g., a HVAC control mode) if the actuated button is 394b, or to activate a third preset (e.g., a second lighting scene), a third zone (e.g., an entire house), or a third operational mode (e.g., an entertainment system control mode) if the actuated button is 394c. The control circuit may then generate control data (e.g., a control signal) to effectuate the activation.

The control circuit of the control device 380 may be further configured to provide an indication about which preset, zone, or operational mode has been activated. For example, the control circuit may illuminate the light bar 388 in different manners (e.g., with varying intensity and/or color) corresponding to different presets, zones, or operational modes being activated. Alternatively or additionally, the control circuit may uniquely illuminate the virtual button associated with an activated preset, zone, or operational mode (e.g., to cause the virtual button to flash) to inform the user of the activated preset, zone, or operational mode.

A user may use a gesture to cycle through a plurality of presets, zones, or operational modes on the touch sensitive surface of the control device 380. For example, there may be more presets, zones, or operational modes configured in a load control system than what can be displayed on the touch sensitive surface 382 of the control device 380. In those scenarios, a user may apply a gesture (e.g., a "swipe") via the touch sensitive surface 382, and the control circuit may be configured to, in response to the gesture, replace a first set of presets, zones, or operational modes that may be activated via the virtual buttons 394a-394c with a second set. This way, the user may be able to cycle through all available presets, zones, or operational modes to choose one that meets the user's needs. The control circuit may be further configured to change the indicia associated with the virtual buttons 394a-394c to indicate currently associated presets, zones, or operational modes.

FIG. 7H depicts another example of a user interface that may be provided on the light bar 388 of the control device 380 to facilitate preset, zone, and operational mode selections. As shown, the control circuit of the control device 380 may illuminate the light bar 388 display discrete points 396 of illumination. For example, the discrete points 396 may correspond to different segments of the light bar 388 illuminated to different intensities and/or colors, or segments of the light bar 388 that may be illuminated to a same intensity and/or color but separated by segments of different intensities and/or colors. Each of the discrete points 396 (e.g., the location of each discrete point) may correspond to a preset, zone, or operational mode associated with one or more electrical loads controlled by the control device 380. The illumination of the discrete points 396 may be based on their respective associated presets, zones, or operational modes. For example, when a preset corresponds to a lighting scene, the corresponding discrete point on the light bar 388 may be illuminated to display the dominant color of the lighting scene. Alternatively, the illumination of the corresponding discrete point on the light bar 388 may be periodically altered (e.g., at a predetermined rate) to display each light color of the lighting scene (e.g., to cycle through the colors of the lighting loads in the lighting scene). The relationship between the presets, zones, or operational modes and the discrete points of the light bar 388 (e.g., the respective locations of the illuminated segments) may be stored, for example, in a memory of the control device 380. The control circuit of the control device 380 may be configured to keep the light bar 388 illuminated in the aforementioned manner. Alternatively, the control circuit may be configured to dim the light bar 388 (e.g., turn off the illumination or make it not easily perceivable by a user) when the control device 380 is in a different operational mode or in an idle state, and illuminate the light bar 388 to reveal the discrete points 396 in response to a user input or a particular event (e.g., a predetermined timing event).

The user input that may trigger the illumination of the light bar 388 for preset, zone, or operational mode selection may be, for example, a gesture applied to the touch sensitive surface of the control device 380 (e.g., a "swipe" or "smack" gesture). Such a gesture may be detected by the touch sensitive surface, and a signal may be transmitted to the control circuit to indicate the detection. The control circuit may, in response to receiving the signal, illuminate the light bar 388 to display the discrete points 396 that are representative of a plurality of presets, zones, or operational modes. Alternatively or additionally, the user input may be a wiggle of the rotating portion 396 of the control device 380, and the control circuit may be configured to detect the wiggle and illuminate the light bar 388 to display the discrete points 396 of illumination. The user input may be a gesture effectuated without any physical contact with the control device 380. For example, the touch sensitive surface of the control device 380 may be configured to detect a finger or hand hovering over the touch sensitive surface. A signal may then be transmitted to the control circuit to indicate the detection (e.g., the detection may more generally indicate proximity of a user to the control device 380). The control circuit may, in response to receiving the signal, illuminate the light bar 388 for scene selection.

To activate a specific preset, zone, or operational mode, a user may actuate an area of the touch sensitive surface 382 of the actuation portion 384 that is adjacent to one of the discrete points 396 of illumination on the light bar 388. The actuation may be, for example, a point actuation (e.g., a "tap" or "poke"). In response to the actuation, a signal may be transmitted to the control circuit to indicate the actuation (e.g., indicate a location of the actuation). Upon receiving the signal, the control circuit may determine a preset, zone, or operational mode that corresponds to the location of the actuation, and generate control data (e.g., a control signal) to activate the preset, zone, or operational mode accordingly (e.g., based on the stored relationship described above).

After a user has activated a preset, zone, or operational mode, the control circuit may provide an indication the user about the activated preset, zone, or operational mode. For example, the control circuit may uniquely illuminate the discrete point 396 of illumination on the light bar 388 that corresponds to the activated preset, zone, or operational mode. The unique illumination may be realized by, for example, flashing the relevant discrete point or illuminating the discrete point with a higher intensity so that it is highlighted relative to the other discrete point.

Preset, zone, or operational mode selection may be performed differently than described above. For example, selection may be made without utilizing the touch sensitive surface 382 of the actuation portion 384 of the control device 380. Rather, after illuminating the light bar 388 into the discrete points 396 representative of respective presets, zones, or operational modes, the control circuit of the control device 380 may be configured to detect a rotational movement of the rotating portion 386 and, in response, cause one of the discrete points 396 to be uniquely illuminated (e.g., with a higher intensity, flashing, etc.) to indicate that a preset, zone, or operational mode corresponding to the discrete point 396 is selected and ready to be activated. The rotational movement that may trigger the aforementioned action may be a wiggle, a rotation by a predetermined amount (e.g., such as a 45 degree rotation), a rotation with a specific speed or acceleration, etc. The rotating portion 386 may be configured to return to an idle position (e.g., an upright position) after being released by the user.

Activation of a selected preset, zone, or operational mode may be implemented in various ways. For example, after a preset, zone, or operational mode has been selected (e.g., indicated by highlight of a corresponding discrete point 396 on the light bar 388), the control circuit of the control device 380 may automatically activate the preset, zone, or operational mode if no additional user input is received within a predetermined amount of time (e.g., based on expiration of a timer). In such an example case, one of the presets, zones, or operational modes represented on the light bar 388 may be configured as a shortcut to exit the selection operation and return the control device 380 to a previous state. As another example, the control circuit of the control device 380 may be configured to not automatically activate the preset, zone, or operational mode, but rather wait for an explicit user input before taking such action. The explicit user input may be provided, for example, by pushing the actuation portion 384 in toward the base portion or actuating an area of the touch sensitive surface 382 of the control device 380.

After a preset, zone, or operational mode is selected, a user may change the selection via another similar rotational movement of the rotating portion. More generally, the control circuit may be configured to, in response to each such rotational movement of the rotating portion, uniquely highlight the next segment on the light bar 388 and select the corresponding preset, zone, or operational mode for activation.

In addition to or in lieu of the user interfaces described with reference to FIGS. 7G and 7H, the control circuit of the control device 380 may be configured to associate particular user gestures with presets, zones, or operational modes, and generate control data (e.g., a control signal) to activate a preset, zone, or operational mode in response to detecting an associated gesture. The gestures may be applied via the touch sensitive surface 382 of the control device 380. The gestures may be applied by direct contact with the touch sensitive surface 382 (e.g., a "swipe," a "smack," etc.), via proximity of anatomy to the touch sensitive surface (e.g., by hovering a finger over the surface), or otherwise. The association of user gestures with presets, zones, or operational modes may be user-programmable and reprogrammable. The association may be stored, for example, in a memory of the control device 380. The touch sensitive surface 382 may be configured to detect a gesture, and cause a signal to be transmitted to the control circuit indicating the detection. The control circuit may, in response, identify a preset, zone, or operational mode associated with the gesture, and generate control data (e.g., a control signal) to activate the preset, zone, or operational mode.

Although described as separate mechanisms and user inputs in FIG. 7A-H, it should be appreciated that the control device 380 may incorporate any number and/or combinations of the mechanisms and user inputs described with reference to FIG. 7A-H.

Figure 8:
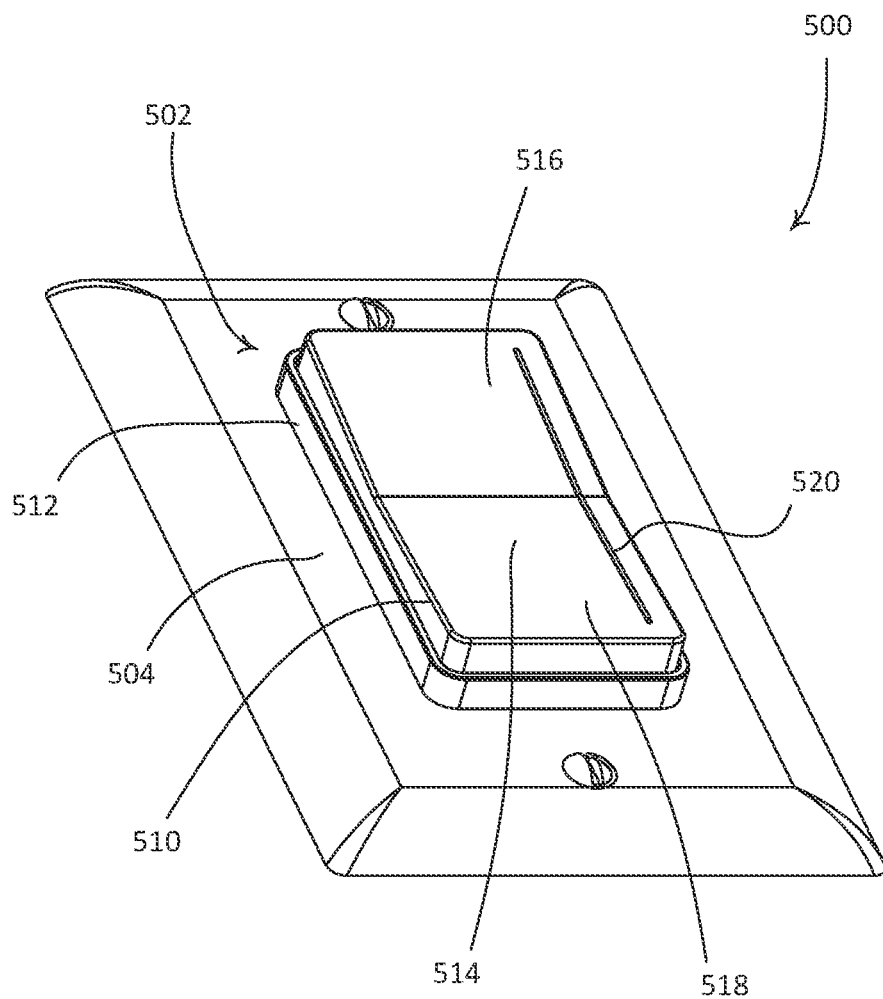
FIG. 8 is perspective view of another example control device that may be deployed as a dimmer switch and/or a remote control device of the load control system illustrated in FIG. 1.

FIG. 8 depicts an example control device 500 that may be deployed as the dimmer switch 110 and/or the retrofit remote control device 112 in the lighting control system 100. The control device 500 may comprise a user interface 502 and a faceplate 504. The user interface 502 of the control device 500 may include an actuation portion 510 that is configured to be mounted to a base portion 512. The actuation portion 510 may comprise a front surface 514 having an upper portion 516 and a lower portion 518. The actuation portion 510 may be configured to pivot about a central axis in response to an actuation of the upper portion 516 and the lower portion 518. The control device 500 may be configured to control a lighting load of the lighting control system 100 to turn the load on in response to an actuation of the upper portion 516 and to turn the load off in response to an actuation of the lower portion 518. More generally, the control device 500 may be responsive to a dynamic motion of the actuation portion 510 (e.g., an actuation that causes movement of the surface of the actuation portion). The front surface 514 of the actuation portion 510 may also be configured as a touch sensitive surface (e.g., a capacitive touch surface) that is configured to receive (e.g., detect) inputs, such as gestures, from a user of the control device 500. The user interface 502 may also include a light bar 520 configured to be illuminated by one or more light sources (e.g., one or more LEDs) to visibly display information. The front surface 514 of the actuation portion 510 may be actuated along the light bar 520 to adjust the amount of power delivered to the lighting load according to the position of the actuation. More generally, the control device 500 may be responsive to a static operation of the actuation portion 510 (e.g., an actuation that does not cause movement of the surface of the actuation portion).

FIGS. 9A-10H depict another example remote control device 600 that may be deployed as the retrofit remote control device 112 in the lighting control system 100 shown in FIG. 1 and/or the control device 500 shown in FIG. 8. The remote control device 600 may be configured to be mounted over a paddle actuator of a standard light switch. The light switch may include a faceplate 606. The faceplate 606 may define an opening (e.g., a decorator-type opening) that extends therethrough. The faceplate 606 may be mounted via faceplate screws 609, for instance to a yoke of the switch. The standard light switch may be coupled in series electrical connection between an alternating current (AC) power source and one or more electrical loads.

As shown, the remote control device 600 may include a base portion 612 and an actuation portion 610 that is configured to be mounted to the base portion 612. The actuation portion 610 may include an actuator 611. The actuator 611 may comprise a front surface 614 that defines a user interface of the actuation portion 610. As shown, the actuator 611 may be configured such that the front surface 614 includes an upper portion 616 and a lower portion 618. The actuation portion 610 may include a light bar 620 that is configured to visibly display information at the front surface 614.

Figure 10A:
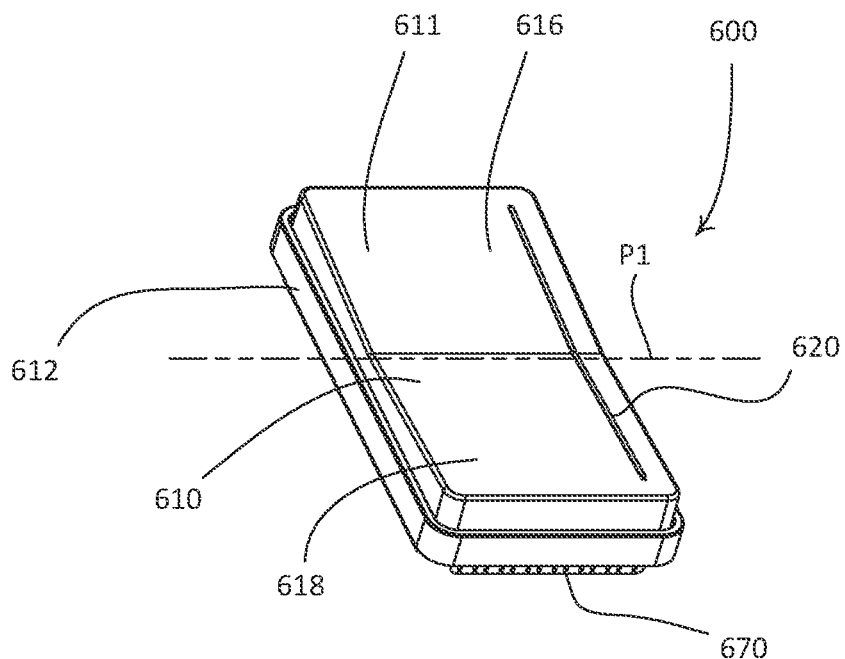
FIG. 10B is a rear perspective view of the example remote control device illustrated in FIG. 9A, with the remote control device unmounted from the light switch.
FIG. 10C is a front view of the example remote control device illustrated in FIG. 9A, with the remote control device unmounted from the light switch.
FIG. 10D is a right side view of the example remote control device illustrated in FIG. 9A, with the remote control device unmounted from the light switch.
FIG. 10E is a bottom view of the example remote control device illustrated in FIG. 9A, with the remote control device unmounted from the light switch.
FIG. 10F is a rear view of the example remote control device illustrated in FIG. 9A, with the remote control device unmounted from the light switch.
FIG. 10G is a bottom sectional view of the example remote control device illustrated in FIG. 9A.
FIG. 10H is an enlarged portion of the sectional view depicted in FIG. 10G.
Figure 10B:
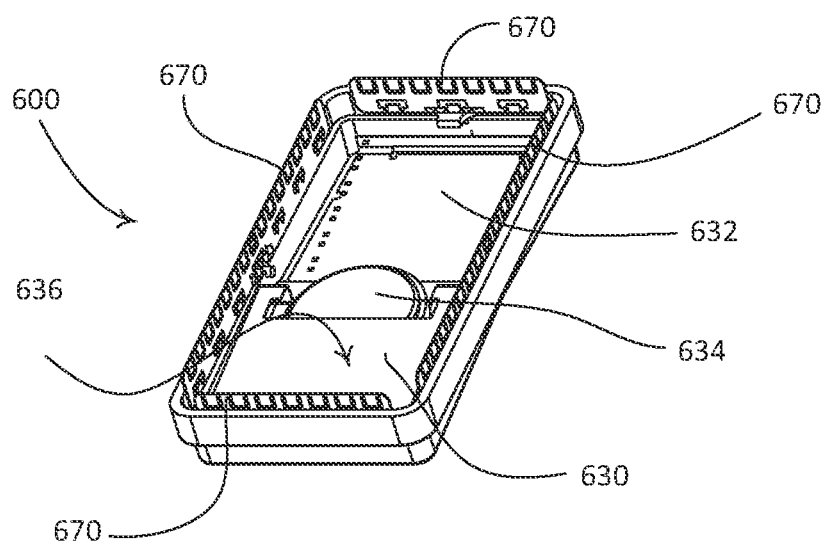
Figure 10C:
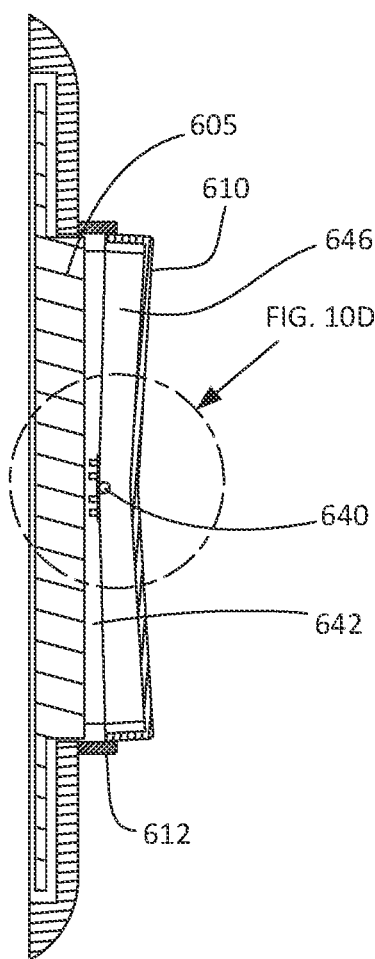
Figure 10D:
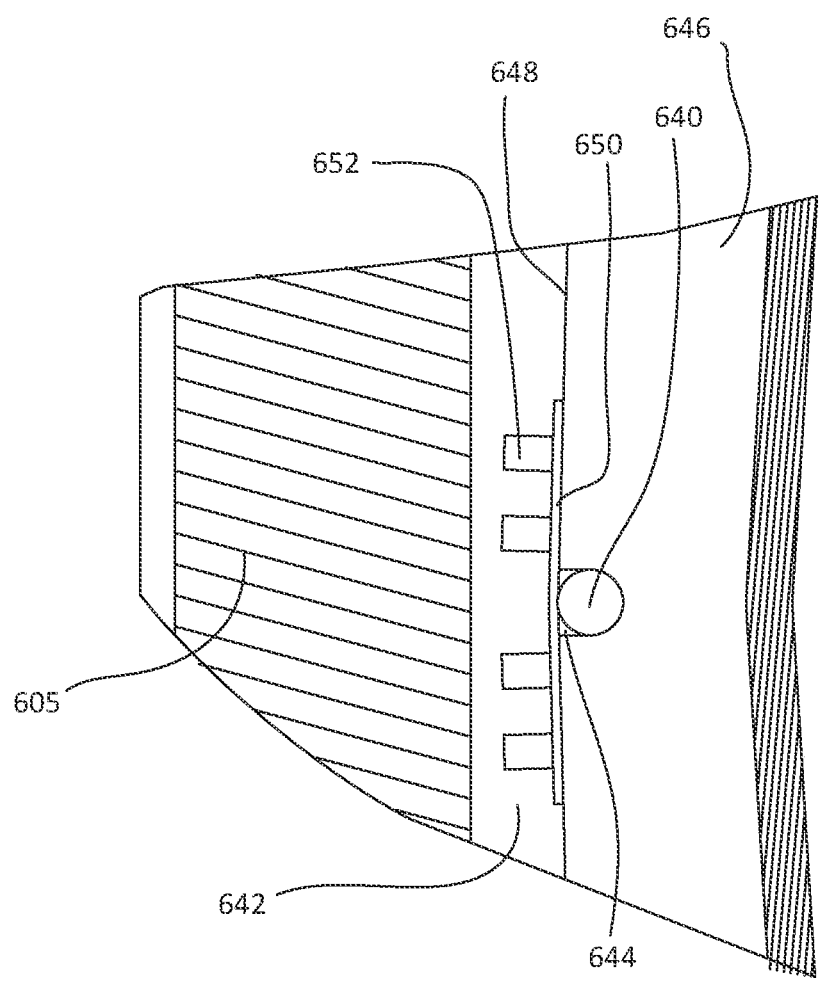
Figure 10E:
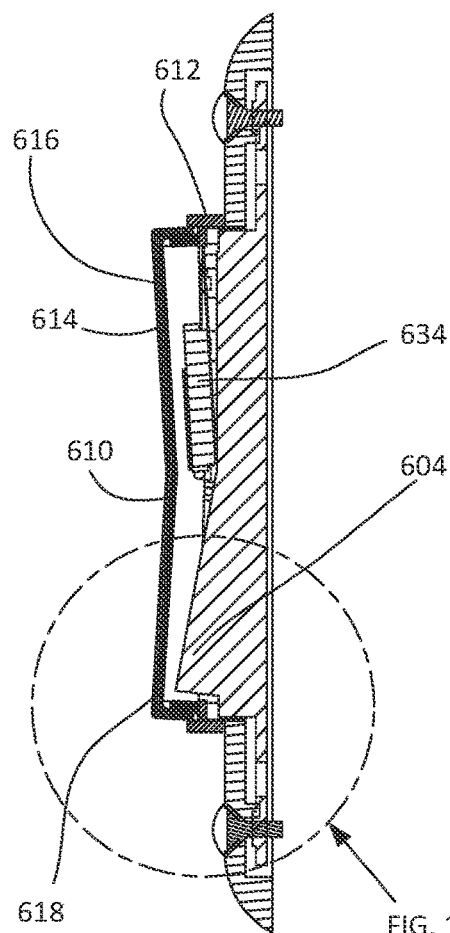
Figure 10F:
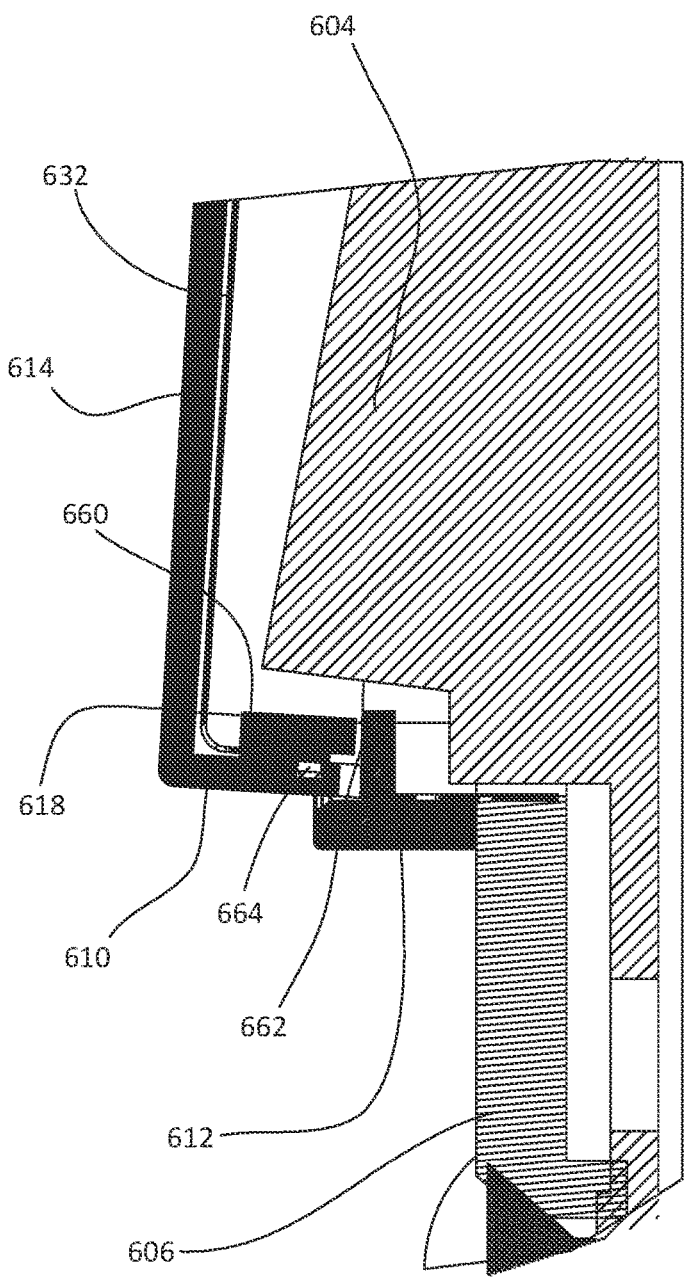

The actuation portion 610 may be configured for mechanical actuation of the actuator 611. For example, the actuator 611 may be supported about a pivot axis P1 that extends laterally between the upper and lower portions 616, 618. The actuation portion 610 may include mechanical switches 660 (as shown in FIG. 10F) disposed in respective interior portions of the actuator 611 that correspond to the upper and lower portions 616, 618 of the front surface 614. Actuations of the upper portion 616 of the front surface 614, for example via the application of a force to the upper portion 616 (e.g., resulting from a finger press) may cause the actuator 611 to rotate about the pivot axis P1 such that the upper portion 616 moves inward towards the base portion 612 and actuates a corresponding mechanical switch 660. Actuations of the lower portion 618 of the front surface 614, for example via the application of a force to the lower portion 618 (e.g., resulting from a finger press) may cause the actuator 611 to rotate about the pivot axis P1 such that the lower portion 618 moves inward towards the base portion 612 and actuates a corresponding mechanical switch 660. The actuation portion 610 may be configured such that feedback may be provided in response to actuations of actuator 611 (e.g., through movement of the actuation portion). The actuator 611 may be configured to resiliently reset to a rest position after actuations of the upper and lower portions 616, 618.

It should be noted that actuations of the upper portion 616 and lower portion 618 may not necessarily cause the actuator 611 to move (e.g., pivot about the pivot axis P1). The actuations may be detected via other mechanisms such as, for example, via a force sensor and/or a haptic feedback mechanism (e.g., a touch sensitive mechanism as described herein).

FIGS. 10A-10F depict the example remote control device 600, with the remote control device 600 unmounted from the light switch. As shown, the remote control device 600 may include a carrier 630 that may be configured to be attached to a rear surface of the actuation portion 610. The carrier 630 may support a flexible printed circuit board (PCB) 632 on which a control circuit (not shown) may be mounted. The remote control device 600 may include a battery 634 for powering the control circuit. The battery 634 may be received within a battery opening 636 defined by the carrier 630. The remote control device 600 may include a plurality of light-emitting diodes (LEDs) that may be mounted to the printed circuit board 632. The LEDs may be arranged to illuminate the light bar 620.

Figure 10G:
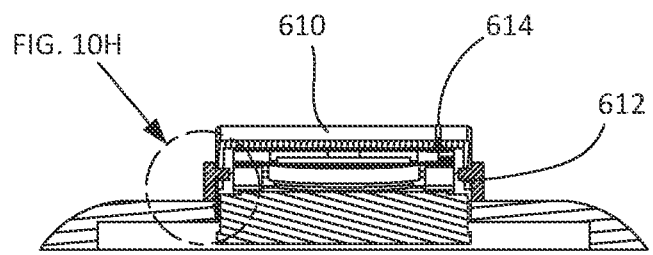
Figure 10H:
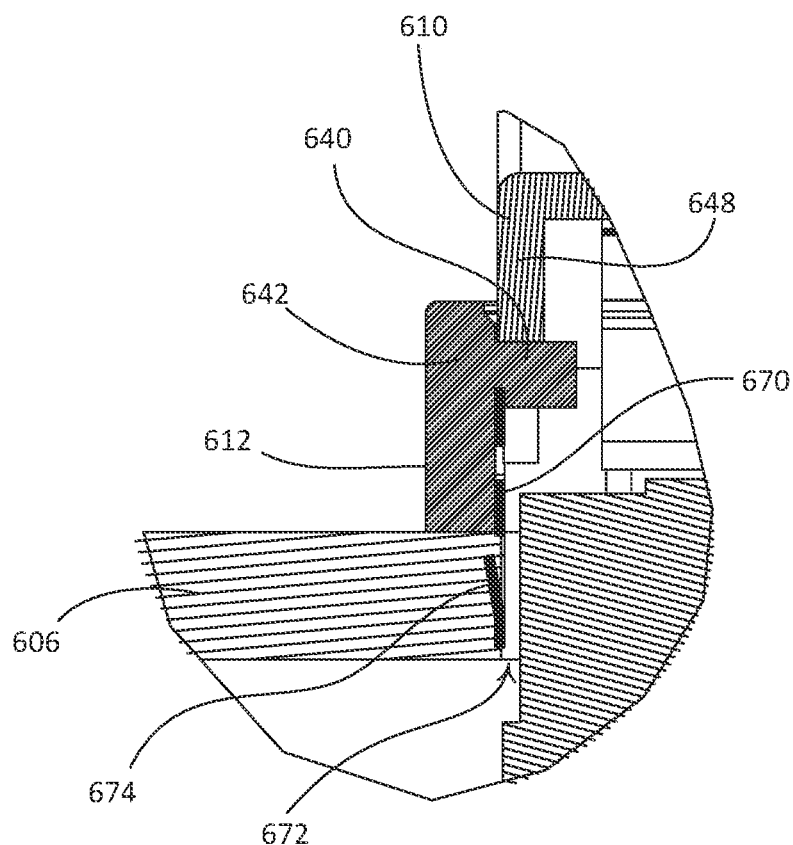

With reference to FIGS. 10G and 10H, the actuator 611 may be pivotally coupled to, or supported by, the base portion 612. For example, as shown the base portion 612 may define cylindrical protrusions 640 that extend outward from opposed sidewalls 642 of the base portion 612. The protrusions 640 may be received within openings 644 that extend into rear surfaces 648 of corresponding sidewalls 646 of the actuator 611. The protrusions 640 may define the pivot axis P1 about which the actuator 611 may pivot. As shown, each protrusion 640 may be held in place within a corresponding opening 644 by a respective hinge plate 650 (e.g., thin metal hinge plates). Each hinge plate 650 may be connected to the rear surface 648 of a respective sidewall 646, for example via heat stakes 652. It should be appreciated that for the sake of simplicity and clarity, the heat stakes 652 are illustrated in FIGS. 10G and 10H in an undeformed or unmelted state. The hinge plates 650 may be thin to maximize a distance between the hinge plate 650 and the bezel portion 605 of the light switch 602.

The remote control device 600 may transmit a control signal (e.g., a command) to one or more controlled electrical loads (e.g., one or more lighting loads that are controlled by the remote control device 600) in response to actuations applied to the actuation portion 610, for instance via the actuator 611. The remote control device 600 may transmit control signals (e.g., commands) to turn on one or more associated lighting loads in response to actuations applied to the upper portion 616 of the front surface 614, and may transmit control signals (e.g., commands) to turn off one or more lighting loads in response to actuations applied to the lower portion 618 of the front surface 614.

In accordance with an example implementation, the remote control device 600 may be configured to transmit control signals (e.g., commands) in response to receiving predetermined actuations at the actuation portion (e.g., via the actuator 611). For example, the remote control device 600 may be configured to transmit a control signal (e.g., a command) to turn one or more associated lighting loads on to full (e.g., 100% intensity) in response to a double tap applied to the upper portion 616 of the front surface 614 (e.g., two actuations applied to the upper portion 616 in quick succession). The remote control device 600 may be configured to transmit a control signal (e.g., a command) to perform a relative adjustment of intensity (e.g., relative to a starting intensity) in response to respective press and hold actuations applied to the upper and/or lower portions 616, 618 of the front surface 614. For example, the remote control device 600 may cause the respective intensities of one or more associated lighting loads to continually be adjusted (e.g., relative to corresponding starting intensities) while one of the upper or lower portions 616, 618 is continuously actuated.

The front surface 614 of the actuator 611 may further be configured as a touch sensitive surface (e.g., may include or define a capacitive touch surface). The capacitive touch surface may extend into portions of both the upper and lower surfaces 616, 618 of the front surface 614. This may allow the actuation portion 610 (e.g., the actuator 611) to receive and recognize actuations (e.g., point actuations and gestures) of the front surface 614. With such actuations, the actuator 611 may substantially maintains its position relative to the base portion (e.g., such actuations do not cause the actuator 611 to move relative to the base portion, or to move such that the respective mechanical switches 660 that correspond to the upper and lower portions 616, 618 are not actuated).

In accordance with the illustrated actuator 611, the upper portion 616 and the lower portion 618 of the front surface 614 define respective planar surfaces that are angularly offset relative to each other. In this regard, the touch sensitive portion of the front surface 614 of the actuator 611 may define and operate as a non-planar slider control of the remote control device 600. However, it should be appreciated that the actuator 611 is not limited to the illustrated geometry defining the upper and lower portions 616, 618. For example, the actuator may be alternatively configured to define a front surface having any suitable touch sensitive geometry, for instance such as a curved or wave-shaped touch sensitive surface.

It should be appreciated that the control circuit of the remote control device 600 may be configured to interpret one or more point actuations and/or gestures applied via the touch sensitive surface as commands to control an electrical load controlled by the remote control device 600. The gestures may be user-programmable, reprogrammable, and custom gestures. Further, the touch sensitive surface (e.g., a touch sensitive device residing behind the touch sensitive surface) may define one or more linear columns that may provide a Y-axis output, one or more linear rows that provide respective X-axis outputs, or any combination linear columns and rows. The touch sensitive surface (e.g., a touch sensitive device residing behind the touch sensitive surface) may also include, for example, a two-dimensional touch element having both X-axis and Y-axis outputs. Such implementations may enable the remote control device 600 to control multiple electrical loads. For example, gestures applied to a first capacitive touch column may cause commands to be issued to a first lighting load associated with the first capacitive touch column, gestures applied to a second capacitive touch column may cause commands to be issued to a second lighting load associated with the second capacitive touch column, and gestures applied simultaneously to both the first and second capacitive touch columns may cause a command to be issued to both the first and second lighting loads.

Further, the remote control device 600 may be configured to, if more than one actuation is received via the actuator 611 within a short interval of time (e.g., at substantially the same time), determine which actuation should be responded to, for example by transmitting a command, and which actuation or actuations may be ignored. To illustrate, a user of the remote control device 600 may press the touch sensitive surface at a location proximate to the light bar 620, with sufficient force such that the actuator 611 pivots about the pivot axis and activates a corresponding one of the mechanical switches 660. Such an operation of the actuator 611 may comprise multiple actuations of the actuation portion 610. For instance, the location of the press of the front surface 614 along the light bar 620 may correspond to an indication of a desired intensity level of an associated lighting load, while the actuation of the mechanical switch 660 may be correspond to an indication by the user to turn on the lighting load to a last-known intensity. The remote control device 600 may be configured to in response to such actuations, ignore the capacitive touch input indication of intensity, and to transmit a command to the associated lighting load to turn on at the last-known intensity. It should be appreciated that the above is merely one illustration of how the remote control device 600 may be configured to respond to multiple such multi-part actuations of the actuation portion 610.

Figure 11A:
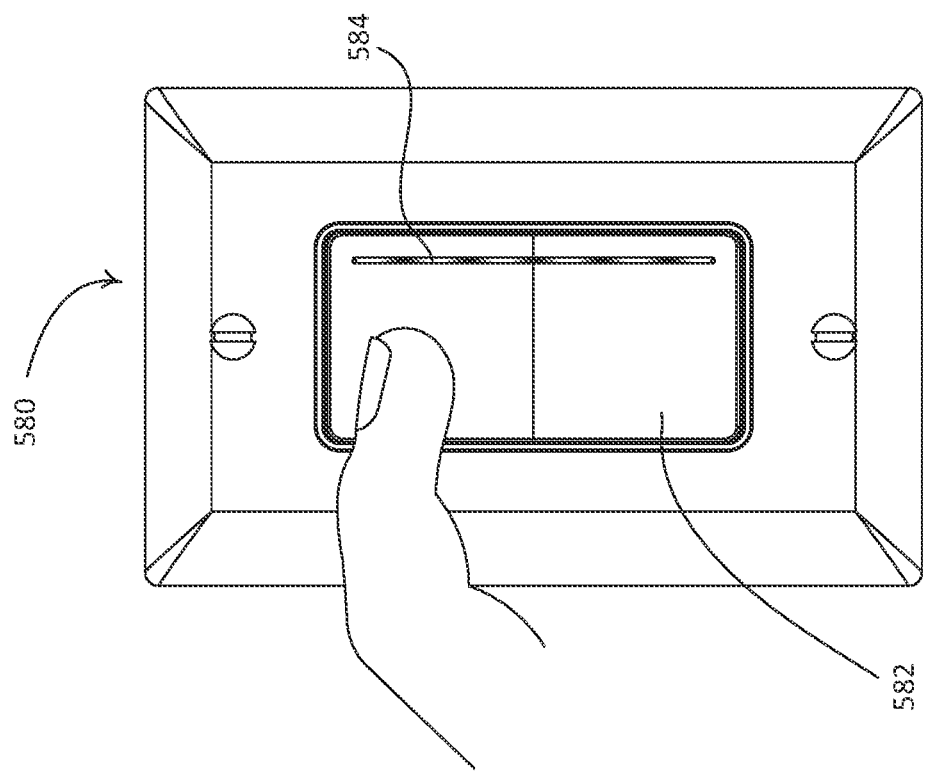
FIG. 11A depicts an example of applying absolute control over an electrical load using an example control device that may be deployed as a dimmer switch and/or a remote control device of the load control system illustrated in FIG. 1.
Figure 11B:
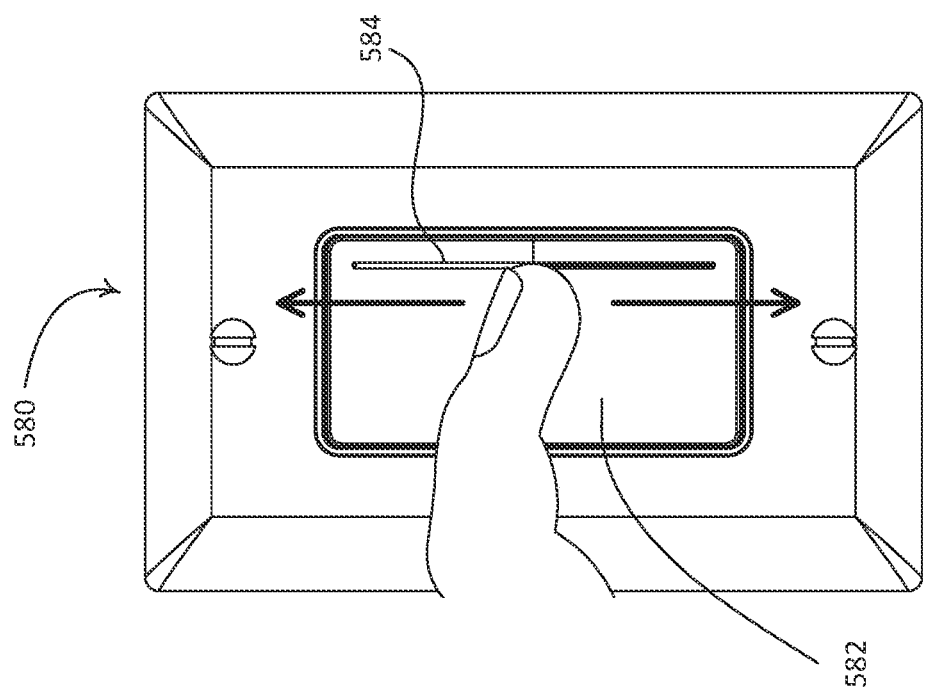
FIG. 11B depicts an example of applying relative control over an electrical load using the example control device illustrated in FIG. 11A.

FIGS. 11A-11H depicts an example control device 580 that may be deployed as the dimmer switch 110 and/or the retrofit remote control device 112 in the lighting control system 100, the control device 500, and/or the remote control device 600. FIGS. 11A and 11B depict examples of user inputs that may be recognized by the control device 580 and translated into respective control signals for adjusting an amount of power delivered to one or more electrical loads. The user inputs may be provided via a touch sensitive surface 582 of the control device 580, and may have different characteristics (e.g., in term of spatial and/or timing properties) so that they may be interpreted as commands to apply different types of control over the electrical loads. For example, in FIG. 11A, the user input may be characterized by a point actuation (e.g., a "tap") applied to an area of the touch sensitive surface 582 adjacent to a light bar 584. The user input may be detected by the touch sensitive surface 582, and cause a signal to be transmitted to a control circuit of the control device 580 to indicate the detection. The signal may be reflective of the characteristics of the aforementioned "tap." The control circuit may interpret the signal based on the characteristics reflected therein, and generate corresponding control data (e.g., a control signal) to control an electrical load controlled by the control device 580. For example, the control circuit may, in response to the user input depicted in FIG. 11A, generate control data (e.g., a control signal) to set an amount of power delivered to a plurality of electrical loads to an absolute level that is dependent upon the location of the user input. This way, as a user slides a finger along the light bar 584, the amount of power delivered to the electrical loads may be raised or lowered according to the position of the finger along the length of the light bar 584. The control circuit may rescale the adjustment amount that corresponds to a user input when the power level is near a low-end. The example rescaling techniques described in association with FIG. 4A is equally applicable here.

In FIG. 11B, the user input may be characterized by a non-transitory actuation (e.g., a press and hold) of the touch sensitive surface 582 that actuates either an upper portion 586 or a lower portion 588 of the touch sensitive surface. The control circuit may be configured to recognize such a user input as a "relative" input and generate corresponding control data (e.g., a control signal) to adjust (e.g., gradually adjust) an amount of power delivered to a plurality of electrical loads by a relative adjustment amount (e.g., relative to a starting level), while allowing the lighting loads to maintain respective absolute power levels that are different from one another. For example, the control circuit may cause the power delivered to the electrical loads to be continually adjusted (e.g., at a predetermined rate) for the duration of the user input. For example, the user may press and hold the upper portion 586 of the touch sensitive surface 582 to cause an increase of the amount of power delivered to the plurality of electrical loads by the relative adjustment amount (as shown in FIG. 11B), and press and hold the power portion 588 of the touch sensitive surface 582 to cause a decrease of the amount of power delivered to the plurality of electrical loads by the relative adjustment amount.

A user of the control device 580 may also apply a press-and-hold at a location of the touch sensitive surface 582 (e.g., at approximately a center of the touch sensitive surface), and at the same time apply a contemporaneous touch to a location of the touch sensitive surface 582 adjacent to the light bar 584. The touch sensitive surface 582 may detect these simultaneous user inputs, and signal the detection to the control circuit of the control device 580. The control circuit may be configured to, in response to the signaling, generate control data (e.g., a control signal) to adjust the respective amount of power delivered to the plurality of electrical loads by a relative amount. The relative amount of adjustment may be determined based on the location of the contemporaneous touch along the light bar 584.

In addition, the user input may be characterized by contacts by multiple fingers (e.g., two fingers) in an area of the touch sensitive surface 614 of the control device 580 adjacent to the light bar 584. In an example, such contacts may be a multi-finger slide applied by a user along the light bar 584. The control circuit may be configured to recognize such a user input as a command for relative control, and generate corresponding control data (e.g., a control signal) to adjust (e.g., gradually adjust) an amount of power delivered to a plurality of electrical loads by a relative adjustment amount (e.g., relative to a starting level), while allowing the lighting loads to maintain respective absolute power levels that are different from one another. For example, the control circuit may cause the power delivered to the electrical loads to be adjusted by a percentage based on how far the fingers slide up or down the touch sensitive surface 614. The adjustment may be made gradually (e.g., at a predetermined rate) as the fingers are moved across the touch sensitive surface 614. An illustrative example of relative control and example techniques for rescaling an adjustment amount have been provided in association with FIG. 4B (e.g., with reference to two lighting loads), and is equally applicable here.

The control circuit of the control device 580 may be configured to provide a visual indication in response to detecting the user inputs depicted in FIGS. 11A and 11B. For example, the control circuit may be configured to, upon receiving a signal that is indicative of a user command to set an amount of power delivered to an electrical load to an absolute level (e.g., as depicted in FIG. 11A), indicate the level on the light bar 584. For example, the control circuit may illuminate the light bar 584 to an intensity proportional to the absolute level (e.g., a higher intensity for a higher power level). Additionally or alternatively, the control circuit may illuminate the light bar 584 along a length that extends from the bottom of the light bar to a position along the length of the light bar. The length of such an illumination (e.g., as defined by an amount of the light bar 584 that is illuminated) may correspond to and be indicative of the absolute level of power delivered to the electrical load. The illumination may fade away after a predetermined amount of time, or be maintained until the next adjustment.

When relative control is being applied, the control circuit may be configured to illuminate the light bar 584 into multiple segments of varying intensities or colors, as illustrated in FIG. 11B. The control circuit may be further configured to successively alter the intensities or colors of the multiple segments as the user input for relative control is being applied, so that a moving scrollbar and/or ridges of a scroll wheel may be imitated on the light bar 584 to indicate that the power delivered to the electrical load is being gradually adjusted (e.g., by a predetermined amount at a time). Alternatively, the control circuit may be configured to illuminate the light bar 584 (e.g., in a manner similar to the indication of an absolute power level described above) to indicate an average of the power levels delivered to a plurality of electrical loads.

Figure 11D:
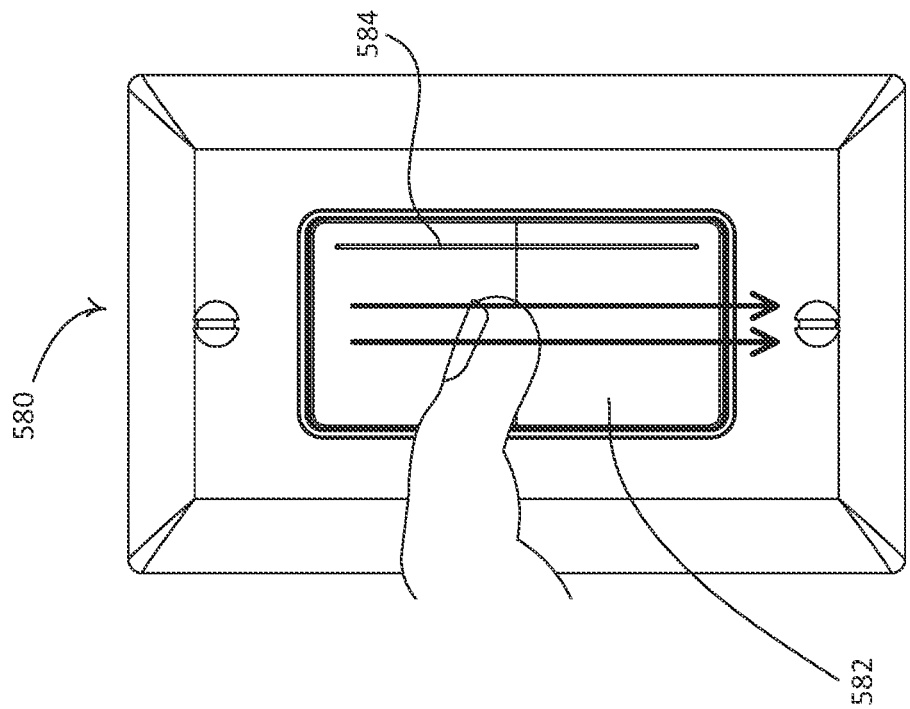
FIG. 11D depicts another example of using a gesture to control an electrical load via the example control device illustrated in FIG. 11A.
Figure 11C:
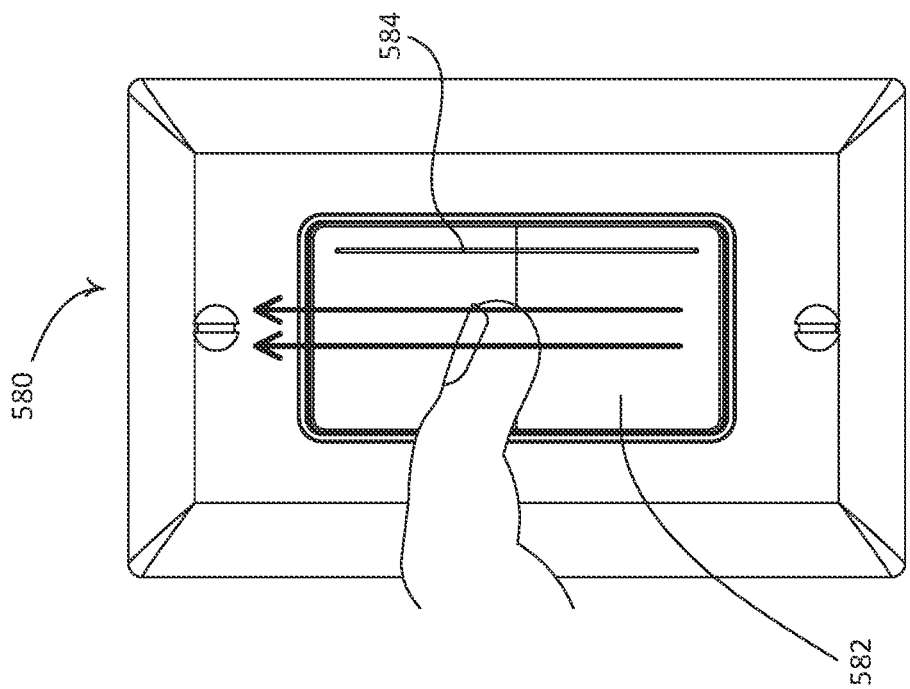
FIG. 11C depicts an example of using a gesture to control an electrical load via the example control device illustrated in FIG. 11A.

FIGS. 11C and 11D depict examples of additional user inputs (e.g., such as gestures) that may be recognized by the control device 580 and translated into control signals for controlling an electrical load. The user inputs may be applied via the touch sensitive surface 582 of the control device 580 with or without physically contacting the touch sensitive surface. As shown, the user input may be an upward "swipe" gesture, as described herein. The user input may cause a signal to be transmitted to the control circuit of the control device 580. The signal may indicate to the control circuit that the user input has the characteristics of an upward "swipe" gesture. The control circuit may interpret the signal based on the characteristics reflected therein, and generate corresponding control data (e.g., a control signal) to control an electrical load controlled by the control device 580.

Similarly, as shown in FIG. 11D, the user input may be a downward "swipe" gesture, as described herein. Such a user input may cause a signal to be transmitted to the control circuit of the control device 580, and the signal may be reflective of the characteristics of a downward "swipe" gesture. The control circuit may interpret the signal based on the characteristics reflected therein, and generate corresponding control data (e.g., a control signal) to control an electrical load controlled by the control device 580.

Although FIGS. 11C and 11D depict the "swipe" gestures as upward and downward swipes, it should be appreciated that a swipe motion can be applied in other directions and/or manners. For example, a swipe may be applied in a horizontal direction in a left-to-right or right-to-left direction, or diagonally from one area of the touch sensitive surface to another. The scope of the disclosure herein with respect to a "swipe" is not limited to any particular manner in which the swipe is applied.

The control circuit of the control device 580 may be configured to interpret a user input corresponding to a "swipe" gesture as a command for an associated electrical load to enter a particular state. Such a particular state may be predetermined, and may correspond to, for example, an on/off state of the electrical load, a specific power level of the electrical load (e.g., a desired intensity level of a lighting load), a particular setting of the electrical load (e.g., a temperature setting of an HVAC system), and/or the like. For example, upon receiving a signal indicative of a "swipe" gesture in an upward direction, the control circuit may be configured to generate control data (e.g., a control signal) to cause a lighting load to go to a full intensity dimming level (e.g., a high-end intensity). And upon receiving a signal indicative of a "swipe" gesture in a downward direction, the control circuit may be configured to generate control data (e.g., a control signal) to cause a lighting load to go to a minimal dimming level (e.g., a low-end intensity, such as 1% or off).

The control circuit of the control device 580 may be configured to interpret a user input corresponding to a "swipe" gesture as a command to switch the control device 580 into a specific operational mode. Such an operational mode may be, for example, an intensity control mode or a color control mode for a lighting load, a preset selection mode, an absolute or relative power control mode, and/or the like. For example, the control device 580 may be configured to, by default, operate in an intensity control mode. Upon receiving a signal indicative of a "swipe" gesture in a right-to-left direction, the control circuit may be configured to switch the control device 580 from the intensity control mode to a color control mode.

The control circuit of the control device 580 may be configured to provide a visual indication in response to detecting the user inputs depicted in FIGS. 11C and 11D. For example, if the control circuit is configured to put an associated electrical load into a particular state in response to detecting a "swipe" gesture, the control circuit may be further configured to illuminate the light bar 584 to indicate the particular state. For instance, upon controlling a lighting load to go to a full intensity dimming level (e.g., a high-end intensity) or a minimal dimming level (e.g., a low-end intensity, such as 1% or off), the control circuit may illuminate the light bar 584 to indicate the respective dimming levels, as described above.

Relevant features described herein with reference to FIGS. 11C and 11D may be applicable to other types of user inputs. For example, the touch sensitive surface 582 of the control device 580 may be configured to be responsive to a "tap" or "poke" applied at a specific location of the touch sensitive surface. Such a "tap" or "poke" may, for example, be characterized by a touch-and-release, as described herein. The control circuit of the control device 580 may be configured to interpret such a user input as a command for an associated electrical load to go to a desired power level, such as a command for a lighting load to go to a desired dimming level. The desired power level may be dependent upon a location of the touch sensitive surface 582 at which the "tap" or "poke" is detected (e.g., such as a position along the light bar 584). The control circuit may generate control data (e.g., a control signal) to cause the command to be executed.

The touch sensitive surface 582 of the control device 580 may be configured to be responsive to a "smack" gesture, as described herein. The control circuit of the control device 580 may be configured to interpret such a gesture as a command to toggle a state of an associated electrical load, for example from on to off or from off to on. In an example, the control circuit may be configured to, upon toggling an associated electrical load on in response to a "smack" gesture, put the associated electrical load into a last-known state (e.g., a state before the associated electrical load was turned off). Alternatively or additionally, the control circuit may be configured to interpret a "smack" gesture as a command for an associated electrical load to enter a predetermined state, including, for example, a particular power state of the electrical load (e.g., a desired intensity level of a lighting load), a particular setting of the electrical load (e.g., a temperature setting of an HVAC system), and/or the like.

The control device 580 may be used to control the color of light emitted by a lighting load. To facilitate color control operations, the control circuit of the control device 580 may be configured to provide one or more visual indications on a front surface of the control device 580 to assist with the color control operations. Such visual indications may be provided, for example, on the touch sensitive surface 582. The visual indications may include a color gradient and/or one or more backlit virtual buttons that may be used to adjust a color setting of the lighting load.

Figure 11F:
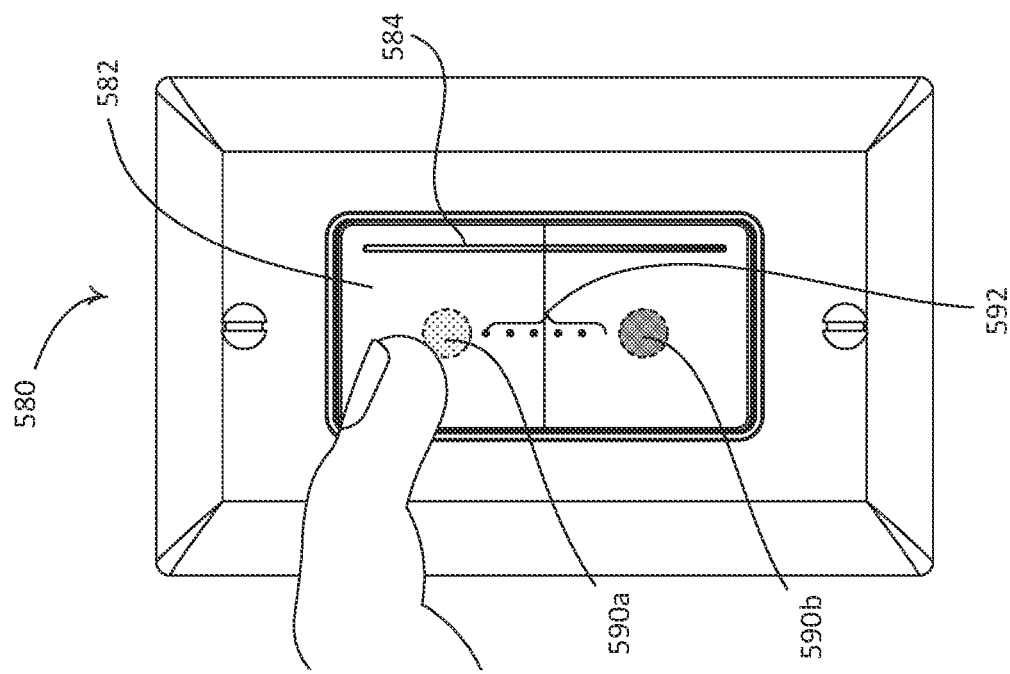
FIG. 11F depicts an example of applying color control over a lighting load using backlit virtual buttons located on the example control device illustrated in FIG. 11A.
Figure 11E:
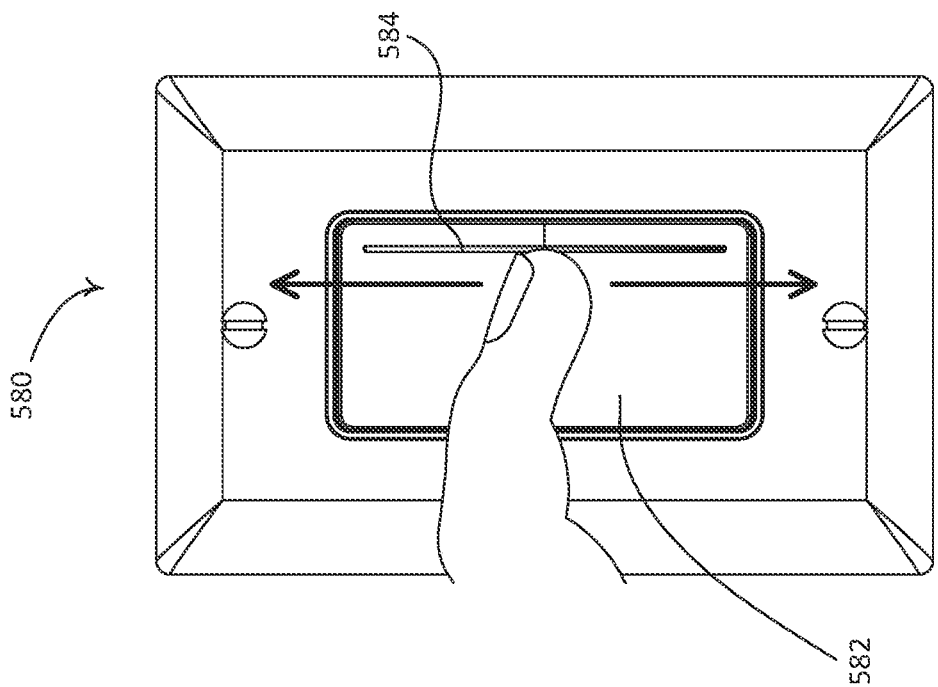
FIG. 11E depicts an example of applying color control over a lighting load using a light bar located on the example control device illustrated in FIG. 11A.

FIG. 11E depicts an example of a color gradient that may be provided on the control device 580 to facilitate a color control operation. A color gradient, as described above, may refer to any visual representation of a set of colors arranged in accordance to an order. The number of colors and the order in which those colors are arranged may vary from one implementation to the next, and should not limit the scope of this disclosure. Further, in the example shown in FIG. 11E, a color gradient is provided on the light bar 584. It should be appreciated, however, that the presentation of such a color gradient is not limited to any particular location, and does not need to be in a bar shape. Further, it should be noted that the color gradient may be applied to the colors associated with the color temperatures of a black body radiator.

The control circuit of the control device 580 may be configured to present the color gradient in response to a user input. The user input may be, for example, a gesture applied to the touch sensitive surface 582 of the control device 580 (e.g., a "swipe" or "smack" gesture). The control circuit may be configured to be responsive to such a gesture and illuminate the light bar 584 to present the color gradient in response. Alternatively or additionally, the user input may be a gesture effectuated without any physical contact with the control device 580. For example, the touch sensitive surface 582 of the control device 580 may be configured to detect a finger or hand hovering over the touch sensitive surface 582, and transmit a signal to the control circuit indicating such detection (e.g., the detection may more generally indicate proximity of a user to the control device 580). The control circuit may, in response to receiving the signal, illuminate the light bar 584 to present the color gradient.

The control circuit of the control device 580 may be configured to present the color gradient in different ways. In an example, the control circuit may illuminate the light bar 584 with multiple colors each centering in a portion of the light bar 584 and gradually transitioning into the color of a neighboring portion. The different colors may be arranged in an order reflective of the respective red/green/blue (RGB) values of the colors, for example. Each of the colors displayed on the light bar 584 (e.g., the location of the corresponding colors) may correspond to a desired color for one or more lighting loads controlled by the control device 580. The relationship between desired light colors for the lighting loads and positions along the color gradient (e.g., the respective locations of the colors on the light bar 584) may be stored, for example, in a memory of the control device 580.

To select a color for the one or more lighting loads, a user of the control device 580 may actuate an area of the touch sensitive surface 582 adjacent to one of the multiple colors displayed on the light bar 584. The actuation may be, for example, a point actuation (e.g., a "tap" or "poke"). The touch sensitive surface 582 may be configured to detect the actuation, and cause a signal to be transmitted to the control circuit to indicate the actuation (e.g., indicate the location of the actuation). Upon receiving the signal, the control circuit may determine a color corresponding to the location of the actuation, and generate control data (e.g., a control signal) to set a color of the one or more lighting loads to the determined color. For instance, the control circuit may be capable of identifying which one of the colors of the gradient displayed on the light bar 584 is adjacent to the location of actuation, and set the color of the lighting loads to the color corresponding to the location along the color gradient. This way, as a user slides a finger along the light bar 584, the color of the lighting loads may be adjusted accordingly based on the position of the finger along the length of the light bar 584.

A user of the control device 580 may manipulate the touch sensitive surface 614 to change the color gradient displayed on the light bar 584. For example, the control circuit of the control device 580 may initially illuminate the light bar 584 into a first set of colors (e.g., to display a first color gradient on the light bar 584). Each of the first set of colors may represent a section of the visible color spectrum that corresponds to a specific wavelength range. A user of the control device 580 may actuate an area of the touch sensitive surface 582 adjacent to one of the first set of colors. The actuation may be, for example, a two-finger "open" gesture (e.g., fingers moving apart) or a force (e.g., via a finger press) applied next to one of the first set of colors. The touch sensitive surface 582 may be configured to detect the actuation, and cause a signal to be transmitted to the control circuit to indicate the actuation. The control circuit may determine, based on the signal, a section of the color spectrum that corresponds to the location of the actuation, and adjust the illumination of the light bar so that the first set of colors is replaced with a second set of colors (e.g., to display a second color gradient on the light bar 584). The second set of colors may correspond to colors that are within the section of the color spectrum associated with the location of the actuation (e.g., the second color gradient may represent a smaller range of the first color gradient). A user may then set a color for one or more lighting loads controlled by the control device 580 by actuating an area of the touch sensitive surface 582 next to one of the second set of colors, as described above.

While the second set of colors (e.g., the second color gradient) is displayed on the light bar 584, the control circuit may be configured to, in response to a user input, change the display to revert to the first set of colors (e.g., the first color gradient). For example, the control circuit may receive a signal indicating that of a two-finger "pinch" gesture (e.g., fingers moving together) or a force (e.g., applied via a finger press) is detected by the touch sensitive surface 582 in an area adjacent to the second color gradient. The control circuit may interpret such a signal as a command to switch the display on the light bar 584 back to the first color gradient, and may effectuate the switch accordingly.

FIG. 11F depicts an example of another mechanism for adjusting a color (e.g., color temperature) of one or more lighting loads controlled by the control device 580. Although described with reference to color temperature control, it should be appreciated that the mechanism and user control described with reference to FIG. 11F may also be applied to full range color control. As shown, areas of the touch sensitive surface 582 of the control device 580 may be backlit to display soft or virtual buttons 590a, 590b, and/or indicator lights 592. The virtual buttons 590a, 590b and/or indicator lights 592 may be configured to be backlit by one or more light sources (e.g., LEDs). The control circuit of the control device 580 may be configured to dim the backlighting (e.g., turn off the backlighting or make it not easily perceivable by a user) when the control device 580 is in a different operational mode or in an idle state so that a first user interface may be presented to a user of the control device 580. The control circuit may then illuminate the backlighting to reveal the virtual buttons 590a, 590b and/or the indicator lights 592 in response to a user input or a particular event (e.g., a predetermined timing event) so that a second user interface may be presented to the user. Alternatively, the control circuit may be configured to maintain the backlighting in an "on" state so that the virtual buttons are always shown on the control device 580.

The user input that may trigger the display of the virtual buttons 590a, 590b and/or the indicator lights 592 may be, for example, a touch-based gesture applied to the touch sensitive surface of the control device 580 (e.g., a "swipe" or "smack" gesture). Alternatively or additionally, the user input may be a gesture effectuated without any physical contact with the control device 580. For example, the touch sensitive surface 582 of the control device 580 may be configured to detect a finger or hand hovering over the touch sensitive surface, and cause a signal to be transmitted to the control circuit to indicate the detection (e.g., the detection may more generally indicate proximity of a user to the control device 580). The control circuit may, in response to receiving the signal, activate the backlighting to reveal the virtual buttons 590a, 590b and/or the indicator lights 592.

The areas of the touch sensitive surface 582 that correspond to the virtual buttons 590a, 590b may be associated with adjusting (e.g., increasing and decreasing) the color temperature of one or more lighting loads controlled by the control device 580. For example, a user of the control device 580 may actuate the area of the touch sensitive surface 582 occupied by virtual button 590a. The actuation may be, for example, a point actuation (e.g., a "tap" or "poke"). The actuation may cause a signal to be transmitted to the control circuit indicating that virtual button 590a has been actuated. The control circuit may interpret the actuation as a command to increase the color temperature of the lighting loads, and generate control data (e.g., a control signal) to effectuate the increase accordingly. The increase may be, for example, a gradual increase (e.g., by a predetermined amount at each step) while the actuation (e.g., a press-and-hold) lasts, or a one-time increase (e.g., by a predetermined amount) in response to the actuation (e.g., a "tap").

Similarly, the touch sensitive surface 582 may be configured to detect that the area of the touch sensitive surface 582 occupied by the virtual buttons 590a has been actuated. The actuation may be, for example, a point actuation (e.g., a "tap" or "poke"). The touch sensitive surface 582 may detect the actuation, and cause a signal may be transmitted to the control circuit indicating that the actuation has occurred. The control circuit may be configured to interpret the actuation as a command to decrease the color temperature of the lighting loads, and generate a control data (e.g., a control signal) to effectuate the decrease accordingly. The decrease may be, for example, a gradual decrease (e.g., by a predetermined amount at each step) while the actuation (e.g., a press-and-hold) lasts, or a one-time decrease (e.g., by a predetermined amount) in response to the actuation (e.g., a "tap").

The control circuit of the control device 580 may be configured to illuminate the indicator lights 592 to provide feedback about color temperature adjustments in response to the virtual buttons 590a, 590b being actuated. For example, as the user actuates the virtual button 590a, the indicator lights 592 may be turn on one after another from bottom up to signal that the color temperature of the lighting load is being increased. As the user actuates the virtual button 590b, the indicator lights 592 may be turned off one after another from top to bottom to signal that the color temperature of the lighting load is being decreased.

The control circuit of the control device 580 may be further configured to illuminate the light bar 584 to indicate a current color temperature of the one or more lighting loads controlled by the remote control device 580. For example, the control circuit may illuminate the light bar 584 to different intensities and/or lengths in proportion to a current color temperature of the one or more lighting loads. For instance, the light bar 584 may be illuminated to a higher intensity and/or a greater length in response to a higher color temperature.

The control device 580 may be used to activate a preset, zone, or operational mode associated with one or more electrical loads. A preset may correspond to one or more predetermined settings of the one or more electrical loads. For example, a preset may correspond to a preconfigured lighting scene (e.g., predetermined intensity/color settings of one or more lighting loads), a preconfigured combination of entertainment settings (e.g., music selection, volume of speakers, etc.), a preconfigured combination of environmental settings (e.g., temperature, humidity, shades, etc.), and/or the like. Such presets may be configured via the control device 580 and/or via an external device (e.g., a mobile device) by way of a wireless communication circuit of the control device 580. A zone may correspond to one or more electrical loads that are configured to be controlled by the control device 580. A zone may be associated with one specific location (e.g., a living room) or multiple locations (e.g., an entire house with multiple rooms and hallways). An operational mode of the control device 580 may be associated with controlling different types of electrical loads or different operational aspects of one or more electrical loads. Examples of operational modes may include a lighting control mode for controlling one or more lighting loads (e.g., controlling intensity and/or color of the lighting loads), an entertainment system control mode (e.g., controlling music selection and/or the volume of an audio system), an HVAC system control mode, a winter treatment device control mode (e.g., for controlling one or more shades), and/or the like. Once configured, the presets may be stored by the control device 580 in memory.

Figure 11H:
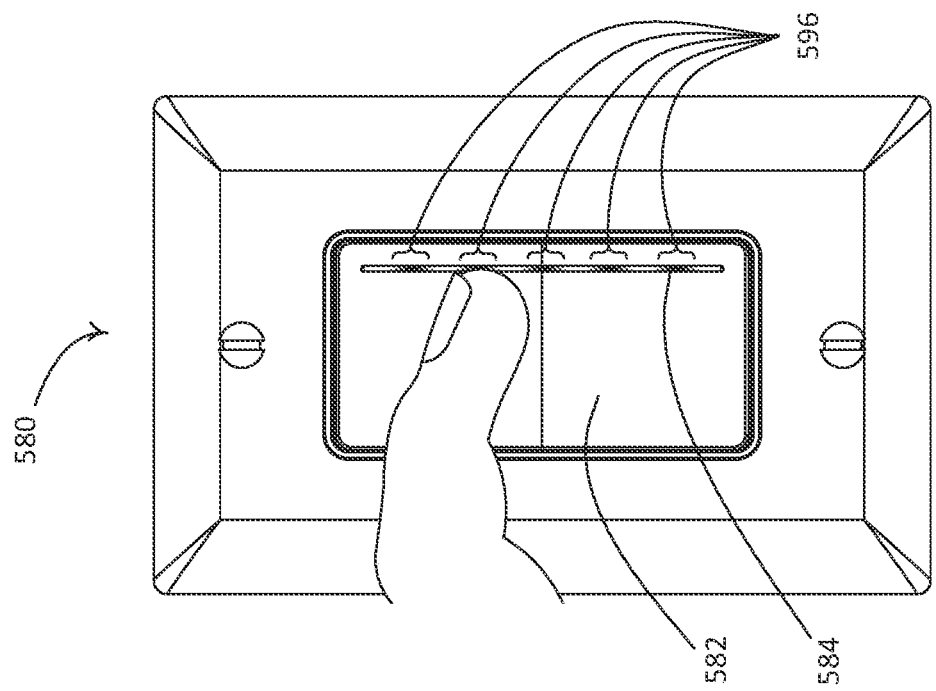
FIG. 11H depicts an example of preset selection using a light bar located on the example control device illustrated in FIG. 11A.
Figure 11G:
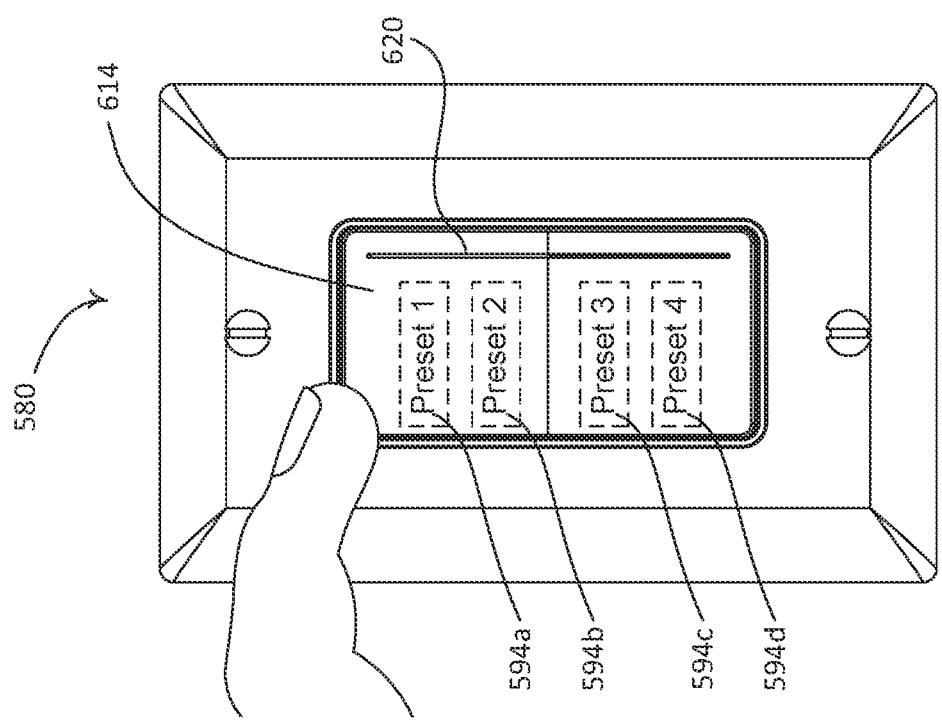
FIG. 11G depicts an example of preset selection using backlit virtual buttons located on the example control device illustrated in FIG. 11A.

FIG. 11G depicts an example of a user interface that may be provided on the touch sensitive surface 582 of the control device 580 to facilitate preset, zone, and operational mode selection. As shown, areas of touch sensitive surface 582 may be illuminated (e.g., backlit) to display soft or virtual buttons 594a, 594b, 594c, 594d. The illuminated areas may have different shapes, such as, for example, circles, squares, rectangles, etc. The areas may be thinned out compared to the rest of the touch sensitive surface 582 to allow backlighting to emit through the thinned-out areas. The areas may be associated with respective indicia (e.g., texts or graphics) that indicate the purposes of the virtual buttons 594a-594d. Backlighting may be provided, for example, by one or more light sources (e.g., LEDs). The control circuit of the control device 580 may be configured to dim the backlighting (e.g., turn off the backlighting or make it not easily perceivable by a user) when the control device 580 is in a different operational mode or in an idle state so that a first user interface may be presented to a user of the control device 580. The control circuit may then illuminate the backlighting to reveal the virtual buttons 594a-594d in response to a user input or a particular event (e.g., a predetermined timing event) so that a second user interface may be presented to the user. Alternatively, the control circuit may be configured to maintain the backlighting in an "on" state so that the virtual buttons are always shown on the control device 580.

The user input that may trigger the display of the virtual buttons 594a-594d may be, for example, a gesture applied to the touch sensitive surface 582 of the control device 580 (e.g., a "swipe" or "smack" gesture). Such a gesture may be detected by the touch sensitive surface 614, which may transmit a signal to the control circuit to indicate the detection. The control circuit may, in response to receiving the signal, activate the backlighting to reveal the virtual buttons 594a-594d. Alternatively or additionally, the user input may be a gesture effectuated without any physical contact with the control device 580. For example, the touch sensitive surface 582 of the control device 580 may be configured to detect a finger or hand hovering over the touch sensitive surface 582, and cause a signal to be transmitted to the control circuit to indicate such detection (e.g., the detection may more generally indicate proximity of a user to the control device 580). The control circuit may, in response to receiving the signal, activate the backlighting to reveal the virtual buttons 594a-594d.

The areas of the touch sensitive surface 582 that correspond to the virtual buttons 594a-594d may be designated for activating respective presets, zones, or operational modes associated with one or more electrical loads controlled by the control device 580. The association between the virtual buttons 594a-594d (e.g., locations of the virtual buttons 594a-594d) and the presets, zones, or operational modes may be stored, for example, in a memory of the control device 580. To illustrate, a user of the control device 580 may actuate the area of the touch sensitive surface 582 occupied by virtual button 594a. The actuation may be, for example, a point actuation (e.g., a "tap" or "poke"). In response to the actuation, a signal may be transmitted to the control circuit of control device 580 indicating that virtual button 594a has been actuated. The control circuit may interpret the actuation as a command to activate a first preset (e.g., a lighting scene), a first zone (e.g., a hallway zone), or a first operational mode (e.g., a lighting control mode), and generate control data (e.g., a control signal) to effectuate the activation accordingly.

Similarly, the touch sensitive surface 582 may be configured to detect that the area of the touch sensitive surface 582 occupied by virtual button 594b (or 594c or 594d) has been actuated by, for example, a point actuation (e.g., a "tap" or "poke"). In responsive, a signal may be transmitted to the control circuit to indicate the actuation. The control circuit may interpret the actuation as a command to activate another preset (e.g., an entertainment scene), zone (e.g., an entire house), or operational mode (e.g., an HVAC control mode), and may generate control data (e.g., a control signal) to effectuate the activation accordingly.

The control circuit may be further configured to provide an indication about which preset, zone, or operational mode has been activated. For example, the control circuit may illuminate the light bar 584 in different manners (e.g., with varying intensity and/or color) corresponding to different presets, zones, or operational modes being activated. Alternatively or additionally, the control circuit may uniquely illuminate the virtual button associated with an activated preset, zone, or operational mode (e.g., to cause the virtual button to flash) to inform the user of the activated preset, zone, or operational mode.

A user may use a gesture to cycle through a plurality of presets, zones, or operational modes on the touch sensitive surface 582 of the control device 580. For example, there may be more presets, zones, or operational modes configured in a load control system than what can be displayed on the touch sensitive surface 582. In those scenarios, a user may apply a gesture (e.g., a "swipe") via the touch sensitive surface 582, and the control circuit may be configured to, in response to the gesture, replace a first set of presets, zones, or operational modes that may be activated via the virtual buttons 594a-594d with a second set. This way, the user may be able to cycle through all available presets, zones, or operational modes to choose one that meets the user's needs. The control circuit may be further configured to change the indicia associated with the virtual buttons 594a-594d to indicate currently associated presets, zones, or operational modes.

FIG. 11H depicts another example of a user interface that may be provided on the touch sensitive surface 582 of the control device 580 to facilitate preset, zone, and operational mode selections. As shown, the control circuit of the control device 580 may illuminate the light bar 584 to display discrete points 596 of illumination. For example, the discrete points 596 may correspond to different segments of the light bar 584 illuminated to different intensities and/or colors, or segments of the light bar 584 that may be illuminated to a same intensity and/or color but separated by segments of different intensities and/or colors. Each of the discrete points 596 (e.g., the location of each discrete point) may correspond to a preset, zone, or operational mode associated with one or more electrical loads controlled by the control device 580. The illumination of the discrete points 596 may be based on their respective associated presets, zones, or operational modes. For example, when a preset corresponds to a lighting scene, the corresponding discrete point on the light bar 584 may be illuminated to display the dominant color of the lighting scene. Alternatively, the illumination of the corresponding discrete point on the light bar 584 may be periodically altered (e.g., at a predetermined rate) to display each light color of the lighting scene (e.g., to cycle through the colors of the lighting loads in the lighting scene). The relationship between the presets, zones, or operational modes and the discrete points 596 of the light bar 584 (e.g., the respective locations of the illuminated segments) may be stored, for example, in a memory of the control device 580. The control circuit of the control device 580 may be configured to keep the light bar 584 illuminated in the aforementioned manner. Alternatively, the control circuit may be configured to dim the light bar 584 (e.g., turn off the illumination or make it not easily perceivable by a user) when the control device 580 is in a different operational mode or in an idle state, and illuminate the light 584 620 to reveal the multiple discrete points in response to a user input or a particular event (e.g., a predetermined timing event).

The user input that may trigger the display of the discrete points 596 of illumination on the light bar 584 may be, for example, a gesture applied to the touch sensitive surface 582 of the control device 580 (e.g., a "swipe" or "smack" gesture). Alternatively or additionally, the user input may be a gesture effectuated without any physical contact with the control device 580. For example, the touch sensitive surface 582 of the control device 580 may be configured to be responsive to a finger or hand hovering over the touch sensitive surface 582, and transmit a signal to the control circuit to indicate the detection (e.g., the detection may more generally indicate proximity of a user to the control device 580). The control circuit may, in response to receiving the signal, illuminate the light bar 584 to display the multiple discrete points 596 for preset selection.

To activate a specific preset, zone, or operational mode, a user of the control device 580 may manipulate an area of the touch sensitive surface 614 adjacent to one of the discrete points 596 of illumination on the light bar 584 to cause an actuation of the touch sensitive surface 582. The actuation may be, for example, a point actuation (e.g., a "tap" or "poke"). The touch sensitive surface 582 may be configured to detect the actuation, and transmit a signal to the control circuit indicating the actuation. Upon receiving the signal, the control circuit may determine a location of the actuation, and generate control data (e.g., a control signal) to activate the preset, zone, or operational mode associated with the determined location (e.g., based on the stored relationship described above).

The control circuit may be further configured to provide an indication of which preset, zone, or operational mode has been activated. For example, once a user has activated a preset, zone, or operational mode, the control circuit may uniquely illuminate the segment of the light bar 584 corresponding to the activated preset, zone, or operational mode. The unique illumination may be realized, for example, by flashing the relevant segment or illuminating the segment with a higher intensity so that it is highlighted relative to the other segments.

In addition to or in lieu of the user interfaces described with reference to FIGS. 11G and 11H, the control circuit of the control device 580 may be configured to associate particular user gestures with presets, zones, or operational modes, and generate control data (e.g., a control signal) to activate a preset, zone, or operational mode in response to detecting an associated gesture. The gestures may be applied via the touch sensitive surface 582 of the control device 580. The gestures may be applied by direct contact with the touch sensitive surface 582 of the control device 580 (e.g., a "swipe," a "smack," etc.), via proximity of anatomy to the touch sensitive surface 582 (e.g., by hovering a finger over the touch sensitive surface 582), or otherwise. The association of user gestures with presets, zones, or operational modes may be user-programmable and reprogrammable. The association may be stored, for example, in a memory of the control device 580. The touch sensitive surface 582 may be configured to detect a gesture, and transmit a signal to a control circuit of the control device 580 to indicate the detection of the gesture. The control circuit may, in response, identify a preset, zone, or operational mode associated with the gesture, and generate control data (e.g., a control signal) to activate the preset, zone, or operational mode.

Although described as separate mechanisms and user inputs in FIG. 11A-11H, it should be appreciated that the control device 580 may incorporate any number and/or combinations of the mechanisms and user inputs described with reference to FIG. 11A-H.

Figure 12:
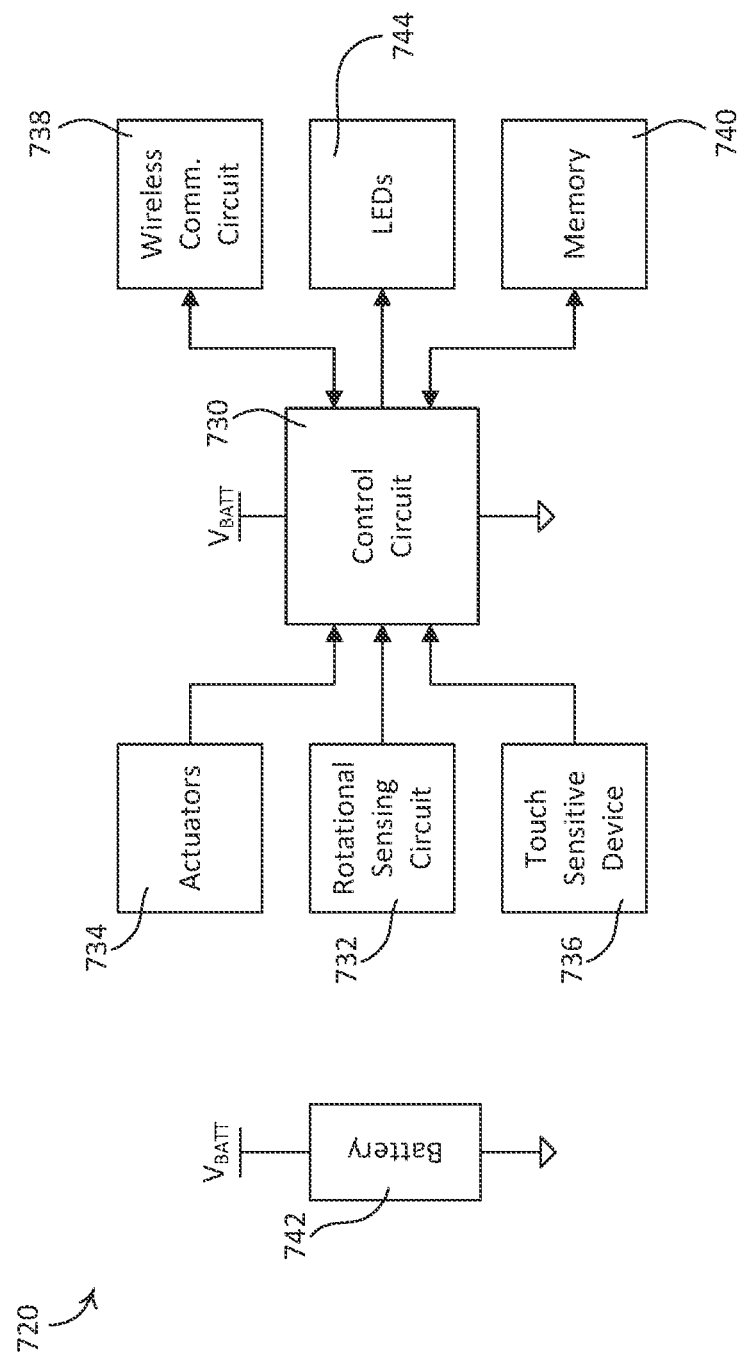
FIG. 12 shows a simplified equivalent schematic diagram of an example control device that may be deployed as a remote control device of the load control system illustrated in FIG. 1.

FIG. 12 is a simplified equivalent schematic diagram of an example control device 700 (e.g., a remote control device), which may be deployed as the remote control devices 112-118 in the lighting control system 100, the control devices 200, 280, 300, 380, 500, 580, and/or the remote control devices 220, 310, 600. The control device 700 may include a control circuit 730, a rotational sensing circuit 732, one or more actuators 734 (e.g., buttons and/or switches), a touch sensitive device 736, a wireless communication circuit 738, a memory 740, a battery 742, and/or one or more LEDs 744. The memory 740 may be configured to store one or more operating parameters (e.g., such as a preconfigured color scene or a preset light intensity) of the control device 700. The battery 742 may provide power to one or more of the components shown in FIG. 12.

The rotational sensing circuit 732 may be configured to translate a force applied to a rotating mechanism (e.g., such as the rotational portion 305 of the control device 300) into an input signal and provide the input signal to the control circuit 730. The rotational sensing circuit 732 may include, for example, a Hall-effect sensor, a mechanical encoder, and/or an optical encoder. The rotational sensing circuit 732 may also operate as an antenna of the control device 700. The one or more actuators 734 may include a button or switch (e.g., a mechanical button or switch, or an imitation thereof) such as those described in association with the actuators 306, 510 of the control devices 300, 500. The actuators 734 may be configured to send respective input signals to the control circuit 730 in response to actuations of the actuators 734 (e.g., in response to movements of the actuators 734). The touch sensitive device 736 may include a capacitive or resistive touch element. Examples of such a touch sensitive device may include the touch sensitive circuit 240 of remote control device 220, the touch sensitive surface of the remote control device 310, and the touch sensitive surface of the control device 500. The touch sensitive device 736 may be configured to detect point actuations and/or gestures (e.g., the gestures may be effectuated with or without physical contacts with the touch sensitive device 736), and provide respective input signals to the control circuit 730 indicating the detection.

It should be noted that, although depicted as including all of the rotational sensing circuit 732, the actuators 734, and the touch sensitive device 736, the control device 700 may include any combination of the foregoing components (e.g., one or more of those components).

The control circuit 730 may be configured to translate the input signals provided by the rotational sensing circuit 732, the actuators 734, and/or the touch sensitive device 736 into control data (e.g., digital control signals) for controlling one or more electrical loads. The control circuit 730 may cause the control data (e.g., digital control signals) to be transmitted to the electrical loads via the wireless communication circuit 738. For example, the wireless communication circuit 738 may transmit a control signal including the control data to the one or more electrical loads or to a central controller of the concerned load control system. The control circuit 730 may illuminated the LEDs 744 to present a light bar (e.g., such as the light bars 208, 308, 520) and/or one or more indicator lights (e.g., such as the indicator lights 292, 392, 592) to provide feedback about various conditions.

Figure 13:
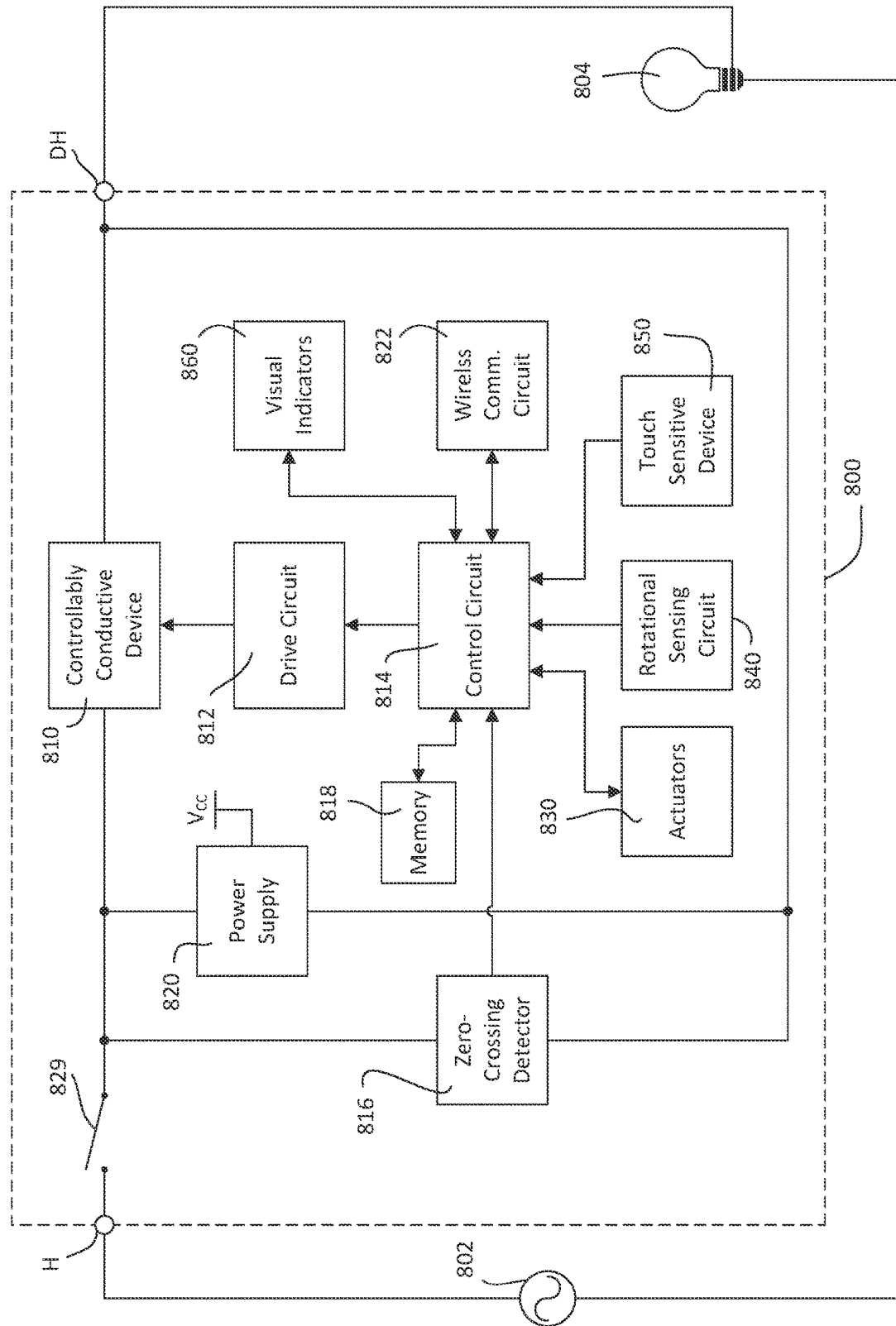
FIG. 13 shows a simplified equivalent schematic diagram of an example control device that may be deployed as a load control device (e.g., a dimmer switch) of the load control system illustrated in FIG. 1.

FIG. 13 is a simplified block diagram of an example control device 800 (e.g., a dimmer switch) that may be deployed as, for example, the dimmer switch 80 of the lighting control system 100 and/or the control devices 200, 280, 300, 380, 500, 580. The control device 800 may include a hot terminal H that may be adapted to be coupled to an AC power source 802. The control device 800 may include a dimmed hot terminal DH that may be adapted to be coupled to an electrical load, such as a lighting load 804. The control device 800 may include a controllably conductive device 810 coupled in series electrical connection between the AC power source 802 and the lighting load 804. The controllably conductive device 810 may control the power delivered to the lighting load. The controllably conductive device 810 may include a suitable type of bidirectional semiconductor switch, such as, for example, a triac, a field-effect transistor (FET) in a rectifier bridge, two FETs in anti-series connection, or one or more insulated-gate bipolar junction transistors (IGBTs). An air-gap switch 829 may be coupled in series with the controllably conductive device 810. The air-gap switch 829 may be opened and closed in response to actuations of an air-gap actuator (not shown). When the air-gap switch 829 is closed, the controllably conductive device 810 is operable to conduct current to the load. When the air-gap switch 829 is open, the lighting load 804 is disconnected from the AC power source 802.

The control device 800 may include a control circuit 814. The control circuit 814 may include one or more of a processor (e.g., a microprocessor), a microcontroller, a programmable logic device (PLD), a field programmable gate array (FPGA), an application specific integrated circuit (ASIC), or any suitable controller or processing device. The control circuit 814 may be operatively coupled to a control input of the controllably conductive device 810, for example, via a gate drive circuit 812. The control circuit 814 may be used for rendering the controllably conductive device 810 conductive or non-conductive, for example, to control the amount of power delivered to the lighting load 804.

The control circuit 814 may receive a control signal representative of the zero-crossing points of the AC main line voltage of the AC power source 802 from a zero-crossing detector 816. The control circuit 814 may be operable to render the controllably conductive device 810 conductive and/or non-conductive at predetermined times relative to the zero-crossing points of the AC waveform using a phase-control dimming technique. Examples of dimmers are described in greater detail in commonly-assigned U.S. Pat. No. 7,242,150, issued Jul. 10, 2007, entitled Dimmer Having a Power Supply Monitoring Circuit; U.S. Pat. No. 7,546,473, issued Jun. 9, 2009, entitled Dimmer having a microprocessor-controlled power supply; and U.S. Pat. No. 8,664,881, issued Mar. 4, 2014, entitled Two-wire dimmer switch for low-power loads, the entire disclosures of which are hereby incorporated by reference.

The control device 800 may include a memory 818. The memory 818 may be communicatively coupled to the control circuit 814 for the storage and/or retrieval of, for example, operational settings, such as, lighting presets and associated preset light intensities. The memory 818 may be implemented as an external integrated circuit (IC) or as an internal circuit of the control circuit 814. The control device 800 may include a power supply 820. The power supply 820 may generate a direct-current (DC) supply voltage Vcc for powering the control circuit 814 and the other low-voltage circuitry of the control device 800. The power supply 820 may be coupled in parallel with the controllably conductive device 810. The power supply 820 may be operable to conduct a charging current through the lighting load 804 to generate the DC supply voltage Vcc.

The control circuit 814 may be responsive to inputs received from actuators 830, a rotational position sensing circuit 840, and/or a touch sensitive device 850. The control circuit 814 may control the controllably conductive device 810 to adjust the intensity of the lighting load 804 in response to the input received via the actuators 830, the rotational position sensing circuit 840, and/or the touch sensitive device 850.

The rotary position sensing circuit 840 may be configured to translate a force applied to a rotating mechanism (e.g., such as the rotational portion 305 of the control device 300) into an input signal and provide the input signal to the control circuit 814. The rotational position sensing circuit 840 may include, for example, a Hall-effect sensor, a mechanical encoder, and/or an optical encoder. The rotational position sensing circuit 840 may also operate as an antenna of the control device 800. The actuators 830 may include a button or switch (e.g., a mechanical button or switch, or an imitation thereof) such as those described in association with the actuators 306, 510 of the control devices 300, 500. The actuators 830 may be configured to send respective input signals to the control circuit 814 in response to actuations of the actuators 830 (e.g., in response to movements of the actuators 830). The touch sensitive device 850 may include a capacitive or resistive touch element. Examples of such a touch sensitive device may include the touch sensitive circuit 240 of remote control device 220, the touch sensitive surface of the remote control device 310, and the touch sensitive surface of the control device 500. The touch sensitive device 850 may be configured to detect point actuations and/or gestures (e.g., the gestures may be effectuated with or without physical contacts with the touch sensitive device 850), and provide respective input signals to the control circuit 814 indicating the detection. The control circuit 814 may be configured to translate the input signals received from the actuators 830, the rotational position sensing circuit 840, and/or the touch sensitive device 850 into control data (e.g., one or more control signals), and cause the control data to be transmitted to the lighting load 804 or a central controller of the load control system.

It should be noted that, although depicted as including all of the rotational sensing circuit 840, the actuators 830, and the touch sensitive device 850, the control device 800 may include any combination of the foregoing components (e.g., one or more of those components).

The control device 800 may comprise a wireless communication circuit 822. The wireless communication circuit 822 may include for example, a radio-frequency (RF) transceiver coupled to an antenna for transmitting and/or receiving RF signals. The wireless communication circuit 822 may also include an RF transmitter for transmitting RF signals, an RF receiver for receiving RF signals, or an infrared (IR) transmitter and/or receiver for transmitting and/or receiving IR signals. The wireless communication circuit 822 may be configured to transmit a control signal that includes the control data (e.g., a digital message) generated by the control circuit 814 to the lighting load 804. As described herein, the control data may be generated in response to a user input (e.g., a point actuation or a gesture) to adjust one or more operational aspects of the lighting load 804. The control data may include a command and/or identification information (e.g., such as a unique identifier) associated with the control device 800. In addition to or in lieu of transmitting the control signal to the lighting load 804, the wireless communication circuit 822 may be controlled to transmit the control signal to a central controller of the lighting control system.

The control circuit 814 may be configured to illuminate visual indicators 860 (e.g., LEDs) to provide feedback of a status of the lighting load 804, to indicate a status of the control device 800, and/or to assist with a control operation (e.g., to provide a color gradient for controlling the color of the lighting load 804, to present backlit virtual buttons for preset, zone, or operational mode selection, etc.). The visual indicators 860 may be configured to illuminate a light bar and/or to serve as indicators of various conditions.

What is claimed is:

1. A control device that is configured for use in a load control system to control one or more electrical loads external to the control device, the control device comprising:
   a base portion;
   a touch sensitive device;
   an actuation portion that defines a front surface, the touch sensitive device configured to reside behind the front surface of the actuation portion, the actuation portion configured to move with respect to the base portion in response to a first actuation of the actuation portion, the actuation portion further configured to substantially maintain its position with respect to the base portion in response to a second actuation of the actuation portion; and
   a control circuit coupled to the touch sensitive device and configured to detect the second actuation via the touch sensitive device, the control circuit further configured to:
   generate first control data for toggling the one or more electrical loads between on and off based on the first actuation; and
   generate second control data for controlling a characteristic of the one or more electrical loads based on the second actuation.

2. The control device of claim 1, wherein the front surface of the actuation portion is substantially rectangular in shape, and wherein the first actuation is applied by pushing the actuation portion toward the base portion.

3. The control device of claim 1, wherein the second actuation comprises a tap, a press-and-hold, a swipe, a smack, a multi-finger pinch, or a multi-finger open applied to the front surface of the actuation portion.

4. The control device of claim 1, further comprising:
   a plurality of light sources, wherein the control circuit is configured to illuminate at least one light source of the plurality of light sources to provide feedback to a user in response to the first actuation or the second actuation.

5. The control device of claim 4, wherein the control circuit is configured to control an intensity level of the plurality of light sources when the control device is in an idle state to reveal virtual buttons or to reveal multiple discrete points along the front surface of the actuation portion.

6. The control device of claim 1, wherein the touch sensitive device comprises a capacitive touch circuit located behind the front surface of the actuation portion, wherein the capacitive touch circuit is configured to detect the second actuation along a vertical axis along the front surface of the actuation portion.

7. The control device of claim 1, wherein the one or more electrical loads comprise one or more lighting loads, and wherein the control circuit is configured to generate the second control data for controlling an intensity level of the one or more lighting loads based on the second actuation.

8. The control device of claim 1, wherein the one or more electrical loads comprise one or more lighting loads, and the control circuit is configured to adjust a color of the lighting load based on the second actuation of the actuation portion.

9. The control device of claim 1, wherein the one or more electrical loads comprise one or more lighting loads, wherein the second actuation is a press-and-hold along the front surface of the actuation portion, and wherein the control circuit is configured to control an intensity of the one or more lighting loads in response to the press-and-hold along the front surface of the actuation portion.

10. A control device configured for use in a load control system to control one or more electrical loads external to the control device, the control device comprising:
   a mechanical switch;
   an actuation portion comprising a front surface, the front surface defining a touch sensitive surface, the actuation portion configured to pivot about a pivot axis to actuate the mechanical switch in response to an actuation of the actuation portion;
   a touch sensitive circuit configured to detect user inputs applied via the touch sensitive surface of the actuation portion; and
   a control circuit configured to:
      control an amount of power delivered to the one or more electrical loads in response to the touch sensitive circuit detecting the user inputs; and
      turn the one or more electrical loads off in response to the actuation portion pivoting about the pivot axis to actuate the mechanical switch;
   wherein the touch sensitive surface and the touch sensitive circuit are configured to move with the actuation portion when the actuation portion is pivoted about the pivot axis.

11. The control device of claim 10, wherein the touch sensitive circuit is configured to generate a detection signal in response to the user inputs being applied to the touch sensitive surface of the actuation portion, and wherein the control circuit is configured to receive the detection signal and control the amount of power delivered to the one or more electrical loads in response to the detection signal.

12. The control device of claim 11, further comprising:
   a printed circuit board that comprises the touch sensitive circuit, wherein the printed circuit board is configured to move with the actuation portion when the actuation portion is pivoted about the pivot axis.

13. The control device of claim 12, wherein the printed circuit board is attached to a rear surface of the actuation portion.

14. The control device of claim 10, wherein the mechanical switch comprises a first mechanical switch and the control device further comprises a second mechanical switch, and wherein the control circuit is configured to turn the one or more electrical loads on in response to the actuation portion pivoting about the pivot axis to actuate the second mechanical switch.

15. The control device of claim 10, wherein the touch sensitive circuit comprises one or more capacitive touch elements configured to detect the user inputs.

16. A control device configured for use in a load control system to control one or more electrical loads external to the control device, the control device comprising:
   an actuation portion comprising a front surface, the front surface defining a touch sensitive surface, the actuation portion configured to pivot about a pivot axis in response to an actuation of an upper portion of the actuation portion or a lower portion of the actuation portion; and
   a printed circuit board comprising a control circuit and a touch sensitive circuit, the touch sensitive circuit configured to detect a user input applied along at least a portion of the touch sensitive surface, the control circuit configured to control an amount of power delivered to the one or more electrical loads in response to the touch sensitive surface detecting the user input, the control circuit further configured to turn the one or more electrical loads off in response to the actuation portion pivoting about the pivot axis;
   wherein the printed circuit board is configured to move with the actuation portion when the actuation portion is pivoted about the pivot axis.

17. The control device of claim 16, wherein the printed circuit board is attached to a rear surface of the actuation portion.

18. The control device of claim 16, wherein the touch sensitive circuit comprises one or more capacitive touch elements configured to detect the user input.

19. The control device of claim 16, wherein the one or more electrical loads comprise one or more lighting loads, and wherein the control circuit is configured to control an intensity level of the one or more lighting loads based on the user input applied along at least the portion of the touch sensitive surface.

20. The control device of claim 16, wherein the control circuit is further configured to turn the one or more electrical loads on in response to the actuation portion pivoting about the pivot axis.

* * * * *